United States Patent
Burak et al.

(10) Patent No.: US 11,101,783 B2
(45) Date of Patent: Aug. 24, 2021

(54) STRUCTURES, ACOUSTIC WAVE RESONATORS, DEVICES AND SYSTEMS TO SENSE A TARGET VARIABLE, INCLUDING AS A NON-LIMITING EXAMPLE CORONA VIRUSES

(71) Applicant: QXONIX Inc., Irvine, CA (US)

(72) Inventors: Dariusz Burak, Fort Collins, CO (US); Kevin J. Grannen, Thornton, CO (US); Jack Lenell, Fort Collins, CO (US)

(73) Assignee: QXONIX INC., Irvine, CA (US)

( * ) Notice: Subject to any disclaimer, the term of this patent is extended or adjusted under 35 U.S.C. 154(b) by 0 days.

(21) Appl. No.: 16/940,172

(22) Filed: Jul. 27, 2020

(65) Prior Publication Data

US 2021/0036678 A1    Feb. 4, 2021

Related U.S. Application Data

(60) Provisional application No. 62/881,061, filed on Jul. 31, 2019, provisional application No. 62/881,074, (Continued)

(51) Int. Cl.
  *H03H 9/02*    (2006.01)
  *H03H 9/205*   (2006.01)
  *H03H 9/13*    (2006.01)

(52) U.S. Cl.
  CPC ...... *H03H 9/02259* (2013.01); *H03H 9/0207* (2013.01); *H03H 9/0211* (2013.01); *H03H 9/02015* (2013.01); *H03H 9/02102* (2013.01); *H03H 9/02157* (2013.01); *H03H 9/131* (2013.01); *H03H 9/205* (2013.01); *H03H 2009/02165* (2013.01)

(58) Field of Classification Search
  CPC .. H03H 9/02259; H03H 9/131; H03H 9/0211; H03H 9/205; H03H 9/173; H03H 9/174
  See application file for complete search history.

(56) References Cited

U.S. PATENT DOCUMENTS

| | | |
|---|---|---|
| 5,929,555 A | 7/1999 | Sugimoto et al. |
| 5,945,770 A | 8/1999 | Hanafy |

(Continued)

FOREIGN PATENT DOCUMENTS

| | | |
|---|---|---|
| WO | WO2018022757 | 2/2018 |
| WO | WO 2021/021719 | 2/2021 |

(Continued)

OTHER PUBLICATIONS

International Search Report and Written Opinion for PCT/US2020/043716 dated Oct. 20, 2020.

(Continued)

*Primary Examiner* — Bryan P Gordon

(57) ABSTRACT

Techniques for improving Bulk Acoustic Wave (BAW) resonator structures are disclosed, including fluidic systems, oscillators and systems that may include such devices. A bulk acoustic wave (BAW) resonator may comprise a substrate and a first layer of piezoelectric material. The bulk acoustic wave (BAW) resonator may comprise a top electrode. A sensing region may be acoustically coupled with the top electrode of the bulk acoustic wave (BAW) resonator.

30 Claims, 29 Drawing Sheets

Related U.S. Application Data filed on Jul. 31, 2019, provisional application No. 62/881,077, filed on Jul. 31, 2019, provisional application No. 62/881,085, filed on Jul. 31, 2019, provisional application No. 62/881,087, filed on Jul. 31, 2019, provisional application No. 62/881,091, filed on Jul. 31, 2019, provisional application No. 62/881,094, filed on Jul. 31, 2019.

(56) References Cited

U.S. PATENT DOCUMENTS

| | | |
|---|---|---|
| 6,927,651 B2 | 8/2005 | Larson, III et al. |
| 6,975,183 B2 | 12/2005 | Aigner et al. |
| 7,385,334 B1 | 6/2008 | Olsson et al. |
| 7,964,144 B1 | 6/2011 | Nordin et al. |
| 8,346,482 B2 | 1/2013 | Fernandez |
| 8,673,121 B2 | 3/2014 | Larson, III et al. |
| 8,796,904 B2 | 8/2014 | Burak et al. |
| 9,065,421 B2 | 6/2015 | Feng et al. |
| 9,243,316 B2 | 1/2016 | Larson, III et al. |
| 9,401,692 B2 | 7/2016 | Burak et al. |
| 9,679,765 B2 | 6/2017 | Larson, III et al. |
| 2002/0093398 A1 | 7/2002 | Ella et al. |
| 2002/0121945 A1* | 9/2002 | Ruby .................. H03H 9/564 333/187 |
| 2004/0140869 A1 | 7/2004 | Marksteiner et al. |
| 2004/0195937 A1 | 10/2004 | Matsubara et al. |
| 2004/0233019 A1 | 11/2004 | Inoue et al. |
| 2004/0183400 A1 | 12/2004 | Aigner et al. |
| 2005/0012568 A1* | 1/2005 | Aigner .................. H03H 9/583 333/187 |
| 2005/0070232 A1 | 3/2005 | Mages |
| 2005/0148065 A1 | 7/2005 | Zhang et al. |
| 2006/0094374 A1 | 5/2006 | Olip |
| 2006/0197411 A1 | 9/2006 | Hoen et al. |
| 2006/0267710 A1* | 11/2006 | Matsumoto ............ H03H 9/175 333/187 |
| 2006/0287195 A1 | 12/2006 | Jerome et al. |
| 2007/0120625 A1 | 5/2007 | Larson et al. |
| 2007/0210349 A1 | 9/2007 | Iimura et al. |
| 2007/0222336 A1 | 9/2007 | Grannen et al. |
| 2007/0296513 A1 | 12/2007 | Ruile et al. |
| 2009/0045704 A1 | 2/2009 | Barber et al. |
| 2009/0096550 A1 | 4/2009 | Handtmann et al. |
| 2009/0256740 A1 | 10/2009 | Teshirogi et al. |
| 2010/0073106 A1 | 3/2010 | Stuebing et al. |
| 2010/0163410 A1* | 7/2010 | Mastromatteo ...... C12Q 1/6825 204/400 |
| 2010/0167416 A1 | 7/2010 | Kaliban et al. |
| 2010/0327701 A1 | 12/2010 | Grannen et al. |
| 2011/0043081 A1 | 2/2011 | Safari et al. |
| 2011/0121689 A1* | 5/2011 | Grannen ............ H03H 9/02015 310/357 |
| 2011/0121916 A1 | 5/2011 | Barbet et al. |
| 2011/0309899 A1 | 12/2011 | Leiba et al. |
| 2012/0051976 A1 | 3/2012 | Lu et al. |
| 2012/0293278 A1 | 3/2012 | Ueda et al. |
| 2012/0096697 A1 | 4/2012 | Grannen et al. |
| 2012/0154074 A1 | 4/2012 | Ruby et al. |
| 2012/0201174 A1 | 8/2012 | Jian et al. |
| 2012/0218057 A1 | 8/2012 | Burak et al. |
| 2012/0218058 A1 | 8/2012 | Burak et al. |
| 2012/0218059 A1 | 8/2012 | Burak et al. |
| 2012/0218060 A1 | 8/2012 | Burak et al. |
| 2012/0248941 A1 | 10/2012 | Saito et al. |
| 2012/0280767 A1 | 11/2012 | Burak et al. |
| 2012/0319530 A1* | 12/2012 | Burak .................. H03H 9/585 310/321 |
| 2012/0319534 A1 | 12/2012 | Shiwakawa et al. |
| 2013/0038408 A1 | 2/2013 | Burak et al. |
| 2013/0063226 A1 | 3/2013 | Burak et al. |
| 2013/0063227 A1 | 3/2013 | Burak et al. |
| 2013/0092547 A1 | 4/2013 | Li et al. |
| 2013/0106248 A1 | 5/2013 | Burak et al. |
| 2013/0106534 A1 | 5/2013 | Burak et al. |
| 2013/0193808 A1 | 8/2013 | Feng et al. |
| 2013/0314177 A1 | 11/2013 | Burak et al. |
| 2014/0111288 A1 | 4/2014 | Nikkel et al. |
| 2014/0118087 A1 | 5/2014 | Burak et al. |
| 2014/0118088 A1 | 5/2014 | Burak et al. |
| 2014/0118089 A1 | 5/2014 | Bradley et al. |
| 2014/0118090 A1 | 5/2014 | Grannen et al. |
| 2014/0118091 A1 | 5/2014 | Burak et al. |
| 2014/0118092 A1 | 5/2014 | Burak et al. |
| 2014/0125202 A1 | 5/2014 | Choy et al. |
| 2014/0125203 A1 | 5/2014 | Choy et al. |
| 2014/0132117 A1 | 5/2014 | Ella et al. |
| 2014/0137815 A1 | 5/2014 | Bi et al. |
| 2014/0152152 A1 | 6/2014 | Burak et al. |
| 2014/0154697 A1 | 6/2014 | Johal et al. |
| 2014/0159548 A1 | 6/2014 | Burak et al. |
| 2014/0174908 A1 | 6/2014 | Feng et al. |
| 2014/0175950 A1 | 6/2014 | Zou et al. |
| 2014/0176261 A1 | 6/2014 | Burak et al. |
| 2014/0193830 A1 | 7/2014 | Schimidt et al. |
| 2014/0225682 A1 | 8/2014 | Burak et al. |
| 2014/0225683 A1 | 8/2014 | Burak et al. |
| 2014/0232486 A1 | 8/2014 | Burak |
| 2014/0246305 A1 | 9/2014 | Larson, III |
| 2014/0340172 A1 | 11/2014 | Bradley et al. |
| 2014/0354109 A1* | 12/2014 | Grannen .............. H03H 9/171 310/311 |
| 2014/0354115 A1 | 12/2014 | Burak et al. |
| 2015/0133339 A1 | 5/2015 | Prindle |
| 2015/0240349 A1 | 8/2015 | Grannen |
| 2015/0244346 A1 | 8/2015 | Feng et al. |
| 2015/0244347 A1 | 8/2015 | Lv et al. |
| 2015/0270826 A1 | 9/2015 | Burak |
| 2015/0280100 A1 | 10/2015 | Burak et al. |
| 2015/0280687 A1 | 10/2015 | Burak et al. |
| 2015/0308996 A1 | 10/2015 | Kim et al. |
| 2015/0311046 A1 | 10/2015 | Yeh et al. |
| 2015/0318461 A1 | 11/2015 | Jacobsen et al. |
| 2015/0318837 A1 | 11/2015 | Zou et al. |
| 2015/0326200 A1 | 11/2015 | Grannen et al. |
| 2015/0341015 A1 | 11/2015 | Grannen et al. |
| 2015/0349743 A1* | 12/2015 | Burak .................. H01L 41/107 310/313 R |
| 2015/0349747 A1 | 12/2015 | Burak et al. |
| 2015/0377834 A1 | 12/2015 | Salvati et al. |
| 2016/0007893 A1 | 1/2016 | Roberts |
| 2016/0079958 A1 | 3/2016 | Burak |
| 2016/0087187 A1 | 3/2016 | Burak |
| 2016/0118957 A1 | 4/2016 | Burak et al. |
| 2016/0118958 A1 | 4/2016 | Burak |
| 2016/0126930 A1 | 5/2016 | Giovannini |
| 2016/0182011 A1 | 6/2016 | Burak et al. |
| 2016/0087186 A1 | 7/2016 | Sam |
| 2016/0301437 A1 | 10/2016 | Pehlke |
| 2016/0308509 A1 | 10/2016 | Burak et al. |
| 2016/0349088 A1 | 12/2016 | Patel |
| 2017/0047907 A1 | 2/2017 | Burak et al. |
| 2017/0063339 A1 | 3/2017 | Burak et al. |
| 2017/0077385 A1* | 3/2017 | Stokes .............. H03H 9/02086 |
| 2017/0117871 A1 | 4/2017 | Rivas et al. |
| 2017/0120242 A1 | 5/2017 | Rivas |
| 2017/0122911 A1 | 5/2017 | McCarran et al. |
| 2017/0122936 A1 | 5/2017 | Rivas et al. |
| 2017/0134001 A1 | 5/2017 | Belsick et al. |
| 2017/0134002 A1 | 5/2017 | Rivas et al. |
| 2017/0168017 A1 | 6/2017 | Rivas et al. |
| 2017/0168018 A1 | 6/2017 | Morton et al. |
| 2017/0214387 A1 | 7/2017 | Burak et al. |
| 2017/0227497 A1 | 8/2017 | Rivas et al. |
| 2017/0261503 A1 | 9/2017 | Murdock et al. |
| 2017/0276670 A1 | 9/2017 | Salvati et al. |
| 2017/0288121 A1 | 10/2017 | Burak et al. |
| 2017/0288628 A1 | 10/2017 | Grannen et al. |
| 2017/0292950 A1 | 10/2017 | Grinsven |
| 2017/0310304 A1 | 10/2017 | Burak et al. |
| 2017/0347925 A1 | 10/2017 | Burak et al. |
| 2018/0034438 A1 | 2/2018 | Ryder et al. |
| 2018/0085787 A1 | 3/2018 | Burak et al. |

(56) References Cited

U.S. PATENT DOCUMENTS

| | | |
|---|---|---|
| 2018/0097499 A1 | 4/2018 | Rinaldi et al. |
| 2018/0138893 A1 | 5/2018 | Caron |
| 2018/0204996 A1 | 7/2018 | Zou et al. |
| 2018/0309425 A1 | 10/2018 | Shealy et al. |
| 2019/0081192 A1 | 3/2019 | Horng et al. |
| 2019/0103853 A1 | 4/2019 | Burak et al. |
| 2019/0152995 A1 | 6/2019 | Ram et al. |
| 2019/0187105 A1 | 6/2019 | Ram et al. |
| 2019/0234907 A1 | 8/2019 | Edwards et al. |
| 2019/0250198 A1 | 8/2019 | Kenumba et al. |
| 2019/0256806 A1 | 8/2019 | Nietfeld |
| 2020/0124625 A1 | 4/2020 | Dunlop et al. |

FOREIGN PATENT DOCUMENTS

| | | |
|---|---|---|
| WO | WO 2021/021723 | 2/2021 |
| WO | WO 2021/021730 | 2/2021 |
| WO | WO 2021/021732 | 2/2021 |
| WO | WO 2021/021736 | 2/2021 |
| WO | WO 2021/021739 | 2/2021 |
| WO | WO 2021/021743 | 2/2021 |
| WO | WO 2021/021745 | 2/2021 |
| WO | WO 2021/021747 | 2/2021 |
| WO | WO 2021/021748 | 2/2021 |

OTHER PUBLICATIONS

International Search Report and Written Opinion for PCT/US2020/043720 dated Oct. 20, 2020.
International Search Report and Written Opinion for PCT/US2020/043740 dated Oct. 28, 2020.
International Search Report and Written Opinion for PCT/US2020/043746 dated Oct. 28, 2020.
International Search Report and Written Opinion for PCT/US2020/043752 dated Oct. 27, 2020.
International Search Report and Written Opinion for PCT/US2020/043762 dated Oct. 21, 2020.
International Search Report and Written Opinion for PCT/US2020/043760 dated Dec. 17, 2020.
International Search Report and Written Opinion for PCT/US2020/043733 dated Dec. 17, 2020.
International Search Report and Written Opinion for PCT/US2020/043755 dated Dec. 18, 2020.
International Search Report and Written Opinion for PCT/US2020/043730 dated Feb. 1, 2021.

* cited by examiner

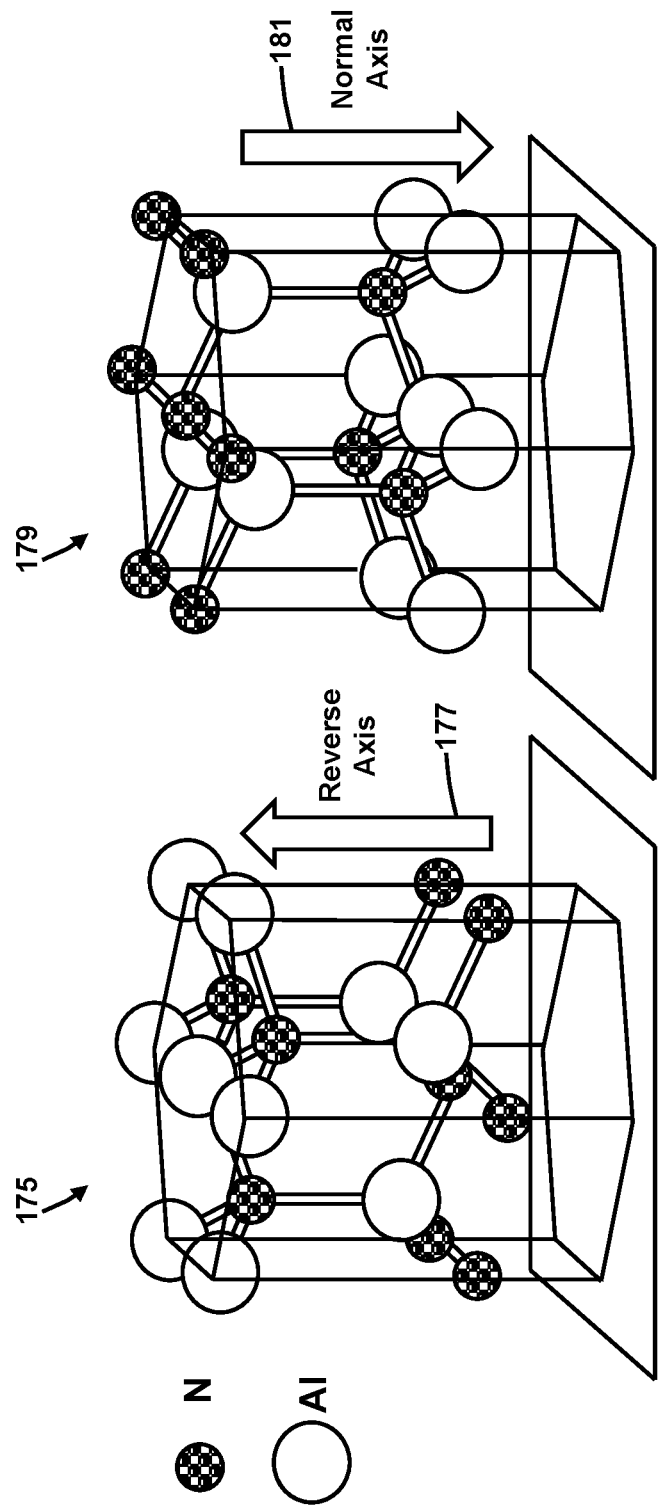

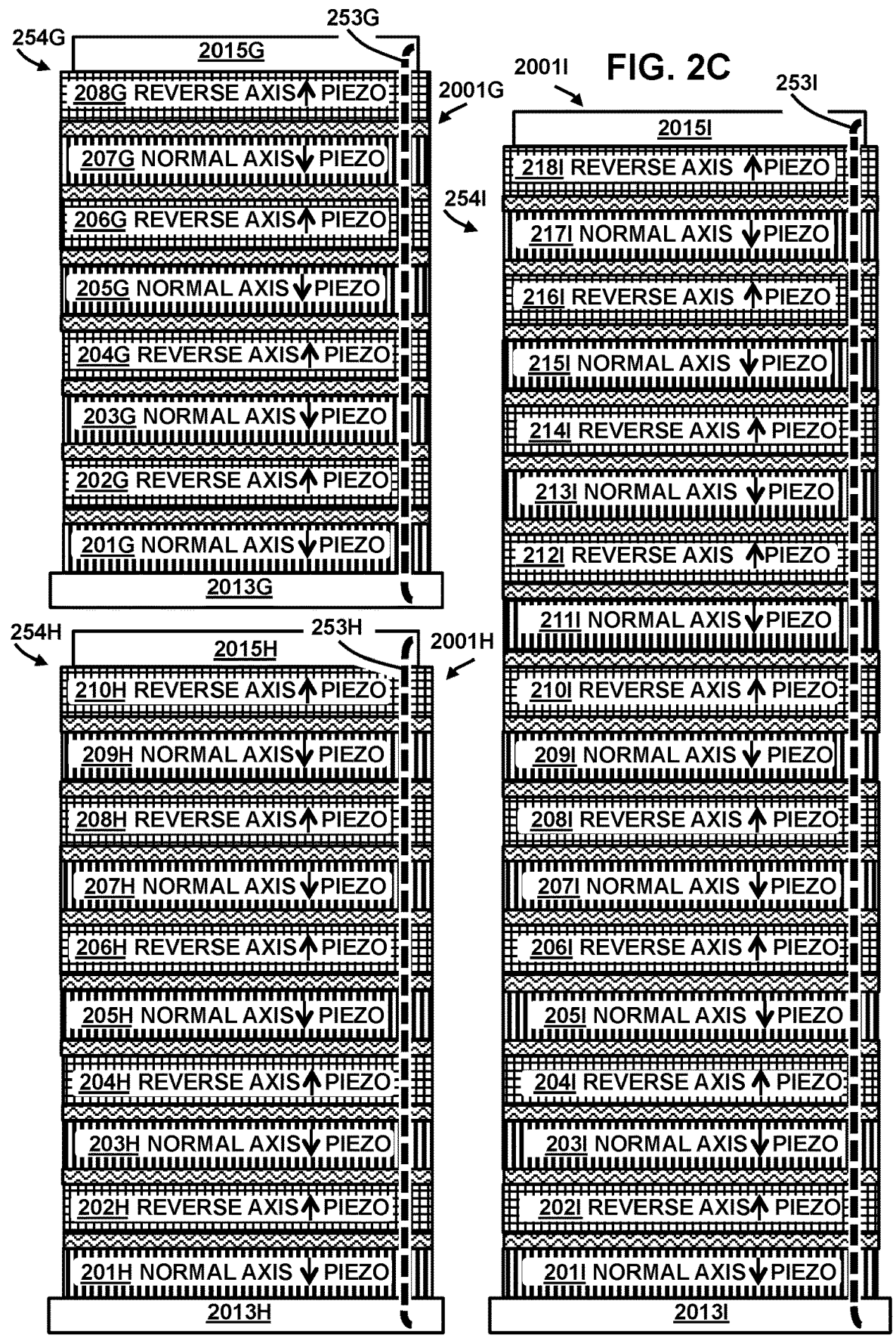

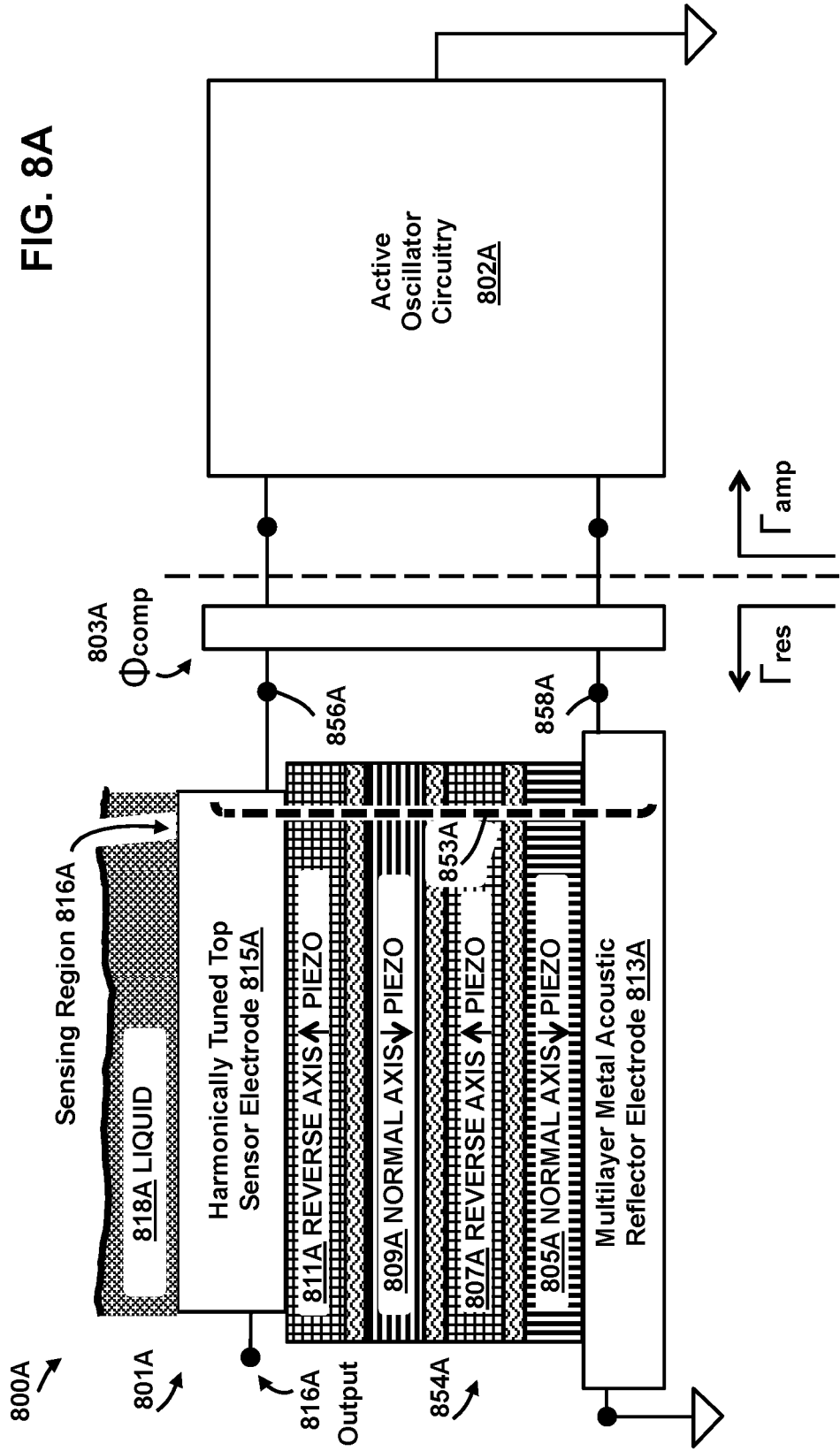

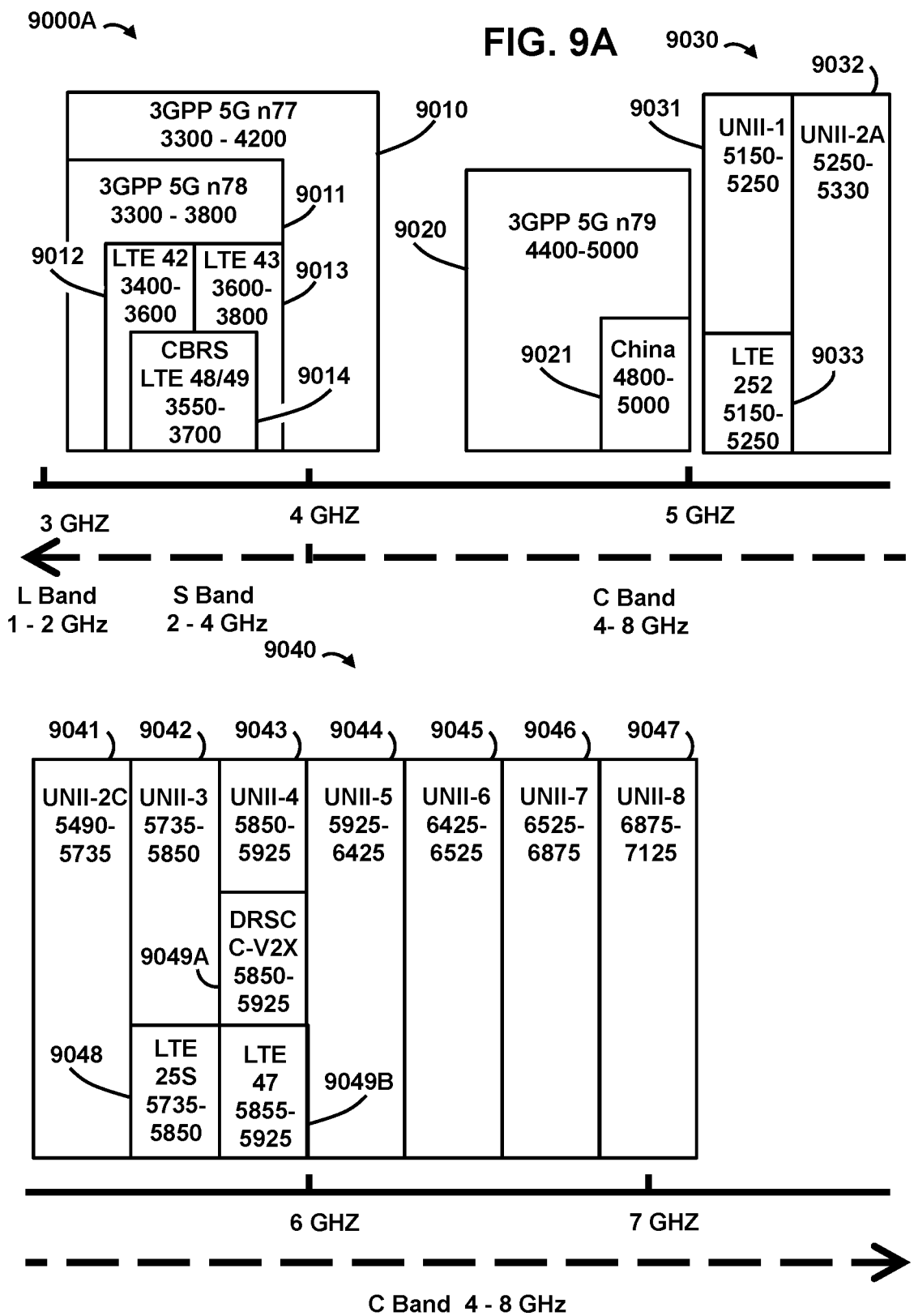

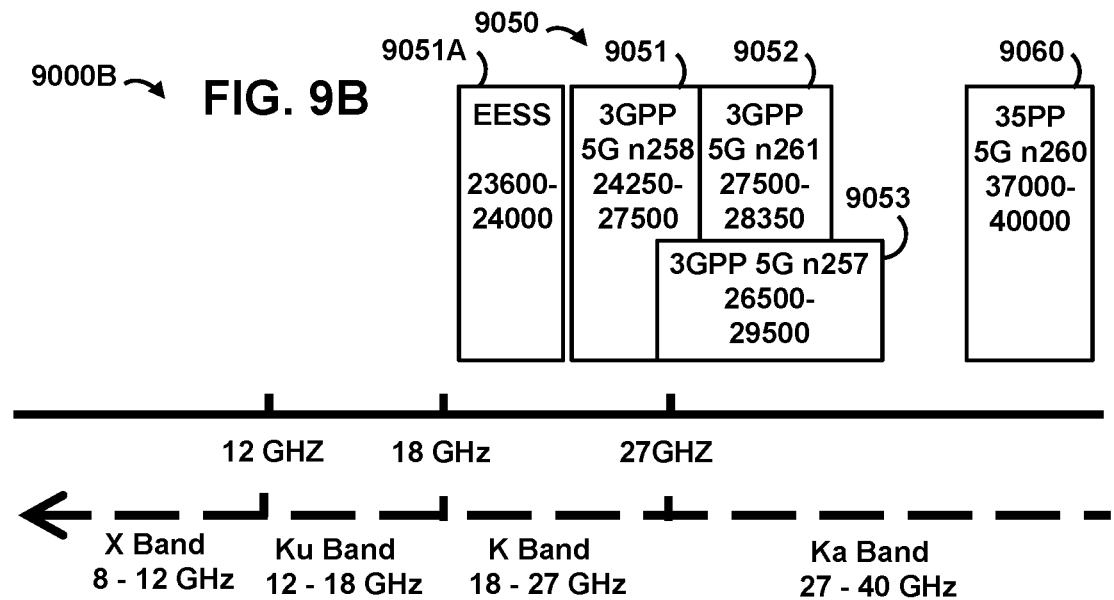
FIG. 9B
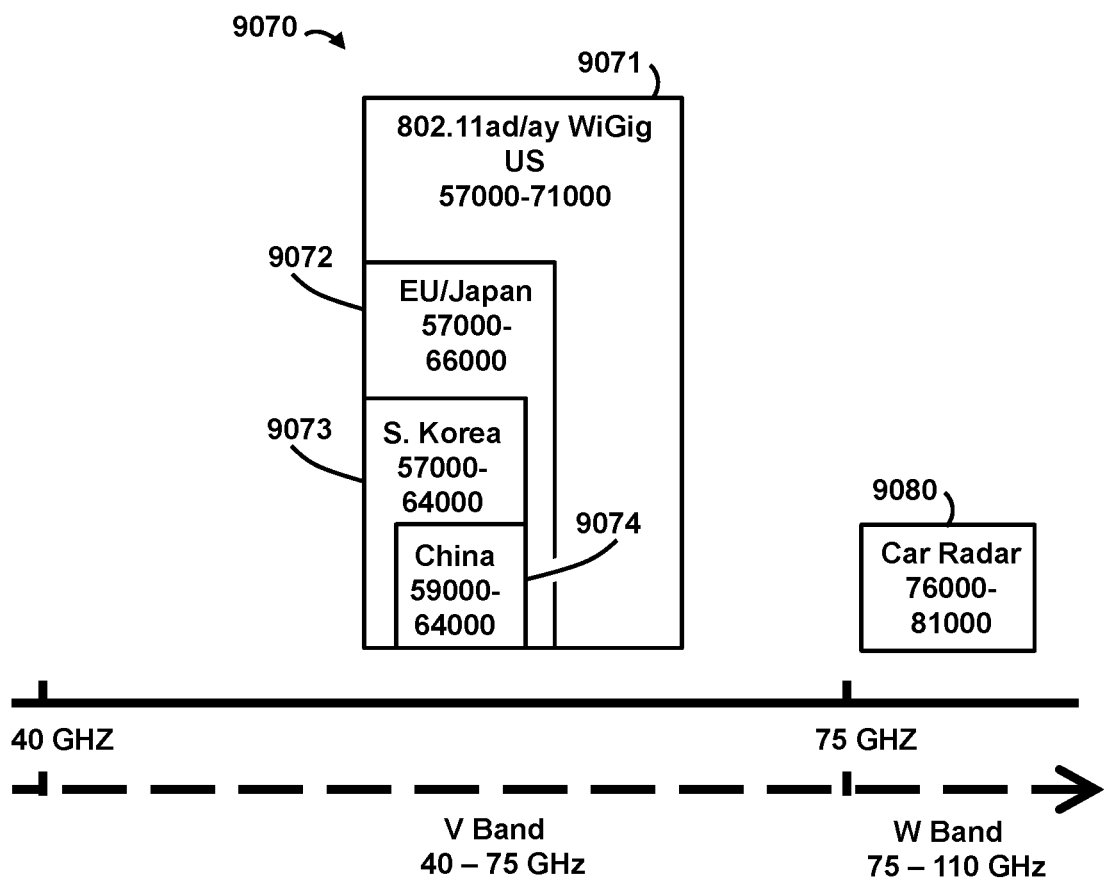

STRUCTURES, ACOUSTIC WAVE RESONATORS, DEVICES AND SYSTEMS TO SENSE A TARGET VARIABLE, INCLUDING AS A NON-LIMITING EXAMPLE CORONA VIRUSES

PRIORITY CLAIM

This application claims the benefit of priority to the following provisional patent applications:
U.S. Provisional Patent Application Ser. No. 62/881,061, entitled "BULK ACOUSTIC WAVE (BAW) RESONATOR STRUCTURES, DEVICES AND SYSTEMS" and filed on Jul. 31, 2019;
U.S. Provisional Patent Application Ser. No. 62/881,074, entitled "ACOUSTIC DEVICE STRUCTURES, DEVICES AND SYSTEMS" and filed on Jul. 31, 2019;
U.S. Provisional Patent Application Ser. No. 62/881,077, entitled "DOPED BULK ACOUSTIC WAVE (BAW) RESONATOR STRUCTURES, DEVICES AND SYSTEMS" and filed on Jul. 31, 2019;
U.S. Provisional Patent Application Ser. No. 62/881,085, entitled "BULK ACOUSTIC WAVE (BAW) RESONATOR WITH PATTERNED LAYER STRUCTURES, DEVICES AND SYSTEMS" and filed on Jul. 31, 2019;
U.S. Provisional Patent Application Ser. No. 62/881,087, entitled "BULK ACOUSTIC WAVE (BAW) REFLECTOR AND RESONATOR STRUCTURES, DEVICES AND SYSTEMS" and filed on Jul. 31, 2019;
U.S. Provisional Patent Application Ser. No. 62/881,091, entitled "MASS LOADED BULK ACOUSTIC WAVE (BAW) RESONATOR STRUCTURES, DEVICES AND SYSTEMS" and filed on Jul. 31, 2019; and
U.S. Provisional Patent Application Ser. No. 62/881,094, entitled "TEMPERATURE COMPENSATING BULK ACOUSTIC WAVE (BAW) RESONATOR STRUCTURES, DEVICES AND SYSTEMS" and filed on Jul. 31, 2019.

Each of the provisional patent applications identified above is incorporated herein by reference in its entirety.

TECHNICAL FIELD

The present disclosure relates to acoustic resonators and to devices and to systems comprising acoustic resonators.

BACKGROUND

Viral infections represent a grave threat to public health as well as the global economy. Viral infections may occur through contaminated water, food, and/or bodily fluids, spread rapidly, and result in death of humans and animals worldwide. Significant concerns have been raised due to recent Coronavirus (e.g., SARS CoV-2 virus) outbreaks, since the Coronavirus spreads very quickly and caused the ongoing COVID-19 global pandemic. For example, as many as 10 million cases or more of COVID-19 may have been reported in more than 188 countries and territories. This may have resulted in more than 500,000 deaths, and may have caused the largest global recession since the Great Depression.

Rapid and accurate detection can mean the difference between life and death during viral infections. Historically, viral detection processes have been slow and expensive, in part because remote laboratories waited to receive bodily fluid samples collected from patients for analysis to determine whether a small number viral particles indicating an incipient infection may be present, and to determine whether antibodies generated by the patient immune response against the virus indicating an advanced infection may be present. Laboratory methods such as virus culture, enzyme-linked immunosorbent assay (ELISA), western blots, and serological antibody detection methods are prone to error, especially in determining whether a small number viral particles indicating an incipient infection may be present. Traditional laboratory-based assays are also time-consuming, labor-intensive, expensive, and can be in some cases relatively insensitive, and in all cases require samples to be transported to centralized diagnostic laboratories for testing. Expensive laboratory tools are difficult to transport, too difficult to use, and too slow for use where they are most needed: at the point of patient care. These factors increase time-to-answer and costs while reducing the quality of patient care. In the case of Coronavirus, the world has seen first hand the consequences of high diagnostic testing prices, the lack of diagnostic test availability, and delayed and inaccurate determinations, as Coronavirus has spread through subsequent contacts of patients unaware that they are infected.

Exacerbating the difficulties in detecting a single virus is its infinitesimally small size and weight. A single virus may be so small in magnitude that it may weigh only one femtogram in air. Examples of this scale are seen in two raisins weighing a gram, an average human cell being one trillion times smaller in magnitude at one nanogram. At one femtogram, a single virus may be a million times smaller in magnitude than the average human sell. Making matters slightly worse, a virus may have some buoyancy and may weigh less as collected in a liquid sample, e.g., a virus may weight ten times less in water, e.g., weigh a mere 100 attograms in water.

The future of public health and the global economy may very well depend on innovation of new technologies to detect things that are very small, in ways that are inexpensive, quick, accurate, and easy to perform on-site where they are needed. Like viruses, toxic levels of lead in drinking water in Flint, Mich. can be accurately diagnosed at remote laboratories (e.g., using X ray diffraction analysis), but laboratory equipment (e.g., X ray diffraction equipment) may be too expensive, too difficult to transport, too difficult to use, and too slow for use where it is needed most, at the point where the Flint community consumes their water. Moreover, brave soldiers in the field or stationed at remote bases may face threats from airborne biological weapon attacks, chemical weapon attacks, radiation and the like. Quick and accurate diagnostic testing is needed in the field for these soldiers, rather than requiring them to wait for delayed results processed at remote laboratories. Even ordinary civilians may need government protection from terrorist attacks, which could be preventable in advance by early field detection of miniscule quantities of explosives, chemicals associated with chemical weapons, or toxins in the civilian water supply.

While conventional ELISAs in remote laboratories can measure picomolar concentrations of analytes, higher sensitivities may be required because even a few molecules of toxins can be harmful, individual pathogens can initiate an infectious disease, and trace amounts of a cancer biomarker can indicate the beginning of a malignant transformation.

BRIEF DESCRIPTION OF THE DRAWINGS

FIG. 1D is a perspective view of an illustrative model of a crystal structure of AlN in piezoelectric material of layers in FIG. 1A having reverse axis orientation of negative polarization.

FIG. 1E is a perspective view of an illustrative model of a crystal structure of AlN in piezoelectric material of layers in FIG. 1A having normal axis orientation of positive polarization.

FIG. 2C shows additional alternative bulk acoustic wave resonator structures with additional numbers of alternating axis piezoelectric layers.

FIG. 8A shows an example oscillator using the bulk acoustic wave resonator structure of FIG. 1A sensing in liquid.

FIGS. 9A and 9B are simplified diagrams of a frequency spectrum illustrating application frequencies and application frequency bands of the example bulk acoustic wave resonators shown in FIG. 1A, FIGS. 2A through 2E, and FIGS. 4A through 4C, the example fluidic system of FIG. 5, and the example oscillators shown in FIGS. 8A and 8B.

DETAILED DESCRIPTION

Figure 1:
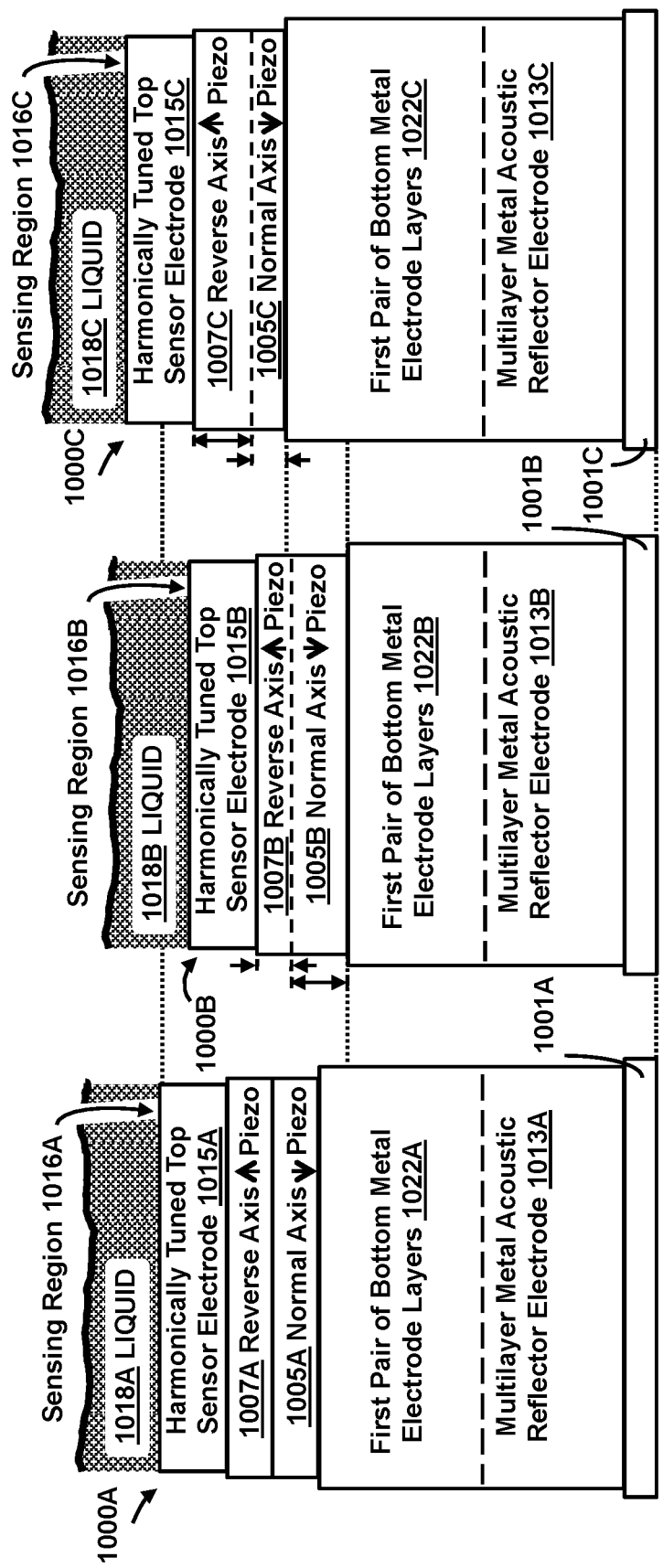
FIG. 1 shows simplified diagrams of a bulk acoustic wave resonator structure of and its operation in a thickness extensional main resonant mode.

Non-limiting embodiments will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment shown where illustration is not necessary to allow understanding by those of ordinary skill in the art. In the specification, as well as in the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element. The term "compensating" is to be understood as including "substantially compensating". The terms "oppose", "opposes" and "opposing" are to be understood as including "substantially oppose", "substantially opposes" and "substantially opposing" respectively. Further, as used in the specification and appended claims, and in addition to their ordinary meanings, the terms "substantial" or "substantially" mean to within acceptable limits or degree. For example, "substantially canceled" means that one skilled in the art would consider the cancellation to be acceptable. As used in the specification and the appended claims and in addition to its ordinary meaning, the term "approximately" or "about" means to within an acceptable limit or amount to one of ordinary skill in the art. For example, "approximately the same" means that one of ordinary skill in the art would consider the items being compared to be the same. As used in the specification and appended claims, the terms "a", "an" and "the" include both singular and plural referents, unless the context clearly dictates otherwise. Thus, for example, "a device" includes one device and plural devices. As used herein, the International Telecommunication Union (ITU) defines Super High Frequency (SHF) as extending between three Gigahertz (3 GHz) and thirty Gigahertz (30 GHz). The ITU defines Extremely High Frequency (EHF) as extending between thirty Gigahertz (30 GHz) and three hundred Gigahertz (300 GHz).

FIG. 1 shows simplified diagrams of a bulk acoustic wave resonator structure of this disclosure and its operation in a thickness extensional main resonant mode. Bulk acoustic wave resonator structures 1000A, 1000B, 1000C may include respective multilayer metal acoustic reflector electrodes 1013A, 1013B, 1013C arranged over respective substrates 1001A, 1001B, 1001C (e.g., silicon substrate 1001A, 1001B, 1001C), and respective harmonically tuned top electrode top sensor electrodes 1015A, 1015B, 1015C acoustically coupled with respective sensing regions 1016A, 1016B, 1016C. In a non-limiting example, bulk acoustic wave resonator structures 1000A, 1000B, 1000C may operate with their respective sensing regions 1016A, 1016B, 1016C to sense an analyte (e.g., coronavirus, e.g., SARS CoV-2 virus) in a fluid 1018A, 1018B, 1018C, e.g., liquid 1018A, 1018B, 1018C, e.g., comprising water. Harmonically tuned top sensor electrodes 1015A, 1015B, 1015C may have respective thicknesses that are approximately an integral multiple of a half of an acoustic wavelength of the respective resonant frequencies of the BAW resonators coupled with respective sensing regions 1016A, 1016B, 1016C. The harmonically tuned top sensor electrodes 1015A, 1015B, 1015C may facilitate suppressing parasitic lateral modes. Respective stacks of piezoelectric material layers (e.g., stacks of normal axis piezoelectric layer 1005A, 1005B, 1005C and reverse axis piezoelectric layer 1007A, 1007B, 1007C) may be respectively sandwiched between respective multilayer metal acoustic reflector electrodes 1013A, 1013B, 1013C and respective harmonically tuned top electrode top sensor electrodes 1015A, 1015B, 1015C.

For example, in FIG. 1, respective acoustic reflectors 1013A, 1013B, 1013C (e.g., respective acoustic reflector electrodes 1013A, 1013B, 1013C) may be respective multi-layer acoustic reflectors 1013A, 1013B, 1013C (e.g., may be respective multi-layer acoustic reflector electrodes 1013A, 1013B, 1013C). For example, respective multi-layer acoustic reflectors 1013A, 1013B, 1013C (e.g., respective multi-layer acoustic reflector electrodes 1013A, 1013B, 1013C) may approximate respective distributed Bragg reflectors 1013A, 1013B, 1013C. For example, respective multi-layer acoustic reflectors 1013A, 1013B, 1013C (e.g., respective multi-layer acoustic reflector electrodes 1013A, 1013B, 1013C) may include respective acoustic layers 1013A, 1013B, 1013C (e.g., respective first pairs of bottom metal electrode layers 1022A, 1022B, 1022C). For example, respective layers of respective multi-layer acoustic reflectors 1013A, 1013B, 1013C may be respectively arranged in respective alternating arrangements of low acoustic impedance metal layers and high acoustic impedance metal layers.

For example, in FIG. 1, respective acoustic reflectors 1013A, 1015A, 1013B, 1015B (e.g., respective acoustic reflector electrodes 1013A, 1015A, 1013B, 1015B) may be acoustically tuned approximately for respective resonant frequencies of the respective BAW resonators 1000A, 1000B, 1000C. For example, respective acoustic reflectors 1013A, 1013B, 1013C (e.g., respective acoustic reflector electrodes 1013A, 1013B, 1013C) may approximate respective distributed Bragg reflectors 1013A, 1013B, 1013C, having respective quarter wavelength resonances which may be acoustically tuned approximately for respective resonant frequencies of the respective BAW resonators 1000A, 1000B, 1000C. For example, respective acoustic layers (e.g., first pair of bottom acoustic layers 1022A, 1022B, 1022C) of the respective multi-layer acoustic reflectors 1013A, 1013B, 1013C may have respective layer thicknesses selected so that the respective multi-layer acoustic reflectors 1013A, 1013B, 1013C, may have respective quarter wavelength resonances at respective frequencies that may be acoustically tuned approximately for the respective resonant frequencies of the respective BAW resonators 1000A, 1000B, 1000C. For example, respective metal electrode layers (e.g., first pair of bottom metal electrode layers 1022A, 1022B, 1022C) of the respective tuned multi-layer metal reflector electrodes 1013A, 1013B, 1013C, may have respective layer thicknesses selected so that the respective tuned multi-layer acoustic reflectors 1013A, 1013B, 1013C, may have respective quarter wavelength resonances at respective frequencies that may be acoustically tuned for approximately the respective resonant frequencies of the respective BAW resonators 1000A, 1000B, 1000C.

The stacks of piezoelectric material layers (e.g., stacks of normal axis piezoelectric layer 1005A, 1005B, 1005C and reverse axis piezoelectric layer 1007A, 1007B, 1007C) may have respective active regions where harmonically tuned top electrode top sensor electrodes 1015A, 1015B, 1015C may respectively overlap respective multilayer metal acoustic reflector electrodes 1013A, 1013B, 1013C. For example, in operation of BAW resonators 1000A, 1000B, 1000C an oscillating electric field may be applied via harmonically tuned top electrode top sensor electrodes 1015A, 1015B, 1015C and respective multilayer metal acoustic reflector electrodes 1013A, 1013B, 1013C, so as to activate responsive piezoelectric acoustic oscillations in a thickness extensional main resonant mode in the respective active regions of the stacks of piezoelectric material layers (e.g., stacks of normal axis piezoelectric layer 1005A, 1005B, 1005C and reverse axis piezoelectric layer 1007A, 1007B, 1007C), where harmonically tuned top electrode top sensor electrodes 1015A, 1015B, 1015C may respectively overlap respective multilayer metal acoustic reflector electrodes 1013A, 1013B, 1013C.

For illustrative purposes, bulk acoustic resonator 1000A depicts approximately equal half acoustic wavelength thicknesses of normal axis piezoelectric layer 1005A and reverse axis piezoelectric layer 1007A, for example, prior to activation of the thickness extensional main resonant mode by application of the oscillating electric field via harmonically tuned top electrode top sensor electrode 1015A and multi-layer metal acoustic reflector electrode. In contrast, bulk acoustic resonators 1000B, 1000C depict thickness changes in normal axis piezoelectric layers 1005B, 1005C and reverse axis piezoelectric layers 1007B, 1007C from activation of the thickness extensional main resonant mode by application of the oscillating electric field via harmonically tuned top electrode top sensor electrodes 1015B, 1015C and multilayer metal acoustic reflector electrodes 1013B, 1013C.

As illustrated in BAW resonator 1000B, during an initial half cycle of the thickness extensional main resonant mode, normal axis piezoelectric layer 1005B is in extension and while reverse axis piezoelectric layer 1007B is in compression. The extension is representatively illustrated by a thickened depiction of normal axis piezoelectric layer 1005B (e.g., relative to unactivated normal axis piezoelectric layer 1005A). The compression is representatively illustrated by a thinned depiction of reverse axis piezoelectric layer 1007B (e.g., relative to unactivated reverse axis piezoelectric layer 1007A). A dashed line at the interface between normal axis piezoelectric layer 1005B and reverse axis piezoelectric layer 1007B is used to depict motion of thickness extensional main resonant mode.

As illustrated in BAW resonator 1000C, during a subsequent half cycle of the thickness extensional main resonant mode, normal axis piezoelectric layer 1005C is in compression and while reverse axis piezoelectric layer 1007C is in extension. The compression is representatively illustrated by a thinned depiction of normal axis piezoelectric layer 1005C (e.g., relative to unactivated normal axis piezoelectric layer 1005A). The extension is representatively illustrated by a thickened depiction of reverse axis piezoelectric layer 1007C (e.g., relative to unactivated reverse axis piezoelectric layer 1007A). A dashed line at the interface between normal axis piezoelectric layer 1005C and reverse axis piezoelectric layer 1007C is used to depict motion of the thickness extensional main resonant mode. For illustrative purposes in depictions of BAW resonators 1000B, 1000C, amounts of extension (thickening) and compression (thinning) are greatly exaggerated.

The thickness extensional main resonant mode depicted in FIG. 1 is a longitudinal mode excited in a vertically grown piezoelectric material film by coupling a vertically applied electric field through a d33 piezoelectric coefficient. The main thickness extensional resonance mode of BAW resonators of this disclosure may offer the highest sensitivity to analytes, for example, using sensing regions 1016A, 1016B, 1016C shown in FIG. 1. For example, both the acoustic wave velocity and resonance frequency of the thickness extensional main resonant mode of the BAW resonators of this disclosure are higher than acoustic wave velocity and resonance frequency of shear mode resonators and may offer higher sensitivity to analytes than shear mode resonators. BAW resonators of this disclosure may have sensing regions (e.g., sensing regions 1016A, 1016B, 1016C), which may comprise a respective functionalized layers (not shown in the simplified view of FIG. 1). The functionalized layers of the sensing regions (e.g., sensing regions 1016A, 1016B, 1016C) may be used to selectively bind and detect biomolecules (e.g., coronavirus, e.g., SARS CoV-2). Such selective binding and detection may occur in real time or near real time. BAW resonators of this disclosure may use a resonance frequency shift (a decrease in resonance frequency) that may be caused by the mass of biomolecules selectively binding with the functionalized layer. This technique need not require fluorescent tags or chemical labels for detection of biomolecules.

Further, mass sensitivity may increase with the square of frequency. The thickness extensional main resonant mode BAW resonators of this disclosure may operate with resonant frequencies in the Super High Frequency band (e.g., main resonant frequency of 24.25 GHz, or higher bands, e.g., higher main resonant frequencies), and so their mass sensitivity may be much higher than resonators operating below the Super High Frequency band. Thus, label-free, highly sensitive and selective, and real-time detection of biomolecules (e.g., coronavirus, e.g., SARS CoV-2) may, but need not be achieved by BAW resonators of this disclosure.

For example, respective harmonically tuned top electrode top sensor electrodes 1015A, 1015B, 1015C and respective multilayer metal acoustic reflector electrodes 1013A, 1013B, 1013C may be respectively coupled (e.g., electrically coupled, e.g., acoustically coupled) with the respective normal axis piezoelectric layers 1005A, 1005B, 1005C and the reverse axis piezoelectric layers 1007A, 1007B, 1007C to excite the piezoelectrically excitable resonance mode (e.g., thickness extensional main resonant mode) at respective resonant frequencies of the bulk acoustic Super High Frequency (SHF) wave resonators 1000A, 1000B, 1000C in the Super High Frequency (SHF) wave band (e.g., 24.25 GHz main resonant frequency). For example, thicknesses of the normal axis piezoelectric layers 1005A, 1005B, 1005C and the reverse axis piezoelectric layers 1007A, 1007B, 1007C may be selected to determine the main resonant frequency of bulk acoustic Super High Frequency (SHF) wave resonators 1000A, 1000B, 1000C in the Super High Frequency (SHF) wave band (e.g., twenty-four and a quarter GigaHertz, 24.25 GHz main resonant frequency).

Further, quality factor (Q factor) is a figure of merit for bulk acoustic wave resonators that may be related, in part, to acoustic reflector electrode conductivity. In accordance with the teachings of this disclosure, without an offsetting compensation that increases number of member layers, member layer thinning with increasing frequency may otherwise diminish acoustic reflector electrode conductivity, and may otherwise diminish quality factor (Q factor) of bulk acoustic wave resonators. In accordance with the teachings of this disclosure, number of member layers of the multilayer metal acoustic reflector electrodes 1013A, 1013B, 1013C may be increased in designs extending to higher resonant frequencies, to facilitate electrical conductivity through acoustic reflector electrodes. The acoustic reflector electrodes (e.g., Super High Frequency (SHF) bottom acoustic reflector electrode 1013A, 1013B, 1013C may have sheet resistance of less than one Ohm per square at the given frequency (e.g., at the main resonant frequency of the BAW resonator in the super high frequency band or the extremely high frequency band, e.g., at the quarter wavelength resonant frequency of the acoustic reflector electrode in the super high frequency band or the extremely high frequency band). For example, a sufficient number of member layers may be employed to provide for this sheet resistance at the given frequency (e.g., at the main resonant frequency of the BAW resonator in the super high frequency band or the extremely high frequency band, e.g., at the quarter wavelength resonant frequency of the acoustic reflector electrode in the super high frequency band or the extremely high frequency band). This may, but need not, facilitate enhancing quality factor (Q factor) to a quality factor (Q factor) that is above a desired value of one hundred (100).

Moreover, quality factor (Q factor) may, but need not be increased by the inclusion of reverse axis piezoelectric layer 1007A, 1007B, 1007C in acoustic coupling with normal axis piezoelectric layer 1005A, 1005B, 1005C. In accordance with the teachings of this disclosure, without an offsetting compensation that increases number of member piezoelectric layers in an alternating piezoelectric axis arrangement, member piezoelectric layer thinning with increasing frequency may otherwise diminish quality factor (Q factor) of bulk acoustic wave resonators. In accordance with the teachings of this disclosure, number of member piezoelectric layers in an alternating piezoelectric axis arrangement may be increased in designs extending to higher resonant frequencies. This may, but need not boost quality factor (Q factor). Furthermore, higher Q factor may, but need not increase detection sensitivity (e.g., sensitivity in detection of biomolecules, e.g., sensitivity in detection of coronavirus.)

Figure 1A:
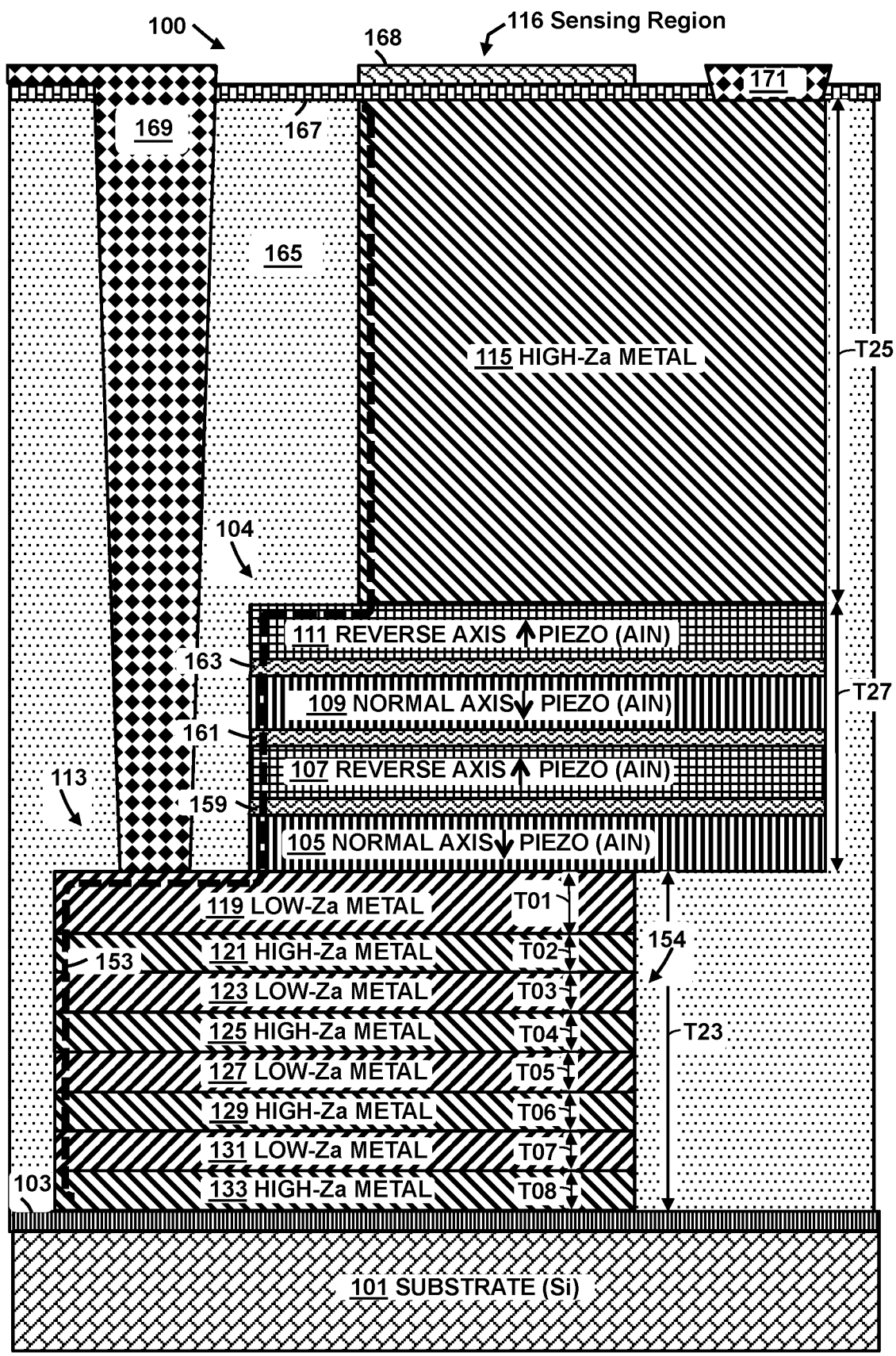
FIG. 1A is a diagram that illustrates an example bulk acoustic wave resonator structure.
Figure 4A:
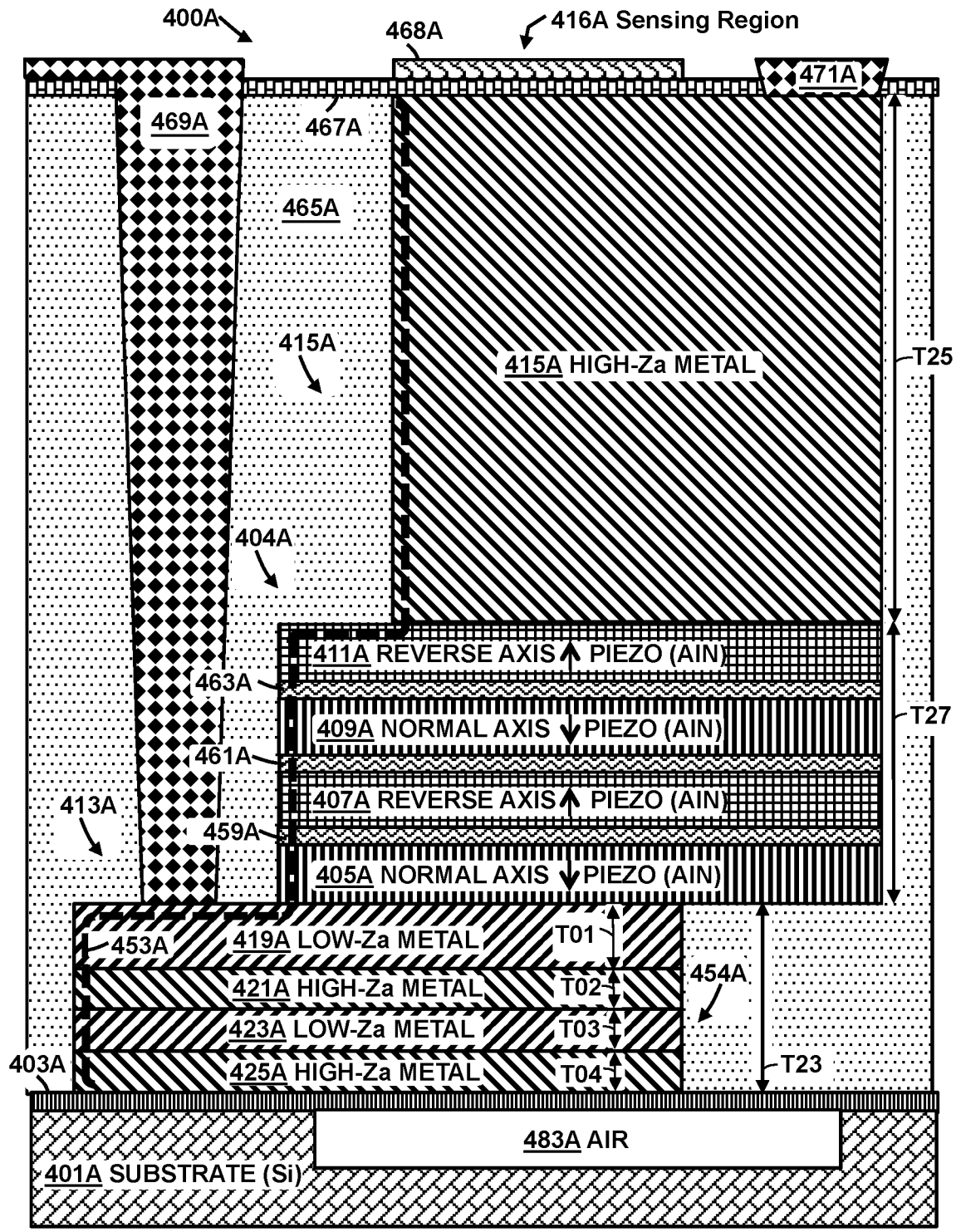
FIGS. 4A through 4C show alternative example bulk acoustic wave resonators to the example bulk acoustic wave resonator structures shown in FIG. 1A.
Figure 4B:
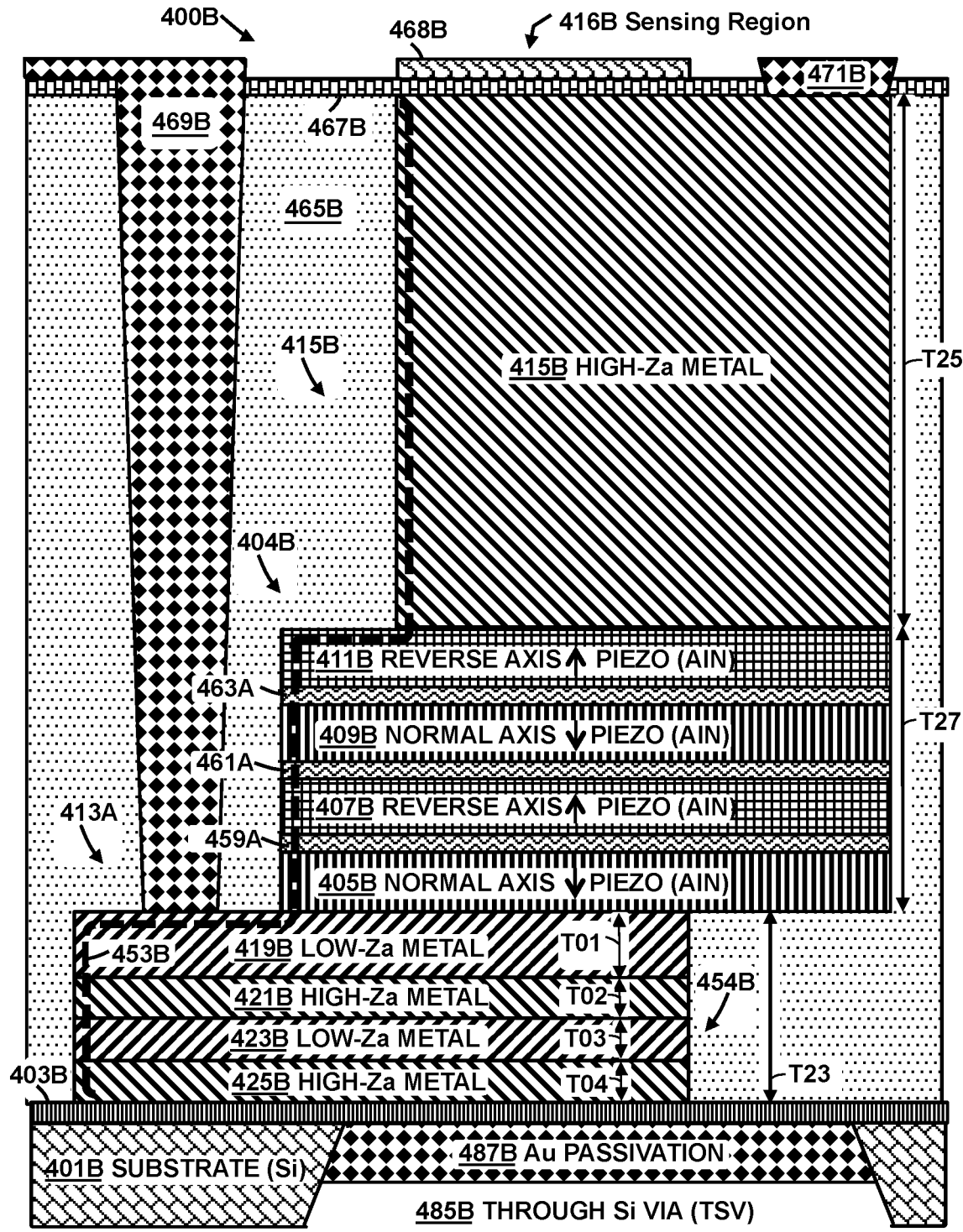
Figure 4C:
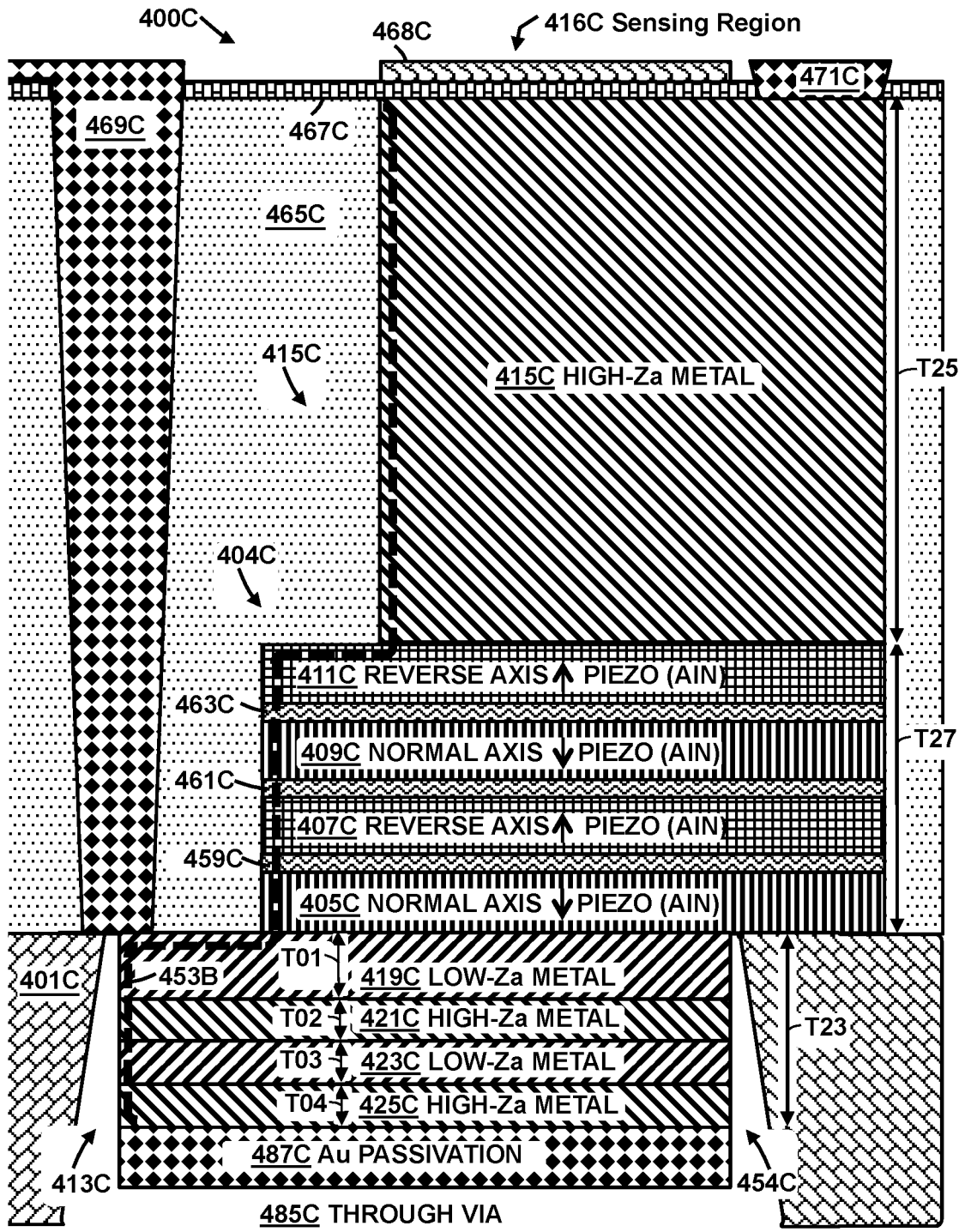

FIG. 1A is a diagram that illustrates an example bulk acoustic wave resonator structure 100. FIGS. 4A through 4C show alternative example bulk acoustic wave resonators, 400A through 400C, to the example bulk acoustic wave resonator structure 100 shown in FIG. 1A. The foregoing are shown in simplified cross sectional views. The resonator structures are formed over a substrate 101, 401A through 401C (e.g., silicon substrate 101, 401A, 401B, e.g., silicon carbide substrate 401C). In some examples, the substrate may further comprise a seed layer 103, 403A, 403B, formed of, for example, aluminum nitride (AlN), or another suitable material (e.g., silicon dioxide ($SiO_2$), aluminum oxide ($Al_2O_3$), silicon nitride ($Si_3N_4$, amorphous silicon (a-Si), silicon carbide (SiC)), having an example thickness in a range from approximately 100 A to approximately 1 um on the silicon substrate. In some other examples, the seed layer 103, 403A, 403B may also be at least partially formed of electrical conductivity enhancing material such as Aluminum (Al) or Gold (Au).

The example resonators 100, 400A through 400C, include a respective stack 104, 404A through 404C, of an example four layers of piezoelectric material, for example, four layers of Aluminum Nitride (AlN) having a wurtzite structure. For example, FIG. 1A and FIGS. 4A through 4C show a bottom piezoelectric layer 105, 405A through 405C, a first middle piezoelectric layer 107, 407A through 407C, a second middle piezoelectric layer 109, 409A through 409C, and a top piezoelectric layer 111, 411A through 411C. A mesa structure 104, 404A through 404C (e.g., first mesa structure 104, 404A through 404C) may comprise the respective stack 104, 404A through 404C, of the example four layers of piezoelectric material. The mesa structure 104, 404A through 404C (e.g., first mesa structure 104, 404A through 404C) may comprise bottom piezoelectric layer 105, 405A through 405C. The mesa structure 104, 404A through 404C (e.g., first mesa structure 104, 404A through 404C) may comprise first middle piezoelectric layer 107, 407A through 407C. The mesa structure 104, 404A through 404C (e.g., first mesa structure 104, 404A through 404C) may comprise second middle piezoelectric layer 109, 409A through 409C. The mesa structure 104, 404A through 404C (e.g., first mesa structure 104, 404A through 404C) may comprise top piezoelectric layer 111, 411A through 411C. Although piezoelectric aluminum nitride may be used, alternative examples may comprise alternative piezoelectric materials, e.g., doped aluminum nitride, e.g., zinc oxide, e.g., lithium niobate, e.g., lithium tantalate.

The four layers of piezoelectric material in the respective stack 104, 404A through 404C of FIG. 1A and FIGS. 4A through 4C may have an alternating axis arrangement in the respective stack 104, 404A through 404C. For example the bottom piezoelectric layer 105, 405A through 405C may have a normal axis orientation, which is depicted in the figures using a downward directed arrow. Next in the alternating axis arrangement of the respective stack 104, 404A through 404C, the first middle piezoelectric layer 107, 407A through 407C may have a reverse axis orientation, which is depicted in the figures using an upward directed arrow. Next in the alternating axis arrangement of the respective stack 104, 404A through 404C, the second middle piezoelectric layer 109, 409A through 409C may have the normal axis orientation, which is depicted in the figures using the downward directed arrow. Next in the alternating axis arrangement of the respective stack 104, 404A through 404C, the top piezoelectric layer 111, 411A through 411C may have the reverse axis orientation, which is depicted in the figures using the upward directed arrow.

For example, polycrystalline thin film AlN may be grown in a crystallographic c-axis negative polarization, or normal axis orientation perpendicular relative to the substrate surface using reactive magnetron sputtering of an Aluminum target in a nitrogen atmosphere. However, as will be discussed in greater detail subsequently herein, changing sputtering conditions, for example by adding oxygen, may reverse the axis to a crystallographic c-axis positive polarization, or reverse axis, orientation perpendicular relative to the substrate surface.

In the example resonators 100, 400A through 400C, of FIG. 1A and FIGS. 4A through 4C, the bottom piezoelectric layer 105, 405A through 405C, may have a piezoelectrically excitable resonance mode (e.g., main resonance mode, e.g., thickness extensional main resonance mode) at a resonant frequency (e.g., main resonant frequency) of the example resonators. Similarly, the first middle piezoelectric layer 107, 407A through 407C, may have its piezoelectrically excitable resonance mode (e.g., main resonance mode, e.g., thickness extensional main resonance mode) at the resonant frequency (e.g., main resonant frequency) of the example resonators. Similarly, the second middle piezoelectric layer 109, 409A through 409C, may have its piezoelectrically excitable resonance mode (e.g., main resonance mode, e.g., thickness extensional main resonance mode) at the resonant frequency (e.g., main resonant frequency) of the example resonators. Similarly, the top piezoelectric layer 111, 411A through 411C, may have its piezoelectrically excitable main resonance mode (e.g., main resonance mode, e.g., thickness extensional main resonance mode) at the resonant frequency (e.g., main resonant frequency) of the example resonators. Accordingly, the top piezoelectric layer 111, 411A through 411C, may have its piezoelectrically excitable main resonance mode (e.g., main resonance mode, e.g., thickness extensional main resonance mode) at the resonant frequency (e.g., main resonant frequency) with the bottom piezoelectric layer 105, 405A through 405C, the first middle piezoelectric layer 107, 407A through 407C, and the second middle piezoelectric layer 109, 409A through 409C.

The bottom piezoelectric layer 105, 405A through 405C, may be acoustically coupled with the first middle piezoelectric layer 107, 407A through 407C, in the piezoelectrically excitable resonance mode (e.g., main resonance mode, e.g., thickness extensional main resonance mode) at the resonant frequency (e.g., main resonant frequency) of the example resonators 100, 400A through 400C. The normal axis of bottom piezoelectric layer 105, 405A through 405C, in opposing the reverse axis of the first middle piezoelectric layer 107, 407A through 407C, may cooperate for the piezoelectrically excitable resonance mode (e.g., main resonance mode, e.g., thickness extensional main resonance mode) at the resonant frequency (e.g., main resonant frequency) of the example resonators. The first middle piezoelectric layer 107, 407A through 407C, may be sandwiched between the bottom piezoelectric layer 105, 405A through 405C, and the second middle piezoelectric layer 109, 409A through 409C, for example, in the alternating axis arrangement in the respective stack 104, 404A through 404C. For example, the reverse axis of the first middle piezoelectric layer 107, 407A through 407C, may oppose the normal axis of the bottom piezoelectric layer 105, 405A through 405C, and the normal axis of the second middle piezoelectric layer 109, 409A-409C. In opposing the normal axis of the bottom piezoelectric layer 105, 405A through 405C, and the normal axis of the second middle piezoelectric layer 109, 409A through 409C, the reverse axis of the first middle piezoelectric layer 107, 407A through 407C, may cooperate for the piezoelectrically excitable resonance mode (e.g., main resonance mode, e.g., thickness extensional main resonance mode) at the resonant frequency (e.g., main resonant frequency) of the example resonators.

The second middle piezoelectric layer 109, 409A through 409C, may be sandwiched between the first middle piezoelectric layer 107, 407A through 407C, and the top piezoelectric layer 111, 411A through 411C, for example, in the alternating axis arrangement in the respective stack 104, 404A through 404C. For example, the normal axis of the second middle piezoelectric layer 109, 409A through 409C, may oppose the reverse axis of the first middle piezoelectric layer 107, 407A through 407C, and the reverse axis of the top piezoelectric layer 111, 411A through 411C. In opposing the reverse axis of the first middle piezoelectric layer 107, 407A through 407C, and the reverse axis of the top piezoelectric layer 111, 411A through 411C, the normal axis of the second middle piezoelectric layer 109, 409A through 409C, may cooperate for the piezoelectrically excitable resonance mode (e.g., main resonance mode, e.g., thickness extensional main resonance mode) at the resonant frequency (e.g., main resonant frequency) of the example resonators. Similarly, the alternating axis arrangement of the bottom piezoelectric layer 105, 405A through 405C, and the first middle piezoelectric layer 107, 407A through 407C, and the second middle piezoelectric layer 109, 409A through 409C, and the top piezoelectric layer 111, 411A through 411C, in the respective stack 104, 404A through 404C may cooperate for the piezoelectrically excitable resonance mode (e.g., main resonance mode, e.g., thickness extensional main resonance mode) at the resonant frequency (e.g., main resonant frequency) of the example resonators. Despite differing in their alternating axis arrangement in the respective stack 104, 404A through 404C, the bottom piezoelectric layer 105, 405A through 405C and the first middle piezoelectric layer 107, 407A through 407C, and the second middle piezoelectric layer 109, 409A through 409C, and the top piezoelectric layer 111, 411A through 411C, may all be made of the same piezoelectric material, e.g., Aluminum Nitride (AlN).

Respective layers of piezoelectric material in the stack 104, 404A through 404C, of FIG. 1A and FIGS. 4A through 4C may have respective layer thicknesses of about one half wavelength (e.g., one half acoustic wavelength) of the main resonant frequency of the example resonators. For example, respective layers of piezoelectric material in the stack 104, 404A through 404C, of FIG. 1A and FIGS. 4A through 4C may have respective layer thicknesses so that (e.g., selected so that) the respective bulk acoustic wave resonators 100, 400A through 400C may have respective resonant frequencies that are in a Super High Frequency (SHF) band or an Extremely High Frequency (EHF) band (e.g., respective resonant frequencies that are in a Super High Frequency (SHF) band, e.g., respective resonant frequencies that are in an Extremely High Frequency (EHF) band. For example, respective layers of piezoelectric material in the stack 104, 404A through 404C, of FIG. 1A and FIGS. 4A through 4C may have respective layer thicknesses so that (e.g., selected so that) the respective bulk acoustic wave resonators 100, 400A through 400C may have respective resonant frequencies that are in a millimeter wave band. For example, for an approximately twenty-four gigahertz (e.g., 24 GHz) main resonant frequency of the example resonators, the bottom piezoelectric layer 105, 405A through 405C, may have a layer thickness corresponding to about one half of a wavelength (e.g., about one half of an acoustic wavelength) of the main resonant frequency, and may be about two thousand Angstroms (2000 A). Similarly, the first middle piezoelectric layer 107, 407A through 407C, may have a layer thickness corresponding the one half of the wavelength (e.g., one half of the acoustic wavelength) of the main resonant frequency; the second middle piezoelectric layer 109, 409A through 409C, may have a layer thickness corresponding the one half of the wavelength (e.g., one half of the acoustic wavelength) of the main resonant frequency; and the top piezoelectric layer 111, 411A through 411C, may have a layer thickness corresponding the one half of the wavelength (e.g., one half of the acoustic wavelength) of the main resonant frequency. Piezoelectric layer thickness may be scaled up or down to determine main resonant frequency.

The example resonators 100, 400A through 400C, of FIG. 1A and FIGS. 4A through 4C may comprise: a bottom acoustic reflector 113, 413A through 413C (e.g., multi-layer bottom acoustic reflector 113, 413A through 413C, e.g., multi-layer metal bottom acoustic reflector electrode 113, 413A through 413C), e.g., including an acoustically reflective bottom electrode stack of a plurality of bottom metal electrode layers; and a harmonically tuned top sensor electrode 115, 415A through 415C. Accordingly, the bottom acoustic reflector 113, 413A through 413C, may be a bottom multi-layer acoustic reflector. The piezoelectric layer stack 104, 404A through 404C, may be sandwiched between the plurality of bottom metal electrode layers of the bottom acoustic reflector 113, 413A through 413C, and the top metal electrode layer of the harmonically tuned top sensor electrode 115, 415A through 415C. Harmonically tuned top sensor electrode 115, 415A through 415C may comprise the relatively high acoustic impedance metal, for example, Tungsten, Ruthenium or Molybdenum. In other examples, harmonically tuned top sensor electrode 115, 415A through 415C may comprise (at least partially) a relatively large electrical conductivity material, for example, Aluminum or Gold. The piezoelectric layer stack 104, 404A through 404C, may be electrically and acoustically coupled with the plurality of bottom metal electrode layers of the bottom acoustic reflector 113, 413A through 413C and the top metal electrode layer of the harmonically tuned top sensor electrode 115, 415A through 415C, to excite the piezoelectrically excitable resonance mode (e.g., main resonance mode, e.g., thickness extensional main resonance mode) at the resonant frequency (e.g., main resonant frequency). For example, such excitation may be done by using the plurality of bottom metal electrode layers of the bottom acoustic reflector 113, 413A through 413C and the top metal electrode layer of the harmonically tuned top sensor electrode 115, 415A through 415C to apply an oscillating electric field having a frequency corresponding to the resonant frequency (e.g., main resonant frequency) of the piezoelectric layer stack 104, 404A through 404C, and of the example resonators 100, 400A through 400C. For example, the piezoelectric layer stack 104, 404A through 404C, may be electrically and acoustically coupled with the plurality of bottom metal electrode layers of the bottom acoustic reflector 113, 413A through 413C and the top metal electrode layer of the harmonically tuned top sensor electrode 115, 415A through 415C, to excite the piezoelectrically excitable resonance mode (e.g., main resonance mode, e.g., thickness extensional main resonance mode) at the resonant frequency (e.g., main resonant frequency).

For example, the bottom piezoelectric layer 105, 405A through 405C, may be electrically and acoustically coupled with the plurality of bottom metal electrode layers of the bottom acoustic reflector 113, 413A through 413C and the top metal electrode layer of the harmonically tuned top sensor electrode 115, 415A through 415C, to excite the piezoelectrically excitable resonance mode (e.g., main resonance mode, e.g., thickness extensional main resonance mode) at the resonant frequency (e.g., main resonant frequency) of the bottom piezoelectric layer 105, 405A through 405C. Further, the bottom piezoelectric layer 105, 405A through 405C and the first middle piezoelectric layer 107, 407A through 407C, may be electrically and acoustically coupled with the plurality of bottom metal electrode layers of the bottom acoustic reflector 113, 413A through 413C, and the top metal electrode layer of the harmonically tuned top sensor electrode 115, 415A through 415C, to excite the piezoelectrically excitable resonance mode (e.g., main resonance mode, e.g., thickness extensional main resonance mode) at the resonant frequency (e.g., main resonant frequency) of the bottom piezoelectric layer 105, 405A through 405C, acoustically coupled with the first middle piezoelectric layer 107, 407A through 407C. Additionally, the first middle piezoelectric layer 107, 407A through 407G, may be sandwiched between the bottom piezoelectric layer 105, 405A through 405C and the second middle piezoelectric layer 109, 409A through 409C, and may be electrically and acoustically coupled with the plurality of bottom metal electrode layers of the bottom acoustic reflector 113, 413A through 413C, and the top metal electrode layer of the harmonically tuned top sensor electrode 115, 415A through 415C, to excite the piezoelectrically excitable resonance mode (e.g., main resonance mode, e.g., thickness extensional main resonance mode) at the resonant frequency (e.g., main resonant frequency) of the first middle piezoelectric layer 107, 407A through 407C, sandwiched between the bottom piezoelectric layer 105, 405A through 405C, and the second middle piezoelectric layer 109, 409A through 409C.

The acoustically reflective bottom electrode stack of the plurality of bottom metal electrode layers of the bottom acoustic reflector 113, 413A through 413C, may have an alternating arrangement of low acoustic impedance metal layer and high acoustic impedance metal layer. The acoustically reflective bottom electrode stack of the plurality of bottom metal electrode layers of the bottom acoustic reflector 113, 413A through 413C may approximate a distributed Bragg acoustic reflector, e.g. a metal distributed Bragg acoustic reflector. The plurality of metal bottom electrode layers of the bottom acoustic reflector may be electrically coupled (e.g., electrically interconnected) with one another. The acoustically reflective bottom electrode stack of the plurality of bottom metal electrode layers may operate together as a multi-layer (e.g., bi-layer, e.g., multiple layer) bottom electrode for the bottom acoustic reflector 113, 413A through 413C.

In the alternating arrangement of low acoustic impedance metal layer and high acoustic impedance metal layer of the acoustically reflective bottom electrode stack, may be a first pair of bottom metal electrode layers 119, 419A through 419C and 121, 421A through 421C. A first member 119, 419A through 419C, of the first pair of bottom metal electrode layers may comprise a relatively low acoustic impedance metal, for example, Titanium having an acoustic impedance of about 27 MegaRayls, or for example, Aluminum having an acoustic impedance of about 18 MegaRayls. A second member 121, 421A through 421C, of the first pair of bottom metal electrode layers may comprise the relatively high acoustic impedance metal, for example, Tungsten or Molybdenum. Accordingly, the first pair of bottom metal electrode layers 119, 419A through 419C, and 121, 421A through 421C, of the bottom acoustic reflector 113, 413A through 413C, may be different metals, and may have respective acoustic impedances that are different from one another so as to provide a reflective acoustic impedance mismatch at the resonant frequency (e.g., main resonant frequency). Similarly, the first member of the first pair of bottom metal electrode layers 119, 419A through 419C, of the bottom acoustic reflector 113, 413A through 413C, may be different metals, and may have respective acoustic impedances that are different from one another so as to provide a reflective acoustic impedance mismatch at the resonant frequency (e.g., main resonant frequency).

Next in the alternating arrangement of low acoustic impedance metal layer and high acoustic impedance metal layer of the acoustically reflective bottom electrode stack, a second pair of bottom metal electrode layers 123, 423A through 423C, and 125, 425A through 425C, may respectively comprise the relatively low acoustic impedance metal and the relatively high acoustic impedance metal. Accordingly, members of the first and second pairs of bottom metal electrode layers 119, 419A through 419C, 121, 421A through 421C, 123, 423A through 423C, 125, 425A through 425C, may have respective acoustic impedances in the alternating arrangement to provide a corresponding plurality of reflective acoustic impedance mismatches.

Next in the alternating arrangement of low acoustic impedance metal layer and high acoustic impedance metal layer of the acoustically reflective bottom electrode stack, a third pair of bottom metal electrode layers 127, 129 may respectively comprise the relatively low acoustic impedance metal and the relatively high acoustic impedance metal. Next in the alternating arrangement of low acoustic impedance metal layer and high acoustic impedance metal layer of the acoustically reflective bottom electrode stack, a fourth pair of bottom metal electrode layers 131, 133 may respectively comprise the relatively low acoustic impedance metal and the relatively high acoustic impedance metal.

Respective thicknesses of the bottom metal electrode layers may be related to wavelength (e.g., acoustic wavelength) for the main resonant frequency of the example bulk acoustic wave resonators, 100, 400A through 400C. Further, various embodiments for resonators having relatively higher resonant frequency (higher main resonant frequency) may have relatively thinner bottom metal electrode thicknesses, e.g., scaled thinner with relatively higher resonant frequency (e.g., higher main resonant frequency). Similarly, various alternative embodiments for resonators having relatively lower resonant frequency (e.g., lower main resonant frequency) may have relatively thicker bottom metal electrode layer thicknesses, e.g., scaled thicker with relatively lower resonant frequency (e.g., lower main resonant frequency).

Further, the bottom acoustic reflectors 113, 413A through 413C may be acoustically de-tuned from respective resonant frequencies of the respective BAW resonators 100, 400A through 400C. For example, respective multi-layer bottom acoustic reflectors 113, 413A through 413C (e.g., respective multi-layer bottom acoustic reflector electrodes 113, 413A through 413C, e.g., respective multi-layer metal bottom acoustic reflector electrodes 113, 413A through 413C) may approximate respective distributed Bragg reflectors 113, 413A through 413C, (e.g., respective metal distributed Bragg reflectors 113, 413A through 413C), which may be acoustically de-tuned from respective resonant frequencies of the respective BAW resonators 100, 400A through 400C. For example, respective bottom acoustic layers of the respective de-tuned multi-layer bottom acoustic reflectors 113, 413A through 413C may have respective layer thicknesses selected so that the respective de-tuned multi-layer acoustic reflectors 113, 413A through 413C may have respective quarter wavelength resonant frequencies that may be acoustically de-tuned from the respective resonant frequencies of the respective BAW resonators 100, 400A through 400C. For example, bottom metal electrode layers (e.g., first pair of bottom metal electrode layers 119, 419A through 419C, 121, 421A through 421C, e.g., second pair of bottom metal electrode layers 123, 423A through 423C, 125, 425A through 425C, e.g., third pair of bottom metal electrode layers 127, 129, fourth pair of bottom metal electrode layers 131, 133) may have respective layer thicknesses selected so that the respective de-tuned multi-layer acoustic reflectors 113, 413A through 413C may have respective quarter wavelength resonant frequencies that may be acoustically de-tuned to be below the respective resonant frequencies of the respective BAW resonators 100, 400A through 400C. For example, for a 24 GHz resonator, (e.g., resonator having a main resonant frequency of about 24 GHz) bottom metal electrode layers may have respective layer thicknesses selected so that the respective de-tuned multi-layer bottom acoustic reflectors 113, 413A through 413C may have respective quarter wavelength resonant frequencies that may be acoustically de-tuned to be below (e.g., 2 GHz below) the respective resonant frequencies of the respective BAW resonators 100, 400A through 400C, e.g., acoustically de-tuned to about 22 GHz. As will be discussed in greater detail subsequently herein, bottom acoustic reflector de-tuning may facilitate suppressing parasitic (e.g., undesired) lateral resonances in acoustic resonators, for example, in respective BAW resonators 100, 400A through 400C.

In various differing examples, multi-layer bottom acoustic reflectors (e.g., the multi-layer bottom acoustic reflectors 113, 413A through 413C) may be de-tuned (e.g. tuned down in frequency) by various differing amounts from the resonant frequency (e.g. main resonant frequency) of the BAW resonator. As discussed in greater detail subsequently herein, in examples having about one or two piezoelectric layers in an alternating piezoelectric axis stack arrangement, the de-tuned multi-layer bottom acoustic reflector (e.g., the multi-layer metal bottom acoustic reflector electrode) may be acoustically de-tuned (e.g. tuned down in frequency) from the resonant frequency (e.g. main resonant frequency) of the BAW resonator.

For example in the figures, the first member of the first pair of bottom metal electrode layers 119, 419A through 419C, of the bottom acoustic reflector 113, 413A through 413C, is depicted as relatively thicker (e.g., thickness T01 of the first member of the first pair of bottom metal electrode layers 119, 419A through 419C is depicted as relatively thicker) than thickness of remainder bottom acoustic layers (e.g., than thicknesses T02 through T08 of remainder bottom metal electrode layers). For example, a thickness T01 may be about 9% greater, e.g., substantially greater, than an odd multiple (e.g., 1×, 3×, etc.) of a quarter of a wavelength (e.g., 9% greater than one quarter of the acoustic wavelength) for the first member of the first pair of bottom metal electrode layers 119, 419A through 419C. For example, if Titanium is used as the low acoustic impedance metal for a 24 GHz resonator (e.g., resonator having a main resonant frequency of about 24 GHz), a thickness T01 may be about 690 Angstroms, 690 A, for the first member of the first pair of bottom metal electrode layers 119, 419A through 419C, of the bottom acoustic reflector 113, 413A through 413C, while respective layer thicknesses, T02 through T08, shown in the figures for corresponding members of the pairs of bottom metal electrode layers may be substantially thinner than T01.

Respective layer thicknesses, T02 through T08, shown in FIG. 1A for corresponding members of the pairs of bottom metal electrode layers may be about an odd multiple (e.g., 1×, 3×, etc.) of a quarter of a wavelength (e.g., one quarter of the acoustic wavelength) at the main resonant frequency of the example resonator. However, the foregoing may be varied. For example, members of the pairs of bottom metal electrode layers of the bottom acoustic reflector may have respective layer thickness that are within a range from about one eighth to about one half wavelength at the resonant frequency, or an odd multiple (e.g., 1×, 3×, etc.) thereof.

In an example, if Tungsten is used as the high acoustic impedance metal, and the main resonant frequency of the resonator is approximately twenty-four gigahertz (e.g., 24 GHz), then using the one quarter of the wavelength (e.g., one quarter of the acoustic wavelength) provides the layer thickness of the high impedance metal electrode layer members of the pairs as about five hundred and forty Angstroms (540 A). For example, if Titanium is used as the low acoustic impedance metal, and the main resonant frequency of the resonator is approximately twenty-four gigahertz (e.g., 24 GHz), then using the one quarter of the wavelength (e.g., one quarter of the acoustic wavelength) provides the layer thickness of the low impedance metal electrode layer members of the second, third and fourth pairs as about six hundred and thirty Angstroms (630 A). Similarly, respective layer thicknesses for members of the remainder pairs of bottom metal electrode layers shown in FIGS. 4A through 4C (e.g., second, third and fourth pairs) may likewise be about one quarter of the wavelength (e.g., one quarter of the acoustic wavelength) of the main resonant frequency of the example resonator, and these respective layer thicknesses may likewise be determined for members of the pairs of bottom metal electrode layers for the high and low acoustic impedance metals employed.

As shown in the figures, a second member 121, 421A through 421C of the first pair of bottom metal electrode layers may have a relatively high acoustic impedance (e.g., high acoustic impedance metal layer 121, 421A through 421C, e.g. tungsten metal layer 121, 421A through 421C). A first member 119, 419A through 419C of the first pair of bottom metal electrode layers may have a relatively low acoustic impedance (e.g., low acoustic impedance metal layer 119, 419A through 419C, e.g., titanium metal layer 119, 419A through 419C). This relatively low acoustic impedance of the first member 119, 419A through 419C of the first pair may be relatively lower than the acoustic impedance of the second member 121, 421A through 421C of the first pair. The first member 119, 419A through 419C having the relatively lower acoustic impedance may abut a layer of piezoelectric material (e.g. may abut bottom piezoelectric layer 105, 405A through 405C, e.g. may abut piezoelectric stack 104, 404A through 404C). This arrangement may facilitate suppressing parasitic lateral resonances in operation of the BAW resonator. The first member 119, 419A through 419C having the relatively lower acoustic impedance may be arranged nearest to a layer of piezoelectric material (e.g. may be arranged nearest to bottom piezoelectric layer 105, 405A through 405C, e.g. may be arranged nearest to piezoelectric stack 104, 404A through 404C) relative to other bottom acoustic layers of the bottom acoustic reflector 113, 413A through 413C (e.g. relative to the second member 121, 421A through 421C of the first pair of bottom metal electrode layers, the second pair of bottom metal electrode layers 123, 423A through 423C, 125, 425A through 425C, the third pair of bottom metal electrode layers 127, 427A through 427C, 129, 429A through 429C, and the fourth pair of bottom metal electrodes 131, 431A through 431C, 133, 433A through 433C). This arrangement may facilitate suppressing parasitic lateral resonances in operation of the BAW resonator.

The first member 119, 419A through 419C having the relatively lower acoustic impedance may be arranged sufficiently proximate to the a layer of piezoelectric material (e.g. may be arranged sufficiently proximate to bottom piezoelectric layer 105, 405A through 405C, e.g. may be arranged sufficiently proximate to piezoelectric stack 104, 404A through 404C), so that the first member 119, 419A through 419C having the relatively lower acoustic impedance may contribute more to the multi-layer metal bottom acoustic reflector electrode 113, 413A through 413C being acoustically de-tuned from the resonant frequency of the BAW resonator than is contributed by any other bottom metal electrode layer of the multi-layer metal bottom acoustic reflector electrode 113, 413A through 413C (e.g., contribute more than the second member 121, 421A through 421C of the first pair of bottom metal electrode layers, e.g., contribute more than the first member 123, 423A through 423C of the second pair of bottom metal electrode layers, e.g., contribute more than the second member 125, 425A through 425C of the second pair of bottom metal electrode layers, e.g., contribute more than the first member 127, 427A through 427C of the third pair of bottom metal electrode layers, e.g., contribute more than the second member 129, 429A through 429C of the third pair of bottom metal electrode layers, e.g., contribute more than the first member 131, 431A through 431C of the fourth pair of bottom metal electrodes, e.g., contribute more than the second member 133, 433A through 433C of the fourth pair of bottom metal electrodes). The first member 119, 419A through 419C having the relatively lower acoustic impedance may be arranged sufficiently proximate to the a layer of piezoelectric material (e.g. may be arranged sufficiently proximate to bottom piezoelectric layer 105, 405A through 405C, e.g. may be arranged sufficiently proximate to piezoelectric stack 104, 404A through 404C), so that the first member 119, 419A through 419C having the relatively lower acoustic impedance may contribute more to facilitate suppressing parasitic lateral resonances in operation of the BAW resonator than is contributed by any other bottom metal electrode layer of the multi-layer metal bottom acoustic reflector electrode 113, 413A through 413C (e.g., contribute more than the second member 121, 421A through 421C of the first pair of bottom metal electrode layers, e.g., contribute more than the first member 123, 423A through 423C of the second pair of bottom metal electrode layers, e.g., contribute more than the second member 125, 425A through 425C of the second pair of bottom metal electrode layers, e.g., contribute more than the first member 127, 427A through 427C of the third pair of bottom metal electrode layers, e.g., contribute more than the second member 129, 429A through 429C of the third pair of bottom metal electrode layers, e.g., contribute more than the first member 131, 431A through 431C of the fourth pair of bottom metal electrodes, e.g., contribute more than the second member 133, 433A through 433C of the fourth pair of bottom metal electrodes).

For example, the bottom piezoelectric layer 105, 405A through 405C, may be electrically and acoustically coupled with pair(s) of bottom metal electrode layers (e.g., first pair of bottom metal electrode layers 119, 419A through 419C, 121, 421A through 421C, e.g., second pair of bottom metal electrode layers 123, 423A through 423C, 125, 425A through 425C, e.g., third pair of bottom metal electrode layers 127, 129, fourth pair of bottom metal electrode layers 131, 133), to excite the piezoelectrically excitable resonance mode (e.g., main resonance mode, e.g., thickness extensional main resonance mode) at the resonant frequency (e.g., main resonant frequency) of the bottom piezoelectric layer 105, 405A through 405C. Further, the bottom piezoelectric layer 105, 405A through 405C and the first middle piezoelectric layer 107, 407A through 407C may be electrically and acoustically coupled with pair(s) of bottom metal electrode layers (e.g., first pair of bottom metal electrode layers 119, 419A through 419C, 121, 421A through 421C, e.g., second pair of bottom metal electrode layers 123, 423A through 423C, 125, 425A through 425C, e.g., third pair of bottom metal electrode layers 127, 129), to excite the piezoelectrically excitable resonance mode (e.g., main resonance mode, e.g., thickness extensional main resonance mode) at the resonant frequency (e.g., main resonant frequency) of the bottom piezoelectric layer 105, 405A through 405C acoustically coupled with the first middle piezoelectric layer 107, 407A through 407C. Additionally, the first middle piezoelectric layer 107, 407A through 407C, may be sandwiched between the bottom piezoelectric layer 105, 405A through 405C, and the second middle piezoelectric layer 109, 409A through 409C, and may be electrically and acoustically coupled with pair(s) of bottom metal electrode layers (e.g., first pair of bottom metal electrode layers 119, 419A through 419C, 121, 421A through 421C, e.g., second pair of bottom metal electrode layers 123, 423A through 423C, 125, 425A through 425C, e.g., third pair of bottom metal electrode layers 127, 129), to excite the piezoelectrically excitable resonance mode (e.g., main resonance mode, e.g., thickness extensional main resonance mode) at the resonant frequency (e.g., main resonant frequency) of the first middle piezoelectric layer 107, 407A through 407C, sandwiched between the bottom piezoelectric layer 105, 405A through 405C, and the second middle piezoelectric layer 109, 409A through 409C.

Another mesa structure 113, 413A through 413C, (e.g., second mesa structure 113, 413A through 413C), may comprise the bottom acoustic reflector 113, 413A through 413C. The another mesa structure 113, 413A through 413C, (e.g., second mesa structure 113, 413A through 413C), may comprise one or more pair(s) of bottom metal electrode layers (e.g., first pair of bottom metal electrode layers 119, 419A through 419C, 121, 421A through 421C, e.g., second pair of bottom metal electrode layers 123, 423A through 423C, 125, 425A through 425C, e.g., third pair of bottom metal electrode layers 127, 129, e.g., fourth pair of bottom metal electrode layers 131, 133).

Further, the respective harmonically tuned top sensor electrodes 115, 415A through 415C may be acoustically de-tuned from respective resonant frequencies of the respective BAW resonators 100, 400A through 400C. For example, respective harmonically tuned top sensor electrode 115, 415A through 415C (e.g., respective top acoustic electrodes 115, 415A through 415C, e.g., respective metal top electrodes 115, 415A through 415C) may be acoustically de-tuned from respective resonant frequencies of the respective BAW resonators 100, 400A through 400C. For example, respective de-tuned harmonically tuned top sensor electrodes 115, 415A through 415C may have respective metal electrode layer thicknesses selected so that the respective de-tuned harmonically tuned top sensor electrodes 115, 415A through 415C may have respective half wavelength resonant frequencies that may be acoustically de-tuned from the respective resonant frequencies of the respective BAW resonators 100, 400A through 400C. For example, top metal electrode layers of de-tuned harmonically tuned top sensor electrodes 115, 415A through 415C may have respective layer thicknesses selected so that the respective de-tuned harmonically tuned top sensor electrodes 115, 415A through 415C may have respective half wavelength resonant frequencies that may be acoustically de-tuned to be above the respective resonant frequencies of the respective BAW resonators 100, 400A through 400C. For example, for a 24 GHz resonator, (e.g., resonator having a main resonant frequency of about 24 GHz) top metal electrode layers may have respective layer thicknesses selected so that the respective de-tuned harmonically tuned top sensor electrodes 115, 415A through 415C may have respective half wavelength resonance frequencies that may be acoustically de-tuned to be above (e.g., 2 GHz above) the respective resonant frequencies of the respective BAW resonators 100, 400A through 400C, e.g., acoustically de-tuned to about 26 GHz. As will be discussed in greater detail subsequently herein, top acoustic reflector de-tuning may facilitate suppressing parasitic (e.g., undesired) lateral resonances in acoustic resonators, for example, in respective BAW resonators 100, 400A through 400C.

In various differing examples, de-tuned harmonically tuned top sensor electrodes 115, 415A through 415C may be de-tuned (e.g., tuned up in frequency) by various differing amounts from the resonant frequency (e.g. main resonant frequency) of the BAW resonator. As discussed in greater detail subsequently herein, in examples having about one or two piezoelectric layers in an alternating piezoelectric axis stack arrangement, the de-tuned harmonically tuned top sensor electrodes 115, 415A through 415C may be acoustically de-tuned (e.g., tuned up in frequency) from the resonant frequency (e.g. main resonant frequency) of the BAW resonator by about up to about 5% of the resonant frequency (e.g. main resonant frequency) of the BAW resonator. It is theorized that this de-tuning by up to about 5% may facilitate suppression of parasitic lateral resonances for resonators comprising about one or two piezoelectric layers. In examples having about three piezoelectric layers to about six piezoelectric layers in an alternating piezoelectric axis stack arrangement, de-tuned harmonically tuned top sensor electrodes 115, 415A through 415C may be acoustically de-tuned (e.g., tuned up in frequency) from the resonant frequency (e.g. main resonant frequency) of the BAW resonator by up to about 12% of the resonant frequency (e.g. main resonant frequency) of the BAW resonator. It is theorized that this de-tuning by up to about 12% may facilitate suppression of parasitic lateral resonances for resonators comprising the about three piezoelectric layers to about six piezoelectric layers. In examples having about seven piezoelectric layers to about eighteen piezoelectric layers, in an alternating piezoelectric axis stack arrangement, the de-tuned harmonically tuned top sensor electrodes 115, 415A through 415C may be acoustically de-tuned (e.g., tuned up in frequency) from the resonant frequency (e.g. main resonant frequency) of the BAW resonator by up to about 36% of the resonant frequency (e.g. main resonant frequency) of the BAW resonator. It is theorized that this de-tuning by up to about 36% may facilitate suppression of parasitic lateral resonances for resonators comprising the about seven piezoelectric layers to about eighteen piezoelectric layers. In examples having greater than about eighteen piezoelectric layers, in an alternating piezoelectric stack arrangement, the de-tuned harmonically tuned top sensor electrodes 115, 415A through 415C may be acoustically de-tuned (e.g., tuned up in frequency) from the resonant frequency (e.g. main resonant frequency) of the BAW resonator by greater than about 36% of the resonant frequency (e.g. main resonant frequency) of the BAW resonator. It is theorized that this de-tuning by greater than 36% may facilitate suppression of parasitic lateral resonances for resonators comprising greater than eighteen piezoelectric layers.

Respective thicknesses of the de-tuned harmonically tuned top sensor electrodes 115, 415A through 415C may be related to wavelength (e.g., acoustic wavelength) for the main resonant frequency of the example bulk acoustic wave resonators, 100, 400A through 400C. Further, various embodiments for resonators having relatively higher main resonant frequency may have relatively thinner harmonically tuned top sensor electrode thicknesses, e.g., scaled thinner with relatively higher main resonant frequency. Similarly, various alternative embodiments for resonators having relatively lower main resonant frequency may have relatively thicker harmonically tuned top sensor electrode thicknesses, e.g., scaled thicker with relatively lower main resonant frequency.

In an example, if Molybdenum is used as the high acoustic impedance metal, and the main resonant frequency of the resonator is approximately twenty-four gigahertz (e.g., 24 GHz), then using the half wavelength (e.g., half acoustic wavelength) may provide the layer thickness of the high impedance metal of the harmonically tuned top sensor electrodes as about one thousand three hundred Angstroms (1300 A). The bottom acoustic reflector 113, 413A through 413C, may have a thickness dimension T23 extending along the stack of bottom electrode layers. For the example of the 24 GHz resonator, the thickness dimension T23 of the bottom acoustic reflector may be about five thousand Angstroms (5,000 A). The harmonically tuned top sensor electrodes 115, 415A through 415C, may have a thickness dimension T25 extending along the harmonically tuned top sensor electrodes. For the example of the 24 GHz resonator, the thickness dimension T25 of the harmonically tuned top sensor electrodes 115, 415A through 415C may be about one thousand three hundred Angstroms (1300 A). The piezoelectric layer stack 104, 404A through 404C, may have a thickness dimension T27 extending along the piezoelectric layer stack 104, 404A through 404C. For the example of the 24 GHz resonator, the thickness dimension T27 of the piezoelectric layer stack may be about eight thousand Angstroms (8,000 A).

In the example resonators 100, 400A through 400C, of FIG. 1A and FIGS. 4A through 4C, a notional heavy dashed line is used in depicting an etched edge region 153, 453A through 453C, associated with the example resonators 100, 400A through 400C. Similarly, a laterally opposing etched edge region 154, 454A through 454C is arranged laterally opposing or opposite from the notional heavy dashed line depicting the etched edge region 153, 453A through 453C. The etched edge region may, but need not, assist with acoustic isolation of the resonators. The etched edge region may, but need not, help with avoiding acoustic losses for the resonators. The etched edge region 153, 453A through 453C, (and the laterally opposing etched edge region 154, 454A through 454C) may extend along the thickness dimension T27 of the piezoelectric layer stack 104, 404A through 404C. The etched edge region 153, 453A through 453C, may extend through (e.g., entirely through or partially through) the piezoelectric layer stack 104, 404A through 404C. Similarly, the laterally opposing etched edge region 154, 454A through 454C may extend through (e.g., entirely through or partially through) the piezoelectric layer stack 104, 404A through 404C. The etched edge region 153, 453A through 453C, (and the laterally opposing etched edge region 154, 454A through 454C) may extend through (e.g., entirely through or partially through) the bottom piezoelectric layer 105, 405A through 405C. The etched edge region 153, 453A through 453C, (and the laterally opposing etched edge region 154, 454A through 454C) may extend through (e.g., entirely through or partially through) the first middle piezoelectric layer 107, 407A through 407C. The etched edge region 153, 453A through 453C, (and the laterally opposing etched edge region 154, 454A through 454C) may extend through (e.g., entirely through or partially through) the second middle piezoelectric layer 109, 409A through 409C. The etched edge region 153, 453A through 453C, (and the laterally opposing etched edge region 154, 454A through 454C) may extend through (e.g., entirely through or partially through) the top piezoelectric layer 111, 411A through 411C.

The etched edge region 153, 453A through 453C, (and the laterally opposing etched edge region 154, 454A through 454C) may extend along the thickness dimension T23 of the bottom acoustic reflector 113, 413A through 413C. The etched edge region 153, 453A through 453C, (and the laterally opposing etched edge region 154, 454A through 454C) may extend through (e.g., entirely through or partially through) the bottom acoustic reflector 113, 413A through 413C. The etched edge region 153, 453A through 453C, (and the laterally opposing etched edge region 154, 454A through 454C) may extend through (e.g., entirely through or partially through) the first pair of bottom metal electrode layers, 119, 419A through 419C, 121, 421A through 421C. The etched edge region 153, 453A through 453C (and the laterally opposing etched edge region 154, 454A through 454C) may extend through (e.g., entirely through or partially through) the second pair of bottom metal electrode layers, 123, 423A through 423C, 125, 425A through 425C. The etched edge region 153, 453A through 453C (and the laterally opposing etched edge region 154, 454A through 454C) may extend through (e.g., entirely through or partially through) the third pair of bottom metal electrode layers, 127, 129. The etched edge region 153, 453A through 453C (and the laterally opposing etched edge region 154, 454A through 454C) may extend through (e.g., entirely through or partially through) the fourth pair of bottom metal electrode layers, 131, 133.

The etched edge region 153, 453A through 453C (and the laterally opposing etched edge region 154, 454A through 454C) may extend along the thickness dimension T25 of the harmonically tuned top sensor electrode 115, 415A through 415C. The etched edge region 153, 453A through 453C (and the laterally opposing etched edge region 154, 454A through 454C) may extend through (e.g., entirely through or partially through) the harmonically tuned top sensor electrode 115, 415A through 415C.

The example resonators 100, 400A through 400C, of FIG. 1A and FIGS. 4A through 4C may include one or more (e.g., one or a plurality of) interposer layers sandwiched between piezoelectric layers of the stack 104, 404A through 404C. For example, a first interposer layer 159, 459A through 459C may be sandwiched between the bottom piezoelectric layer 105, 405A through 405C, and the first middle piezoelectric layer 107, 407A through 407C. For example, a second interposer layer 161, 461A through 461C, may be sandwiched between the first middle piezoelectric layer 107, 407A through 407C, and the second middle piezoelectric layer 109, 409A through 409C. For example, a third interposer layer 163, 463A through 463C, may be sandwiched between the second middle piezoelectric layer 109, 409A through 409C, and the top piezoelectric layer 111, 411A through 411C.

One or more (e.g., one or a plurality of) interposer layers may be metal interposer layers. The metal interposer layers may be relatively high acoustic impedance metal interposer layers (e.g., using relatively high acoustic impedance metals such as Tungsten (W) or Molybdenum (Mo)). Such metal interposer layers may (but need not) flatten stress distribution across adjacent piezoelectric layers and may (but need not) raise effective electromechanical coupling coefficient (Kt2) of adjacent piezoelectric layers.

Alternatively or additionally, one or more (e.g., one or a plurality of) interposer layers may be dielectric interposer layers. The dielectric of the dielectric interposer layers may be a dielectric that has a positive acoustic velocity temperature coefficient, so acoustic velocity increases with increasing temperature of the dielectric. The dielectric of the dielectric interposer layers may be, for example, silicon dioxide. Dielectric interposer layers may, but need not, facilitate compensating for frequency response shifts with increasing temperature. Most materials (e.g., metals, e.g., dielectrics) generally have a negative acoustic velocity temperature coefficient, so acoustic velocity decreases with increasing temperature of such materials. Accordingly, increasing device temperature generally causes response of resonators and filters to shift downward in frequency. Including dielectric (e.g., silicon dioxide) that instead has a positive acoustic velocity temperature coefficient may facilitate countering or compensating (e.g., temperature compensating) this downward shift in frequency with increasing temperature. Alternatively or additionally, one or more (e.g., one or a plurality of) interposer layers may comprise metal and dielectric for respective interposer layers. For example, high acoustic impedance metal layer such as Tungsten (W) Molybdenum (Mo) may (but need not) raise effective electromechanical coupling coefficient (Kt2). Subsequently deposited amorphous dielectric layer such as Silicon Dioxide ($SiO_2$) may (but need not) facilitate compensating for temperature dependent frequency shifts. Alternatively or additionally, one or more (e.g., one or a plurality of) interposer layers may comprise different metals for respective interposer layers. For example, high acoustic impedance metal layer such as Tungsten (W), Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited piezoelectric layer. Alternatively or additionally, one or more (e.g., one or a plurality of) interposer layers may comprise different dielectrics for respective interposer layers. For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide ($SiO_2$) may (but need not) facilitate compensating for frequency dependent frequency shifts.

In addition to the foregoing application of metal interposer layers to raise effective electromechanical coupling coefficient (Kt2) of adjacent piezoelectric layers, and the application of dielectric interposer layers to facilitate compensating for frequency response shifts with increasing temperature, interposer layers may, but need not, increase quality factor (Q-factor) and/or suppress irregular spectral response patterns characterized by sharp reductions in Q-factor known as "rattles". Q-factor of a resonator is a figure of merit in which increased Q-factor indicates a lower rate of energy loss per cycle relative to the stored energy of the resonator. Increased Q-factor in resonators used in filters results in lower insertion loss and sharper roll-off in filters. The irregular spectral response patterns characterized by sharp reductions in Q-factor known as "rattles" may cause ripples in filter pass bands.

Metal and/or dielectric interposer layer of suitable thicknesses and acoustic material properties (e.g., velocity, density) may be placed at appropriate places in the stack 104, 404A through 404C, of piezoelectric layers, for example, proximate to the nulls of acoustic energy distribution in the stacks (e.g., between interfaces of piezoelectric layers of opposing axis orientation). Finite Element Modeling (FEM) simulations and varying parameters in fabrication prior to subsequent testing may help to optimize interposer layer designs for the stack. Thickness of interposer layers may, but need not, be adjusted to influence increased Q-factor and/or rattle suppression. It is theorized that if the interposer layer is too thin there is no substantial effect. Thus minimum thickness for the interposer layer may be about one monolayer, or about five Angstroms (5 A). Alternatively, if the interposer layer is too thick, rattle strength may increase rather than being suppressed. Accordingly, an upper limit of interposer thickness may be about five-hundred Angstroms (500 A) for an approximately twenty-four gigahertz (24 GHz) resonator design, with limiting thickness scaling inversely with frequency for alternative resonator designs. It is theorized that below a series resonant frequency of resonators, Fs, Q-factor may not be systematically and significantly affected by including a single interposer layer. However, it is theorized that there may, but need not, be significant increases in Q-factor for inclusion of two or more interposer layers.

In the example resonators 100, 400A through 400C, of FIG. 1A and FIGS. 4A through 4C, a planarization layer 165, 465A through 465C (e.g., passivation layer 165, 465A through 465C) may be included. A suitable material may be used for planarization layer 165, 465A through 465C, for example Silicon Dioxide (SiO$_2$), Hafnium Dioxide (HfO2), polyimide, or BenzoCyclobutene (BCB). An isolation layer 167, 467A through 467C, may also be included and arranged over the planarization layer 165, 465A-465C. For the acoustic resonator based sensor of this disclosure, a suitable dielectric material may be used for the isolation layer 167, 467A through 467C, for example Silicon Nitride, Silicon Dioxide, or Aluminum Nitride. Thickness of isolation layer 167, 467A through 467C may be controlled, for example, to be very thin. For example, thickness of isolation layer 167, 467A through 467C may be within a range from approximately fifty Angstroms to approximately three hundred Angstroms (approximately 50 A to approximately 300 A) for resonators designed to operate at approximately 24 GHz.

In the example resonators 100, 400A through 400C, of FIG. 1A and FIGS. 4A through 4C, a bottom electrical interconnect 169, 469A through 469C, may be included to interconnect electrically with (e.g., electrically contact with) the bottom acoustic reflector 113, 413A through 413C, stack of the plurality of bottom metal electrode layers. A top electrical interconnect 171, 471A through 471C, may be included to interconnect electrically with the harmonically tuned top sensor electrode 115, 415A through 415C. A suitable material may be used for the bottom electrical interconnect 169, 469A through 469C, and the top electrical interconnect 171, 471A through 471C, for example, gold (Au). Top electrical interconnect 171, 471A through 471C may be arranged substantially away from an active area of the stack 104, 404A through 404C of the example four layers of piezoelectric material. This may provide for top electrical interconnect 171, 471A through 471C being substantially acoustically isolated from the active area of the stack 104, 404A through 404C of the example four layers of piezoelectric material. Top electrical interconnect 171, 471A through 471C may have dimensions selected so that the top electrical interconnect 171, 471A through 471C approximates an electrical transmission line impedance at the main resonant frequency of the bulk acoustic wave resonator 100, 400A through 400C (e.g., in cases where the electrical impedance of the bulk acoustic wave resonator 100, 400A through 400C may be designed to be near fifty ohms, the electrical transmission line impedance may be approximately fifty ohms). Top electrical interconnect 171, 471A through 471C may have a thickness that is substantially thicker than a thickness the harmonically tuned top sensor electrode 115, 415A through 415C. Top electrical interconnect 171, 471A through 471C may have a thickness within a range from about one hundred Angstroms (100 A) to about five micrometers (5 um). For example, top electrical interconnect 171, 471A through 471C may have a thickness of about two thousand Angstroms (2000 A).

Bulk acoustic wave resonators 100, 400A through 400C may comprise respective sensing regions (e.g., sensing regions 116, 416A through 416C). Sensing regions 116, 416A through 416C may comprise respective functionalized layers 168, 468A through 468C. Respective functionalized layers 168, 468A through 468C may be patterned, e.g., may have their lateral extents limited by patterning techniques, e.g., masking techniques, e.g., unmasked material removal techniques. Respective functionalized layers 168, 468A through 468C may be patterned to be arranged over respective active regions of bulk acoustic wave resonators 100, 400A through 400C (e.g., over central portions of the respective active regions). Variations of functionalized layers 168, 468A through 468C may be employed in combination with the other structures of bulk acoustic wave resonators 100, 400A through 400C for varied sensing purposes. For example, respective functionalized layers 168, 468A through 468C may be different from one another. This may facilitate respective responses (e.g., sensing responses) to differing environmental variables, e.g., binding to differing analytes. Respective functionalized layers 168, 468A through 468C may facilitate binding to respective analytes. Respective functionalized layers 168, 468A through 468C that may be different from one another to facilitate binding to respective analytes that may be different from one another. Respective functionalized layers 168, 468A through 468C may be selected to have affinity (e.g., selective affinity) for one or more respective analytes (e.g., targeted analytes). For example, various functionalized layers 168, 468A through 468C of the sensing regions (e.g., sensing regions 116, 416A through 416C) may selectively bind to various analytes, e.g., biomolecules (e.g., targeted biomolecules, e.g., coronavirus, e.g., SARS CoV-2, e.g., carriers of infectious disease, e.g., bioweapons, e.g., biomarkers, e.g., targeted antigens, e.g., targeted antibodies), for detection. For example, respective functionalized layers 168, 468A through 468C associated with bulk acoustic wave resonator 100, 400A through 400C may selectively bind the mass of one or more analytes, e.g., biomolecules (e.g., targeted biomolecules, e.g., coronavirus, e.g., SARS CoV-2, e.g., carriers of infectious disease, e.g., bioweapons, e.g., biomarkers, e.g., targeted antigens, e.g., targeted antibodies), to the functionalized layers 168, 468A through 468C. The mass of one or more analytes, e.g., biomolecules (e.g., targeted biomolecules, e.g., coronavirus, e.g., SARS CoV-2, e.g., carriers of infectious disease, e.g., bioweapons, e.g., biomarkers, e.g., targeted antigens, e.g., targeted antibodies), binding to the respective functionalized layers 168, 468A through 468C may cause respective detectable resonance frequency shifts (e.g., decreases in respective resonance frequencies) in operation of bulk acoustic wave resonators 100, 400A through 400C in their respective thickness extensional main resonant modes. Respective electrical circuitry may be coupled with bulk acoustic wave resonators 100, 400A through 400C to determine the resonance frequency shifts. This may detect the presence of analytes, for example, biomolecules (e.g., targeted biomolecules, e.g., coronavirus, e.g., SARS CoV-2, e.g., carriers of infectious disease, e.g., bioweapons, e.g., biomarkers, e.g., targeted antigens, e.g., targeted antibodies).

Functionalized layers 168, 468A through 468C may comprise respective binding layers, e.g., respective layers of antibodies, e.g., respective layers of binding antibodies, e.g., receptors, e.g., ligands. Functionalized layers 168, 468A through 468C may comprise respective interface layers (e.g., thin interface layers, e.g., very thin interface layers) e.g., of noble metal (e.g., gold). For example, the respective interface layers, e.g., noble metal layers may be within a range from five Angstroms thick (e.g., approximately one monolayer) to approximately one thousand five hundred Angstroms thick (e.g., approximately one acoustic wavelength of thickness extensional mode at approximately 24.25 GHz).

For functionalized layers 168, 468A through 468C, respective binding layers, e.g., respective layers of antibodies may be coupled with (e.g., acoustically coupled with, e.g., may be arranged over) respective interface layers (e.g., respective noble metal layers, e.g., respective supportive noble metal layers, e.g., respective noble metal layers). Functionalized layers 168, 468A through 468C may comprise respective immobilization layers to couple respective binding layers (e.g., respective layers of antibodies) to respective interface layers (e.g., respective gold layers). Respective immobilization layers may be arranged over respective interface layers (e.g., respective gold layers). Respective binding layers (e.g., respective layers of antibodies) may be arranged over respective immobilization layers. Respective immobilization layers of functionalized layers 168, 468A through 468C may comprise respective "Protein A" layers, e.g., respective immunoglobulin binding protein layers, to immobilize antibodies on respective interface layers (e.g., to immobilize coronavirus antibodies on respective gold interface layers, e.g., to immobilize SARS Cov-2 antibodies on respective gold interface layers).

Respective immobilization layers of functionalized layers 168, 468A through 468C may comprise respective self assembled monolayers (e.g., respective self assembled monolayers, e.g., self assembled monolayers comprising thiol material). The respective binding layers, e.g., respective layers of antibodies (e.g. respective layers of binding antibodies) may be arranged over respective immobilization layers, e.g., over respective self assembled monolayers. Respective self assembled monolayers may be formed by exposure of respective interface layers to molecules with chemical groups that exhibit strong affinities for the respective interface layers (e.g., strong affinities for respective noble metal layers, e.g., strong affinities for gold layers). For example, thiol-based (e.g., alkanethiol-based) assembled monolayers may be used. For example, molecules like Alkanethiols may have e.g., an alkyl chain as the back bone, may have e.g., a tail group, and may have e.g., a S—H head group. Thiols may be used on noble metal interface layers due to what may be a strong affinity for these metals. Examples of thiol-based self assembly monolayers that may be used include my comprise 1-dodecanethiol (DDT), 11-mercaptoundecanoic acid (MUA), and hydroxyl-terminated (hexaethylene glycol) undecanethiol (1-UDT). These thiols may contain the same or similar backbone, but different end groups—namely, methyl ($CH_3$), carboxyl (COOH), and hydroxyl-terminated hexaethylene glycol (HO—($CH_2CH_2O$)$_6$) for DDT, MUA, and 1-UDT, respectively. Self assembly monolayers may be formed by incubating interface layers, e.g., noble metal layers, e.g., gold layers, in thiol solutions using a suitable solvent, such as anhydrous ethanol. Following formation of respective self assembled monolayers, the self assembled monolayers may be biologically functionalized, such as by receiving at least one functionalization (e.g., specific binding) material.

Examples of specific binding materials may include, but are not limited to, antibodies, receptors, ligands, and the like. A specific binding material may be configured to receive a predefined target species (e.g., molecule, protein, DNA, virus, bacteria, etc.) As another example, respective binding layers of respective functionalized layers 168, 468A through 468C may comprise aptamers, e.g., Prostate Specific Antigen (PSA) binding aptamers to bind with analyte biomarkers, e.g., Prostate Specific Antigen (PSA) biomarkers, e.g., biomarkers for prostate cancer. As another example, respective binding layers of respective functionalized layers 168, 468A through 468C may have an affinity for glucose (e.g., binding layers of (3-acrylamidopropyl) tri-methylammonium chloride (poly(acrylamide-co-3-APB)). Glucose level may be recognized as a biomarker for management of diabetes.

More broadly, interactions of respective binding layers of respective functionalized layers 168, 468A through 468C in pairings with analytes may be viewed through the lens of biospecific interaction analysis (BIA) e.g., for antibody-antigen, e.g., for nucleic acids, e.g., for DNA-RNA, e.g., for protein-peptide, e.g. for enzymes-substrate, e.g., for receptors-various molecules. Respective binding layers of respective functionalized layers 168, 468A through 468C, may form one member of these pairings, and the other member may comprise the other member of these pairings. For example, as just discussed, respective binding layers of respective functionalized layers 168, 468A through 468C may comprise antibodies (e.g., coronavirus antibodies) to detect an analyte, e.g., antigens (e.g., coronavirus antigens). However the roles may be reversed. Respective binding layers of respective functionalized layers 168, 468A through 468C may comprise antigens (e.g., coronavirus antigens or portions thereof) to detect an analyte, e.g., antibodies (e.g., coronavirus antibodies). The presence of antibodies (e.g., coronavirus antibodies) in a blood sample or a sputum sample collected from a patient may be indicative of an infection (e.g., COVID-19). As additional examples, respective binding layers of respective functionalized layers 168, 468A through 468C may comprise a protein to detect an analyte, e.g., peptides. However the roles may be reversed. Respective binding layers of respective functionalized layers 168, 468A through 468C may comprise peptides to detect an analyte, e.g., proteins.

Respective members of respective functionalized layers 168, 468A through 468C (e.g., respective antibody layers of respective functionalized layers 168, 468A through 468C, e.g., respective noble metal layers of functionalized layers 168, 468A through 468C) may be coupled (e.g., acoustically coupled) with other respective members of bulk acoustic wave resonators 100, 400A through 400C (e.g., may be acoustically coupled with respective isolation layers 167, 467A through 467C, e.g., may be acoustically coupled with respective harmonically tuned top sensor electrodes 115, 415A through 415C, e.g., may be acoustically coupled with respective stacks 104, 404A through 404C of alternating axis arrangements of piezoelectric layers, e.g., may be acoustically coupled with respective bottom piezoelectric layers 105, 405A through 405C (e.g., having a normal axis orientation), e.g., may be acoustically coupled with respective first middle piezoelectric layers 107, 407A through 407C (e.g., having a reverse axis orientation), e.g., may be acoustically coupled with respective second middle piezoelectric layers 109, 409A through 409C (e.g., having the normal axis orientation), e.g., may be acoustically coupled with respective top piezoelectric layers 111, 411A through 411C (e.g., having the reverse axis orientation)).

Respective targeted analytes (e.g., respective targeted biomolecules), in binding with respective layers of antibodies of functionalized layers 168, 468A through 468C, may become acoustically coupled with respective members of bulk acoustic wave resonators 100, 400A through 400C (e.g., may become acoustically coupled with respective antibody layers of respective functionalized layers 168, 468A through 468C, e.g., may become acoustically coupled with respective noble metal layers of functionalized layers 168, 468A through 468C e.g., may become acoustically coupled with respective isolation layers 167, 467A through 467C, e.g., may become acoustically coupled with respective harmonically tuned top sensor electrodes 115, 415A through 415C, e.g., may become acoustically coupled with respective stacks 104, 404A through 404C of alternating axis arrangements of piezoelectric layers, e.g., may become acoustically coupled with respective bottom piezoelectric layers 105, 405A through 405C (e.g., having a normal axis orientation), e.g., may become acoustically coupled with respective first middle piezoelectric layers 107, 407A through 407C (e.g., having a reverse axis orientation), e.g., may become acoustically coupled with respective second middle piezoelectric layers 109, 409A through 409C (e.g., having the normal axis orientation), e.g., may become acoustically coupled with respective top piezoelectric layers 111, 411A through 411C (e.g., having the reverse axis orientation)).

Respective binding layers of functionalized layers 168, 468A through 468C may comprise material (e.g., bacteria, e.g., *Escherichia coli* bacteria) having an affinity for absorption of toxins, e.g., having an affinity for absorption of heavy metals, e.g., having an affinity for absorption of lead (Pb). Examples of heavy metals include mercury (Hg), cadmium (Cd), arsenic (As), chromium (Cr), thallium (Tl), and lead (Pb). As another example, respective binding layers of functionalized layers 168, 468A through 468C may comprise material (e.g., cobalt corroles) having an affinity for absorption of toxins, e.g., having an affinity for absorption of carbon monoxide. Functionalized layers 168, 468A through 468C may comprise respective nanoporous layers. In some cases, pore size of respective nanoporous layers may be tuned for analyte selectivity. Functionalized layers 168, 468A through 468C may comprise respective nanostructured layers. In some cases, nanostructure size of respective nanostructured layers may be tuned for analyte selectivity.

Respective binding layers of functionalized layers 168, 468A through 468C may comprise materials having an affinity for volatile organic compounds (e.g., hydrocarbons, e.g., alcohols, e.g., ammonia, e.g., acetone, e.g., ketones, e.g., aldehydes, e.g., esters, e.g., heterocycles). Example materials having affinity for volatile organic compounds include, hexamethyldisiloxane (HMDSO), hexamethyldisilazane (HMDSN) and tetraethoxysilane (TEOS), polyaniline, calixarenes, chitosan, chitosan/polyaniline nanofibers, grapheme, molecularly imprinted polymers, and mesoporous materials e.g., having a tunable pore structure.

Respective binding layers of functionalized layers 168, 468A through 468C may comprise molecularly imprinted polymers, which may have affinity for one or more target analytes. In addition to affinity for volatile organic compounds, as just mentioned, molecularly imprinted polymers may be configured to have affinity for other analytes, e.g., tetrahydrocannabinol (THC), e.g., biological weapons agents, e.g., anthrax. Molecularly imprinted polymer may be configured to have affinity for explosives, e.g., trinitrotoluene (TNT), e.g., 1,3,5-trinitro-1,3,5-triazacyclohexane (RDX). Molecularly imprinted polymers may be configured to have affinity for nerve agents, e.g., Sarin. Molecularly imprinted polymers may be configured to have affinity for a chemical associated with a chemical weapon, e.g., dimethyl methylphosphonate (DMMP). Dimethyl methylphosphonate (DMMP) is associated with production of the Sarin nerve agent.

Respective functionalized layers 168, 468A through 468C may comprise nanocomposites. Respective functionalized layers 168, 468A through 468C may have an affinity for a chemical associated with a chemical weapon, e.g., dimethyl methylphosphonate (DMMP). For example, a nanocomposite of ZnO modified MnO2 nanofibers may have an affinity for dimethyl methylphosphonate (DMMP).

Numerous examples just discussed are directed to examples where functionalized layers 168, 468A through 468C may include binding layers. Binding of analytes with functionalized layers 168, 468A through 468C may increase mass. This may lead to decrease in resonant frequency of example resonators 100, 400A through 400C. This may provide for analyte detection. In addition to the foregoing, there are the following examples of targeted energetic phenomena impinging on functionalized layers 168, 468A through 468C. Functionalized layers 168, 468A through 468C may be selectively configured for targeted energetic phenomena. This may lead to increase in temperature of functionalized layers 168, 468A through 468C. This may lead to decrease in resonant frequency of example resonators 100, 400A through 400C. This may provide for detection of the targeted energetic phenomena.

For example, functionalized layers 168, 468A through 468C may comprise a material having an affinity for absorbing neutrons, e.g., a material having a relatively high neutron cross section, e.g., cadmium. For example, respective functionalized layers 168, 468A through 468C may comprise the material having the affinity for absorbing neutrons, e.g., for absorbing the targeted energetic phenomena of a flux of thermal neutrons. This may lead to increase in temperature of functionalized layers 168, 468A through 468C. This may lead to decrease in resonant frequency of example resonators 100, 400A through 400C. The flux of thermal neutrons may be detected by example resonators 100, 400A through 400C.

As another example, respective functionalized layers 168, 468A through 468C may be selectively configured for a targeted energetic phenomena of infrared light. For example, respective functionalized layers 168, 468A through 468C may comprise material having an affinity for absorbing infrared light, e.g., nanoplasmonic metasurfaces configured to absorb infrared light. This may lead to increase in temperature of functionalized layers 168, 468A through 468C. This may lead to decrease in resonant frequency of example resonators 100, 400A through 400C. Using the respective functionalized layers 168, 468A through 468C so configured, infrared light may be detected by example resonators 100, 400A through 400C.

As another example, respective functionalized layers 168, 468A through 468C may be selectively configured for a targeted energetic phenomena of terahertz radiation. For example, respective functionalized layers 168, 468A through 468C may comprise material having an affinity for absorbing terahertz radiation, e.g., nanoplasmonic metasurfaces configured to absorb terahertz radiation. This may lead to increase in temperature of functionalized layers 168, 468A through 468C. This may lead to decrease in resonant frequency of example resonators 100, 400A through 400C. Using the respective functionalized layers 168, 468A through 468C so configured, terahertz radiation may be detected by example resonators 100, 400A through 400C.

As another example, respective functionalized layers 168, 468A through 468C may be selectively configured for a targeted energetic phenomena of solar blind ultraviolet light. For example, respective functionalized layers 168, 468A through 468C may comprise material having an affinity for absorbing solar blind ultraviolet light, e.g., beta gallium oxide (β-Ga2O3). This may lead to increase in temperature of functionalized layers 168, 468A through 468C. This may lead to decrease in resonant frequency of example resonators 100, 400A through 400C. Using the respective functionalized layers 168, 468A through 468C so configured, solar blind ultraviolet light may be detected by example resonators 100, 400A through 400C.

In addition to the forgoing examples, striction of respective functionalized layers 168, 468A through 468C may be in response to sensed phenomena. This may cause a changed in resonant frequency of example resonators 100, 400A through 400C. This may provide for detection of the sensed phenomena. For example, respective functionalized layers 168, 468A through 468C may be magnetostrictive, e.g., striction of respective functionalized layers 168, 468A through 468C may be in response to sensed magnetic phenomena. This may cause a change in resonant frequency of example resonators 100, 400A through 400C, e.g., magnetic phenomena may be detected, e.g., changes in magnetic phenomena may be detected. For example, respective functionalized layers 168, 468A through 468C may comprise a magnetostrictive material. Respective functionalized layers 168, 468A through 468C may be multiferroic. Respective functionalized layers 168, 468A through 468C may be magnetoelectric. Respective functionalized layers 168, 468A through 468C may comprise a nanocomposite. Respective functionalized layers 168, 468A through 468C may comprise respective heterostructures. Respective functionalized layers 168, 468A through 468C may comprise respective perovskite layers. Respective functionalized layers 168, 468A through 468C may comprise respective magnetostrictive exchange biased multilayers. Respective functionalized layers 168, 468A through 468C may comprise respective antiparallel magnetostrictive exchange biased multilayers.

More broadly, sensing regions 116, 416A through 416C may comprise respective functionalized layers 168, 468A through 468C. Sensing regions 116, 416A through 416C may comprise at least respective portions of respective harmonically tuned top sensor electrodes 115, 415A through 415C. Harmonically tuned top sensor electrodes 115, 415A through 415C may be magnetostrictive. Harmonically tuned top sensor electrodes 115, 415A through 415C may comprise a magnetostrictive material. Respective sensing regions 116, 416A through 416C may be acoustically coupled with respective harmonically tuned top sensor electrodes 115, 415A through 415C. This may comprise integral coupling of respective sensing regions 116, 416A through 416C with respective harmonically tuned top sensor electrodes 115, 415A through 415C. Respective sensing regions 116, 416A through 416C may comprise metallic glass (e.g., respective functionalized layers 168, 468A through 468C may comprise metallic glass, e.g., harmonically tuned top sensor electrodes 115, 415A through 415C may comprise metallic glass.) Respective sensing regions 116, 416A through 416C may comprise cobalt (e.g., respective functionalized layers 168, 468A through 468C may comprise cobalt, e.g., harmonically tuned top sensor electrodes 115, 415A through 415C may comprise cobalt.) Respective sensing regions 116, 416A through 416C may comprise terbium (e.g., respective functionalized layers 168, 468A through 468C may comprise terbium, e.g., harmonically tuned top sensor electrodes 115, 415A through 415C may comprise terbium.) Respective sensing regions 116, 416A through 416C may comprise samarium (e.g., respective functionalized layers 168, 468A through 468C may comprise samarium, e.g., harmonically tuned top sensor electrodes 115, 415A through 415C may comprise samarium.) Respective sensing regions 116, 416A through 416C may comprise dysprosium (e.g., respective functionalized layers 168, 468A through 468C may comprise dysprosium, e.g., harmonically tuned top sensor electrodes 115, 415A through 415C may comprise dysprosium.) Respective sensing regions 116, 416A through 416C may comprise nickel (e.g., respective functionalized layers 168, 468A through 468C may comprise nickel, e.g., harmonically tuned top sensor electrodes 115, 415A through 415C may comprise nickel.) Respective sensing regions 116, 416A through 416C may comprise a metallic alloy (e.g., respective functionalized layers 168, 468A through 468C may comprise a metallic alloy, e.g., harmonically tuned top sensor electrodes 115, 415A through 415C may comprise a metallic alloy.) Respective sensing regions 116, 416A through 416C may comprise a giant magnetostrictive alloy (e.g., respective functionalized layers 168, 468A through 468C may comprise a giant magnetostrictive alloy, e.g., harmonically tuned top sensor electrodes 115, 415A through 415C may comprise a giant magnetostrictive alloy.)

Respective sensing regions 116, 416A through 416C may comprise respective tunable regions (e.g., respective functionalized layers 168, 468A through 468C may comprise respective tunable regions, e.g., harmonically tuned top sensor electrodes 115, 415A through 415C may comprise tunable regions.) For example striction (e.g., magnetostriction) may provide for tuning of resonant frequencies of respective resonators 100, 400A through 400C, in response to sensed phenomena (e.g., in response to magnetic phenomena). For example, respective bulk acoustic wave (BAW) resonators 100, 400A through 400C may comprise respective tunable bulk acoustic wave (BAW) resonators 100, 400A through 400C. Respective bulk acoustic wave (BAW) resonators 100, 400A through 400C may comprise at least a portion of a tunable electric filter (e.g., ladder filter of interconnected tunable bulk acoustic wave (BAW) resonators).

Figure 1B:
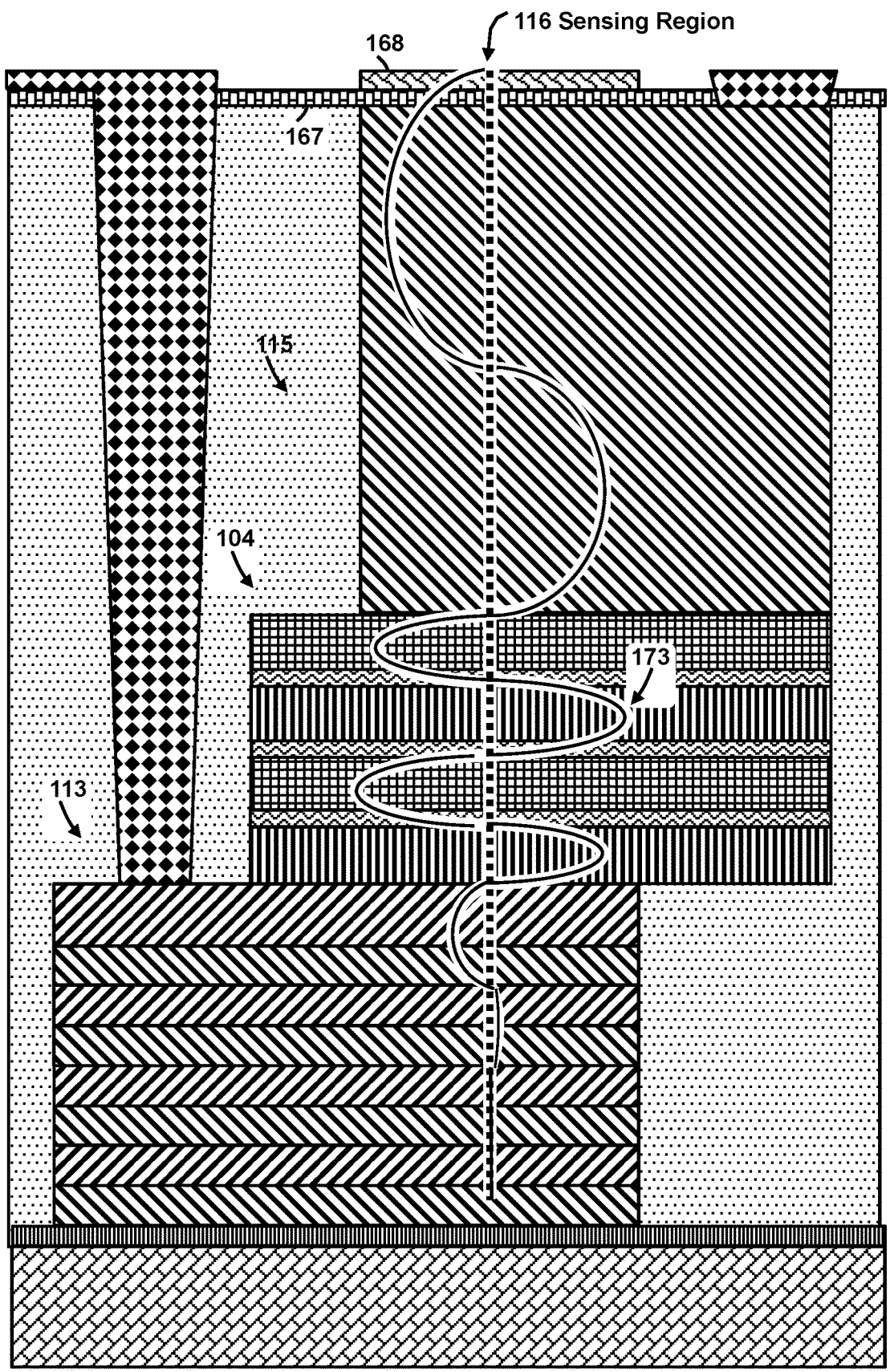
FIG. 1B is a simplified view of FIG. 1A that illustrates acoustic stress profile during electrical operation of the bulk acoustic wave resonator structure shown in FIG. 1A.

FIG. 1B is a simplified view of FIG. 1A that illustrates an example of acoustic stress distribution during electrical operation of the bulk acoustic wave resonator structure shown in FIG. 1A. A notional curved line schematically depicts vertical (Tzz) stress distribution 173 through stack 104 of the example four piezoelectric layers. The stress 173 is excited by the oscillating electric field applied via the harmonically tuned top sensor electrode 115, and the multilayer metal acoustic reflector electrode 113 comprising bottom metal electrode layers. The stress 173 has maximum values inside the stack 104 of piezoelectric layers, while exponentially tapering off within the multilayer metal acoustic reflector electrode 113. Acoustic energy confined in the resonator structure 100 may be proportional to stress magnitude.

As discussed previously herein, the example four piezoelectric layers in the stack 104 may have an alternating axis arrangement in the stack 104. For example the bottom piezoelectric layer may have the normal axis orientation. Next in the alternating axis arrangement of the stack 104 is the first middle piezoelectric layer. Next in the alternating axis arrangement of the stack 104, is the second middle piezoelectric layer. Next in the alternating axis arrangement of the stack 104 is the top piezoelectric layer. For the alternating axis arrangement of the stack 104, stress 173 excited by the applied oscillating electric field causes normal axis piezoelectric layers to be in compression, while reverse axis piezoelectric layers are in extension. Accordingly, FIG. 1B shows peaks of stress 173 on the right side of the heavy dashed line to depict compression in normal axis piezoelectric layers (e.g., bottom and second middle piezoelectric layers), while peaks of stress 173 are shown on the left side of the heavy dashed line to depict extension in reverse axis piezoelectric layers (e.g., first middle and top piezoelectric layers).

In operation of the BAW resonator shown in FIG. 1B, peaks of standing wave acoustic energy may correspond to absolute value of peaks of stress 173 as shown in FIG. 1B (e.g., peaks of standing wave acoustic energy may correspond to squares of absolute value of peaks of stress 173 as shown in FIG. 1B). In operation of the BAW resonator, standing wave acoustic energy may be coupled through the harmonically tuned top sensor electrode 115, through isolation layer 167 and into functionalized layer 168 of sensing region 116 shown in FIG. 1B.

Standing wave acoustic energy may be coupled into the multilayer metal acoustic reflector electrode 113 shown in FIG. 1B in operation of the BAW resonator. A second member of the first pair of bottom metal electrode layers may have a relatively high acoustic impedance (e.g., high acoustic impedance metal layer, e.g., tungsten layer). A first member of the first pair of bottom metal electrode layers may have a relatively low acoustic impedance (e.g., low acoustic impedance metal layer, e.g., titanium layer). Accordingly, the first member of the first pair of bottom metal electrode layers may have acoustic impedance that is relatively lower than the acoustic impedance of the second member. The first member 119 having the relatively lower acoustic impedance may be arranged, for example as shown in FIG. 1B, sufficiently proximate to a first layer of piezoelectric material (e.g. sufficiently proximate to bottom layer of piezoelectric material, e.g., sufficiently proximate to stack of piezoelectric material) so that standing wave acoustic energy to be in the first member is greater than respective standing wave acoustic energy to be in other respective layers of the multi-layer metal bottom acoustic reflector electrode 113 in operation of the BAW resonator (e.g. greater than standing wave acoustic energy in the second member of the first pair of bottom metal electrode layers, e.g., greater than standing wave acoustic energy in the first member of the second pair of bottom metal electrode layers, e.g., greater than standing wave acoustic energy in the second member of the second pair of bottom metal electrode layers, e.g., greater than standing wave acoustic energy in the first member of the third pair of bottom metal electrode layers, e.g., greater than standing wave acoustic energy in the second member of the third pair of bottom metal electrode layers, e.g., greater than standing wave acoustic energy in the first member of the fourth pair of bottom metal electrodes, e.g., greater than standing wave acoustic energy in the second member of the fourth pair of bottom metal electrodes. This may facilitate suppressing parasitic lateral resonances in operation of the BAW resonator shown in FIG. 1B.

Figure 1C:
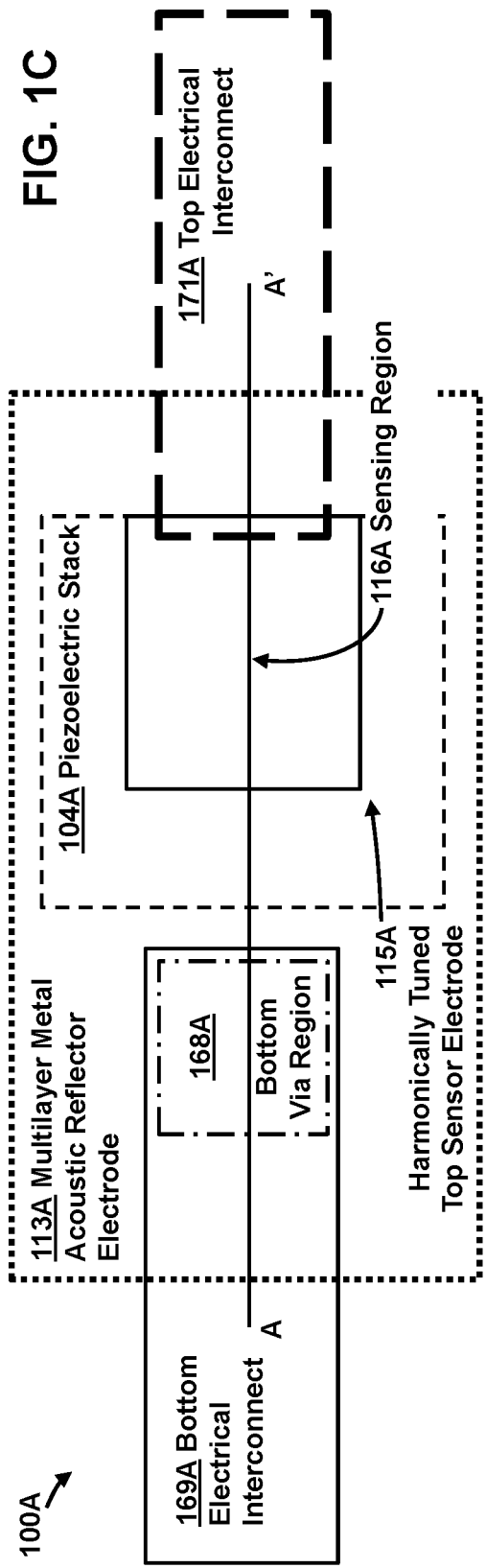
FIG. 1C shows a simplified top plan view of a bulk acoustic wave resonator structure corresponding to the cross sectional view of FIG. 1A, and also shows another simplified top plan view of an alternative bulk acoustic wave resonator structure.
Figure 1C:
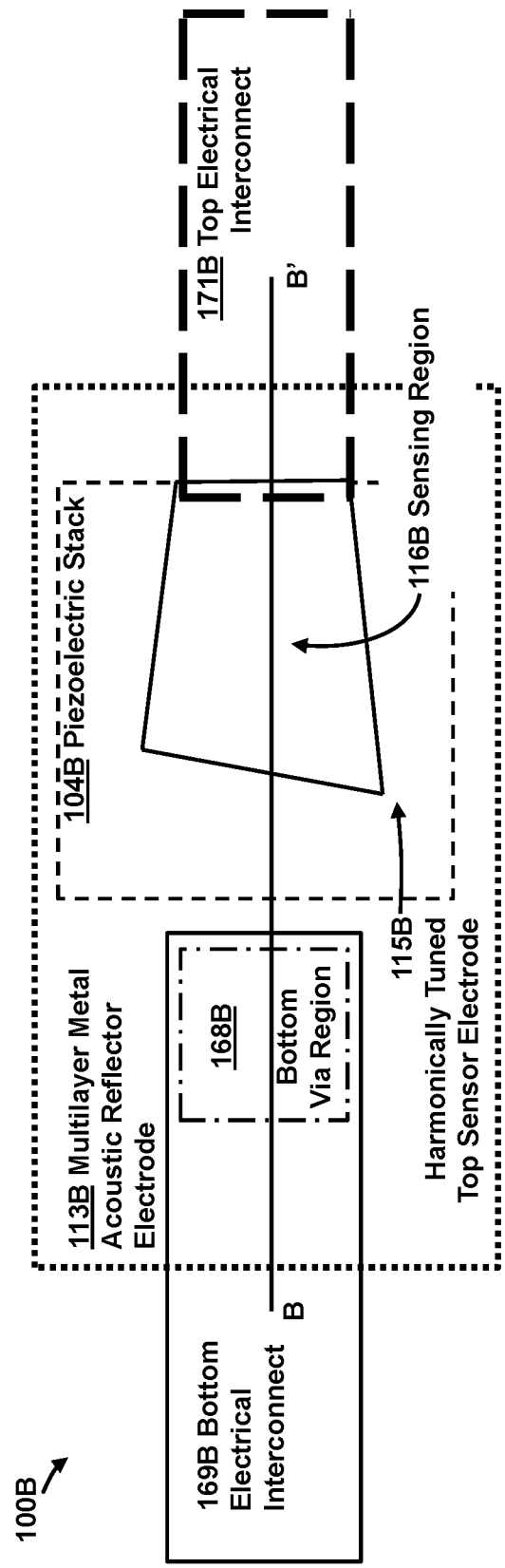

FIG. 1C shows a simplified top plan view of a bulk acoustic wave resonator structure 100A corresponding to the cross sectional view of FIG. 1A, and also shows another simplified top plan view of an alternative bulk acoustic wave resonator structure 100B. The bulk acoustic wave resonator structure 100A includes the stack 104A of four layers of piezoelectric material e.g., having the alternating piezoelectric axis arrangement of the four layers of piezoelectric material. The stack 104A of piezoelectric layers may be sandwiched between the multilayer metal acoustic reflector electrode 113A and harmonically tuned top sensor electrode 115A. The multilayer metal acoustic reflector electrode comprise the stack of the plurality of bottom metal electrode layers of the multilayer metal acoustic reflector electrode 113A, e.g., having the alternating arrangement of low acoustic impedance bottom metal electrode layers and high acoustic impedance bottom metal layers. Top electrical interconnect 171A extends over (e.g., electrically contacts) an extremity of harmonically tuned top sensor electrode 115A. Bottom electrical interconnect 169A extends over (e.g., electrically contacts) an extremity of multilayer metal acoustic reflector electrode 113A through bottom via region 168A.

FIG. 1C also shows another simplified top plan view of an alternative bulk acoustic wave resonator structure 100B having an apodized shape. The bulk acoustic wave resonator structure 100B includes the stack 104B of four layers of piezoelectric material e.g., having the alternating piezoelectric axis arrangement of the four layers of piezoelectric material. The stack 104B of piezoelectric layers may be sandwiched between the multilayer metal acoustic reflector electrode 113B and harmonically tuned top sensor electrode 115B. Harmonically tuned top sensor electrode 115B may have the alternative apodized shape of alternative bulk acoustic wave resonator structure 100B. The multilayer metal acoustic reflector electrode may comprise the stack of the plurality of bottom metal electrode layers of the multilayer metal acoustic reflector electrode 113B, e.g., having the alternating arrangement of low acoustic impedance bottom metal electrode layers and high acoustic impedance bottom metal layers. Top electrical interconnect 171B extends over (e.g., electrically contacts) an extremity of harmonically tuned top sensor electrode 115B. Bottom electrical interconnect 169B extends over (e.g., electrically contacts) an extremity of multilayer metal acoustic reflector electrode 113B through bottom via region 168B.

In FIGS. 1D and 1E, Nitrogen (N) atoms are depicted with a hatching style, while Aluminum (Al) atoms are depicted without a hatching style. FIG. 1D is a perspective view of an illustrative model of a reverse axis crystal structure 175 of Aluminum Nitride, AlN, in piezoelectric material of layers in FIG. 1A, e.g., having reverse axis orientation of negative polarization. For example, first middle and top piezoelectric layers 107, 111 discussed previously herein with respect to FIGS. 1A and 1B are reverse axis piezoelectric layers. By convention, when the first layer of normal axis crystal structure 175 is a Nitrogen, N, layer and second layer in an upward direction (in the depicted orientation) is an Aluminum, Al, layer, the piezoelectric material including the reverse axis crystal structure 175 is said to have crystallographic c-axis negative polarization, or reverse axis orientation as indicated by the upward pointing arrow 177. For example, polycrystalline thin film Aluminum Nitride, AlN, may be grown in the crystallographic c-axis negative polarization, or reverse axis, orientation perpendicular relative to the substrate surface using reactive magnetron sputtering of an aluminum target in a nitrogen atmosphere, and by introducing oxygen into the gas atmosphere of the reaction chamber during fabrication at the position where the flip to the reverse axis is desired. An inert gas, for example, Argon may also be included in a sputtering gas atmosphere, along with the nitrogen and oxygen.

For example, a predetermined amount of oxygen containing gas may be added to the gas atmosphere over a short predetermined period of time or for the entire time the reverse axis layer is being deposited. The oxygen containing gas may be diatomic oxygen containing gas, such as oxygen (O2). Proportionate amounts of the Nitrogen gas (N2) and the inert gas may flow, while the predetermined amount of oxygen containing gas flows into the gas atmosphere over the predetermined period of time. For example, N2 and Ar gas may flow into the reaction chamber in approximately a 3:1 ratio of N2 to Ar, as oxygen gas also flows into the reaction chamber. For example, the predetermined amount of oxygen containing gas added to the gas atmosphere may be in a range from about a thousandth of a percent (0.001%) to about ten percent (10%), of the entire gas flow. The entire gas flow may be a sum of the gas flows of argon, nitrogen and oxygen, and the predetermined period of time during which the predetermined amount of oxygen containing gas is added to the gas atmosphere may be in a range from about a quarter (0.25) second to a length of time needed to create an entire layer, for example. For example, based on massflows, the oxygen composition of the gas atmosphere may be about 2 percent when the oxygen is briefly injected. This results in an aluminum oxynitride (ALON) portion of the final monolithic piezoelectric layer, integrated in the Aluminum Nitride, AlN, material, having a thickness in a range of about 5 nm to about 20 nm, which is relatively oxygen rich and very thin. Alternatively, the entire reverse axis piezoelectric layer may be aluminum oxynitride.

FIG. 1E is a perspective view of an illustrative model of a normal axis crystal structure 179 of Aluminum Nitride, AlN, in piezoelectric material of layers in FIG. 1A, e.g., having normal axis orientation of positive polarization. For example, bottom and second middle piezoelectric layers 105, 109 discussed previously herein with respect to FIGS. 1A and 1B are normal axis piezoelectric layers. By convention, when the first layer of the reverse axis crystal structure 179 is an Al layer and second layer in an upward direction (in the depicted orientation) is an N layer, the piezoelectric material including the reverse axis crystal structure 179 is said to have a c-axis positive polarization, or normal axis orientation as indicated by the downward pointing arrow 181. For example, polycrystalline thin film AlN may be grown in the crystallographic c-axis positive polarization, or normal axis, orientation perpendicular relative to the substrate surface by using reactive magnetron sputtering of an Aluminum target in a nitrogen atmosphere.

Figure 2A:
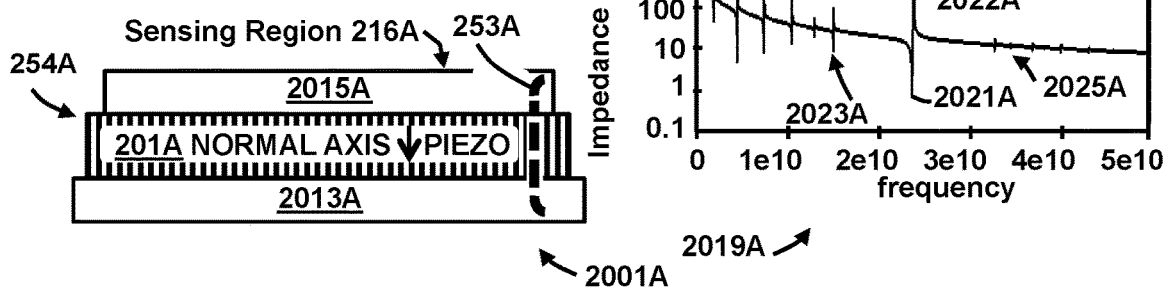
FIGS. 2A and 2B show a further simplified view of a bulk acoustic wave resonator similar to the bulk acoustic wave resonator structure shown in FIG. 1A along with its corresponding impedance versus frequency response during its electrical operation, as well as alternative bulk acoustic wave resonator structures with differing numbers of alternating axis piezoelectric layers, and their respective corresponding impedance versus frequency response during electrical operation, as predicted by simulation.
Figure 2A:
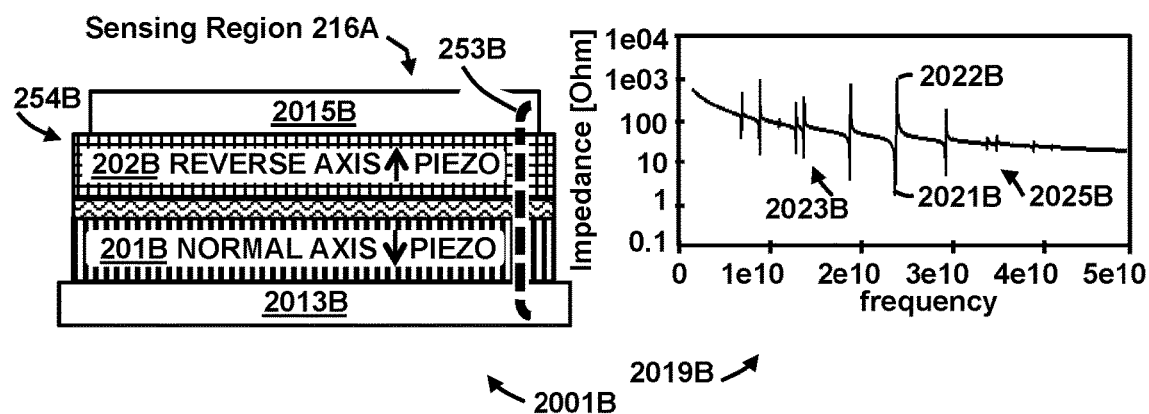
Figure 2A:
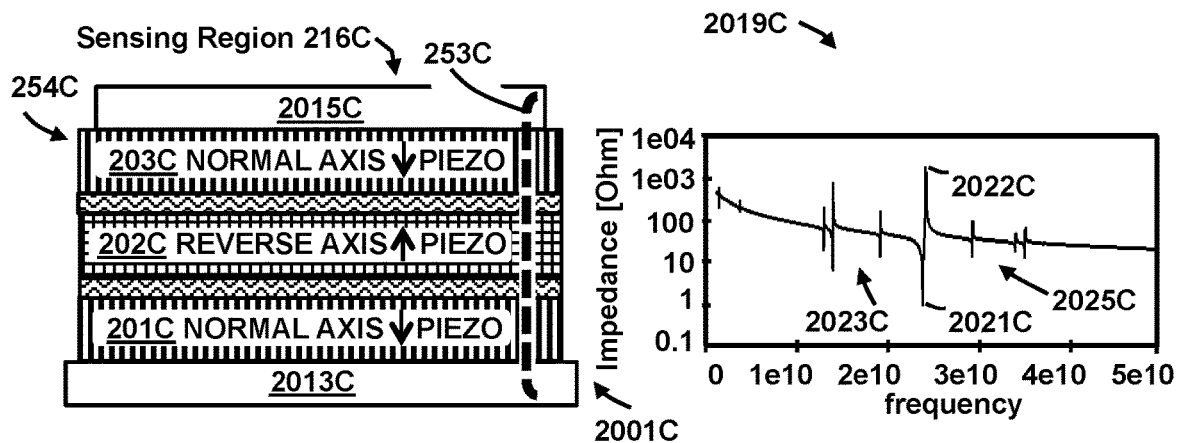
Figure 2B:
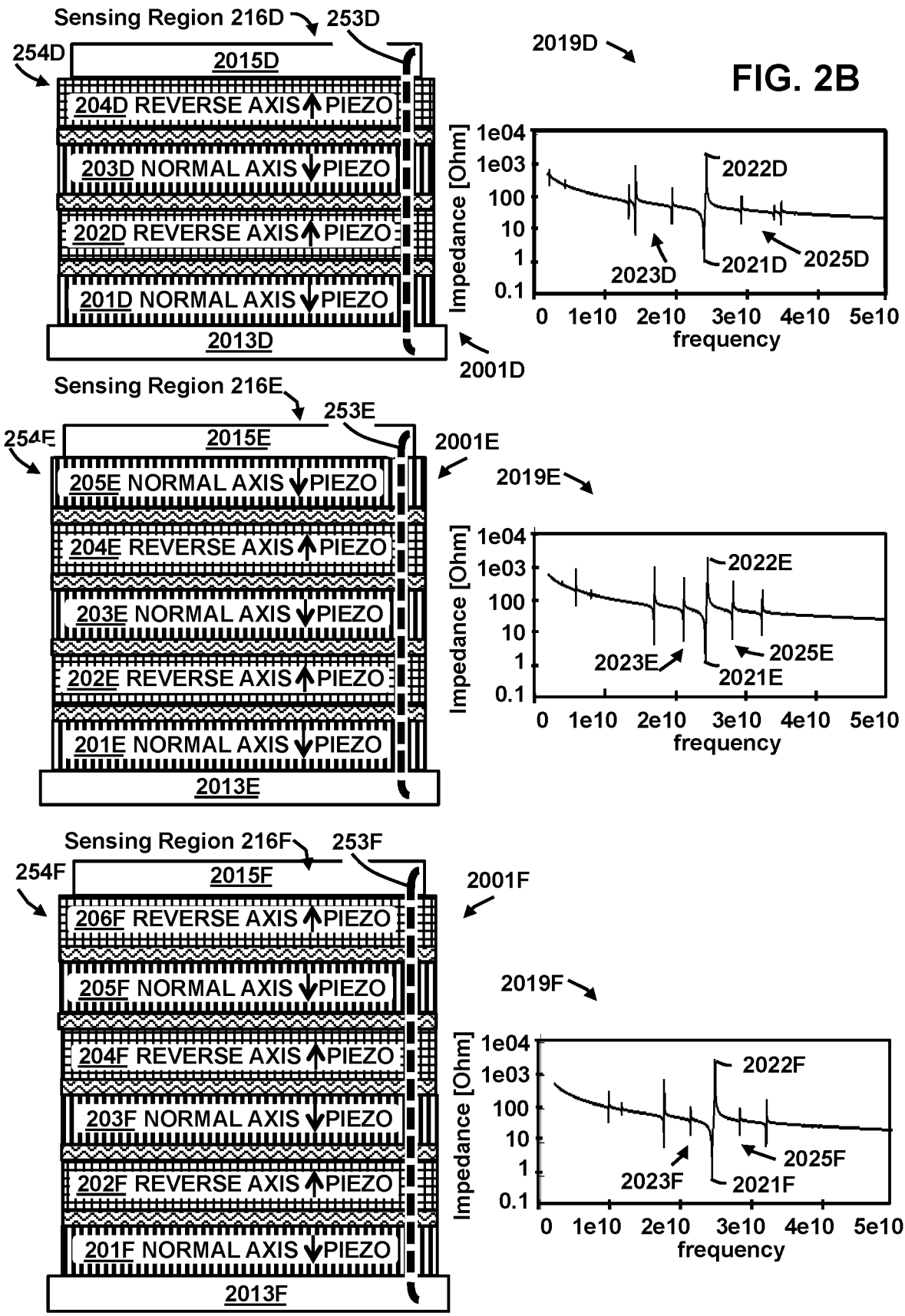
Figure 2D:
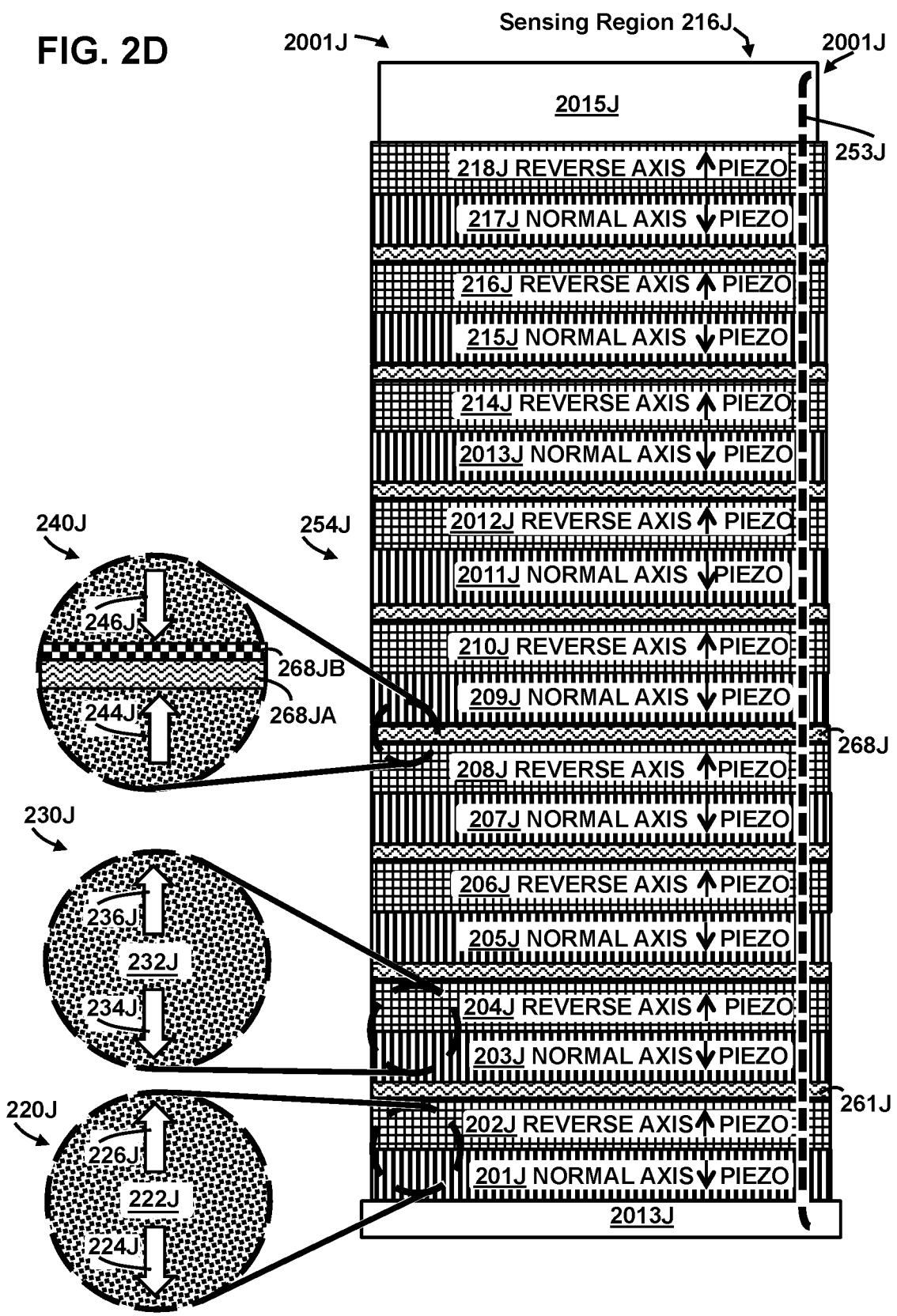
FIGS. 2D and 2E show more additional alternative bulk acoustic wave resonator structures.
Figure 2E:
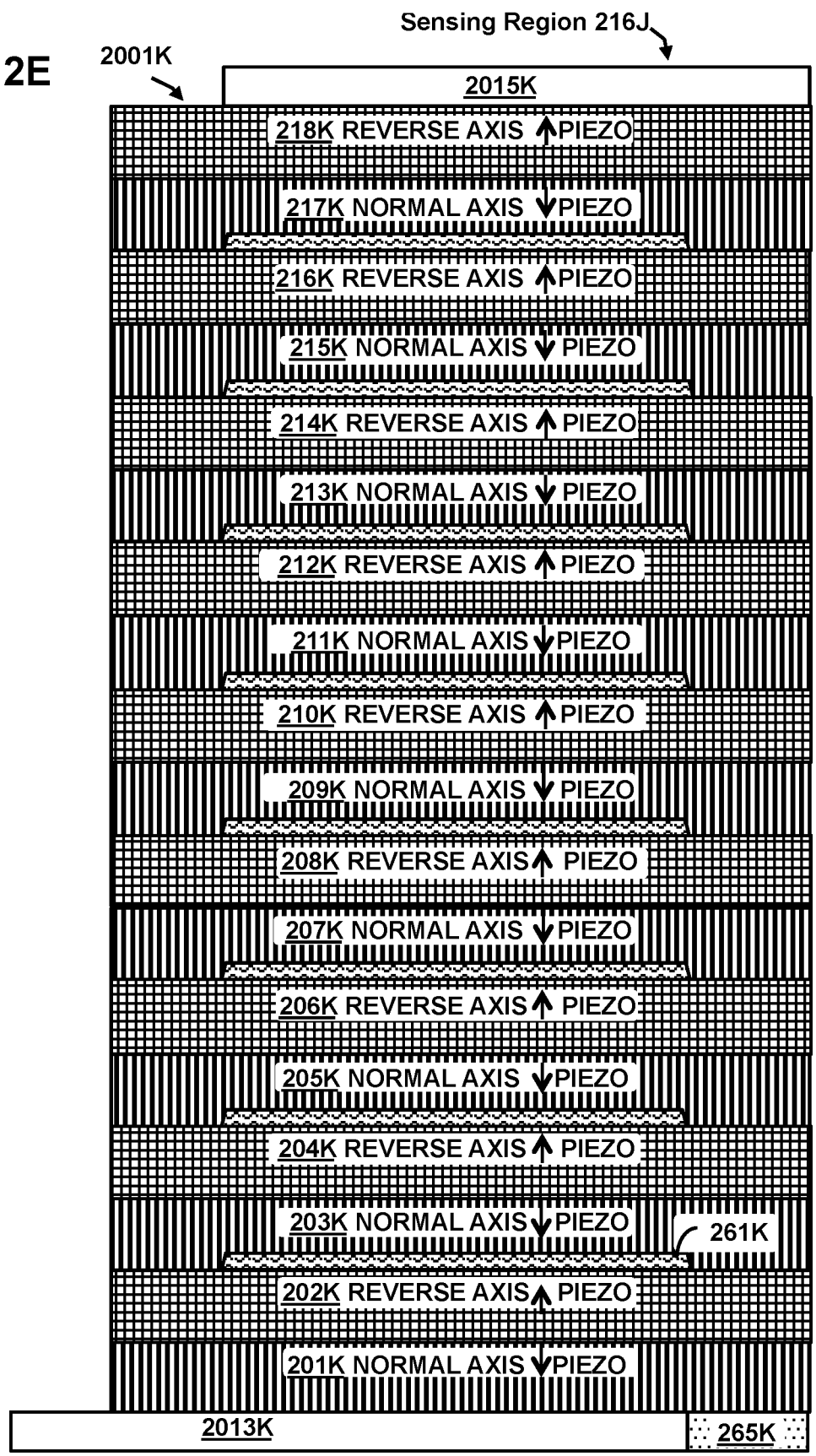

FIGS. 2A through 2E show further simplified views of bulk acoustic wave resonators similar to the bulk acoustic wave resonator structure shown in FIG. 1A. In addition to further simplified views of bulk acoustic wave resonators, FIGS. 2A and 2B show corresponding impedance versus frequency response during its electrical operation, as well as alternative bulk acoustic wave resonator structures with differing numbers of alternating axis piezoelectric layers, and their respective corresponding impedance versus frequency response during electrical operation. FIG. 2C shows additional alternative bulk acoustic wave resonator structures with additional numbers of alternating axis piezoelectric layers. FIGS. 2D and 2E show more additional alternative bulk acoustic wave resonator structures. Bulk acoustic wave resonators 2001A through 2001K may, but need not be, bulk acoustic millimeter wave resonators 2001A through 2001K, operable with a main resonance mode having a main resonant frequency that is a millimeter wave frequency (e.g., twenty-four Gigahertz, 24 GHz) in a millimeter wave frequency band. As defined herein, millimeter wave means a wave having a frequency within a range extending from eight Gigahertz (8 GHz) to three hundred Gigahertz (300 GHz), and millimeter wave band means a frequency band spanning this millimeter wave frequency range from eight Gigahertz (8 GHz) to three hundred Gigahertz (300 GHz). Bulk acoustic wave resonators 2001A through 2001K may, but need not be, bulk acoustic Super High Frequency (SHF) wave resonators 2001A through 2001K or bulk acoustic Extremely High Frequency (EHF) wave resonators 2001A through 2001K, as the terms Super High Frequency (SHF) and Extremely High Frequency (EHF) are defined by the International Telecommunications Union (ITU). For example, bulk acoustic wave resonators 2001A through 2001K may be bulk acoustic Super High Frequency (SHF) wave resonators 2001A through 2001K operable with a main resonance mode having a main resonant frequency that is a Super High Frequency (SHF) (e.g., twenty-four Gigahertz, 24 GHz) in a Super High Frequency (SHF) wave frequency band. Piezoelectric layer thicknesses may be selected to determine the main resonant frequency of bulk acoustic Super High Frequency (SHF) wave resonators 2001A through 2001K in the Super High Frequency (SHF) wave band (e.g., twenty-four Gigahertz, 24 GHz main resonant frequency).

Similarly, layer thicknesses of Super High Frequency (SHF) reflector layers (e.g., layer thickness of multilayer metal acoustic SHF reflector electrodes 1013A through 2013K) may be selected to determine quarter wavelength resonant frequency of such SHF reflectors at a frequency, e.g., quarter wavelength resonant frequency, within the Super High Frequency (SHF) wave band. For example, layer thickness of de-tuned multi-layer metal acoustic SHF wave reflector bottom electrodes 2013A through 2013K may be acoustically de-tuned (e.g., tuned down in frequency) from the resonant frequency (e.g. main resonant frequency) of the BAW resonator (e.g., tuned down to have a quarter wavelength resonant frequency that is lower than the 24 GHz main resonant frequency of the SHF BAW resonator). Similarly, layer thicknesses of Super High Frequency (SHF) harmonically tuned top sensor electrodes (e.g., layer thickness of SHF harmonically tuned top sensor electrodes 2015A through 2015K) may be selected to determine half wavelength resonant frequency of such SHF harmonically tuned top sensor electrodes at a frequency, e.g., half wavelength resonant frequency, within the Super High Frequency (SHF) wave band. For example, layer thickness of de-tuned of SHF harmonically tuned top sensor electrodes 2015A through 2015K may be acoustically de-tuned (e.g., tuned up in frequency) from the resonant frequency (e.g. main resonant frequency) of the BAW resonator (e.g., tuned up to have a half wavelength resonant frequency that is higher than a 24 GHz main resonant frequency of the SHF BAW resonator, e.g., tuned up to have a half wavelength resonant frequency that is higher than the 24 GHz main resonant frequency of the SHF BAW resonator).

Alternatively, bulk acoustic wave resonators 2001A through 2001K may be bulk acoustic Extremely High Frequency (EHF) wave resonators 2001A through 2001K operable with a main resonance mode having a main resonant frequency that is an Extremely High Frequency (EHF) wave band (e.g., thirty-nine Gigahertz, 39 GHz main resonant frequency, e.g., seventy-seven Gigahertz, 77 GHz main resonant frequency) in an Extremely High Frequency (EHF) wave frequency band. As discussed previously herein, piezoelectric layer thicknesses may be selected to determine the main resonant frequency of bulk acoustic Extremely High Frequency (EHF) wave resonators 2001A through 2001K in the Extremely High Frequency (EHF) wave band (e.g., thirty-nine Gigahertz, 39 GHz main resonant frequency, e.g., seventy-seven Gigahertz, 77 GHz main resonant frequency). Similarly, layer thicknesses of Extremely High Frequency (EHF) reflector layers (e.g., layer thickness of multilayer metal acoustic EHF reflector electrodes 1013A through 2013K) may be selected to determine quarter wavelength resonant frequency of such EHF reflectors at a frequency, e.g., quarter wavelength resonant frequency, within the Extremely High Frequency (EHF) wave band. For example, layer thickness of de-tuned multi-layer metal acoustic EHF wave reflector bottom electrodes 2013A through 2013K may be acoustically de-tuned (e.g., tuned down in frequency) from the resonant frequency (e.g. main resonant frequency) of the BAW resonator (e.g., tuned down to have a quarter wavelength resonant frequency that is lower than a 77 GHz main resonant frequency of the EHF BAW resonator, e.g., tuned down to have a quarter wavelength resonant frequency that is lower than the 77 GHz main resonant frequency of the EHF BAW resonator). Similarly, layer thicknesses of Super High Frequency (SHF) harmonically tuned top sensor electrodes (e.g., layer thickness of EHF harmonically tuned top sensor electrodes 2015A through 2015K) may be selected to determine half wavelength resonant frequency of such EHF harmonically tuned top sensor electrodes at a frequency, e.g., half wavelength resonant frequency, within the Super High Frequency (SHF) wave band. For example, layer thickness of de-tuned of EHF harmonically tuned top sensor electrodes 2015A through 2015K may be acoustically de-tuned (e.g., tuned up in frequency) from the resonant frequency (e.g. main resonant frequency) of the BAW resonator (e.g., tuned up to have a half wavelength resonant frequency that is up higher than the 77 GHz main resonant frequency of the EHF BAW resonator).

The general structures of the harmonically tuned top sensor electrode and the multilayer metal acoustic reflector electrode have already been discussed previously herein with respect of FIGS. 1A and 1B. As already discussed, the multilayer metal acoustic reflector electrode is directed to respective pairs of metal electrode layers, in which a first member of the pair has a relatively low acoustic impedance (relative to acoustic impedance of another member of the pair), in which the other member of the pair has a relatively high acoustic impedance (relative to acoustic impedance of the first member of the pair).

For example, in bottom de-tuned reflector electrodes 2013A through 2013I and 2013K, the first member having the relatively lower acoustic impedance of the first pair may be arranged nearest, e.g. may abut, a first piezoelectric layer (e.g. bottom piezoelectric layer of the BAW resonator, e.g., piezoelectric stack of the BAW resonator). For example, in bottom de-tuned reflector electrodes 2013J, the first member of the first pair of layers of bottom de-tuned reflector electrodes 2013J having the relatively lower acoustic impedance of the first pair may be arranged substantially nearest, e.g. may substantially abut, the first piezoelectric layer (e.g. bottom piezoelectric layer of the BAW resonator, e.g., piezoelectric stack of the BAW resonator). This may facilitate suppressing parasitic lateral modes. In bottom de-tuned reflector electrodes 2013A through 2013K, the first member having the relatively lower acoustic impedance may be arranged sufficiently proximate to the first layer of piezoelectric material (e.g. may be arranged sufficiently proximate to the bottom piezoelectric layer, e.g. may be arranged sufficiently proximate to the piezoelectric stack), so that the first member having the relatively lower acoustic impedance may contribute more to the multilayer metal acoustic reflector electrode being acoustically de-tuned from the resonant frequency of the BAW resonator than is contributed by any other bottom metal electrode layer of the multilayer metal acoustic reflector electrode. In bottom de-tuned reflector electrodes 2013A through 2013K, the first member having the relatively lower acoustic impedance may be arranged sufficiently proximate to the first layer of piezoelectric material (e.g. may be arranged sufficiently proximate to the bottom piezoelectric layer, e.g. may be arranged sufficiently proximate to the piezoelectric stack), so that the first member having the relatively lower acoustic impedance may contribute more, e.g., may contribute more to facilitate suppressing parasitic lateral resonances in operation of the BAW resonator than is contributed by any other bottom metal electrode layer of the multilayer metal acoustic reflector electrode.

Shown in FIG. 2A is a bulk acoustic SHF or EHF wave resonator 2001A including a normal axis piezoelectric layer 201A sandwiched between SHF or EHF detuned harmonically tuned top sensor electrode 2015A and multi-layer metal bottom de-tuned acoustic SHF or EHF wave reflector electrode 2013A. For the single piezoelectric layer 201A of bulk acoustic SHF or EHF wave resonator 2001A, simulation may predict optimal facilitation of suppressing parasitic lateral resonances by de-tuning of the resonant frequency of the bulk acoustic wave resonator 2001A, for de-tuning of SHF or EHF harmonically tuned top sensor electrode 2015A and the multi-layer metal bottom de-tuned acoustic SHF or EHF wave reflector electrode 2013A. Also shown in FIG. 2A is a bulk acoustic SHF or EHF wave resonator 2001B including a normal axis piezoelectric layer 201B and a reverse axis piezoelectric layer 202B arranged in a two piezoelectric layer alternating stack arrangement sandwiched between SHF or EHF detuned harmonically tuned top sensor electrode 2015B and detuned multi-layer metal acoustic SHF or EHF wave reflector bottom electrode 2013B. For the two piezoelectric layer 201B, 202B of bulk acoustic SHF or EHF wave resonator 2001B, simulation may predict optimal facilitation of suppressing parasitic lateral resonances by de-tuning of the resonant frequency of the bulk acoustic wave resonator 2001B, for de-tuning of the SHF or EHF detuned harmonically tuned top sensor electrode 2015 B and the multi-layer metal bottom de-tuned acoustic SHF or EHF wave reflector electrode 2013B. A bulk acoustic SHF or EHF wave resonator 2001C includes a normal axis piezoelectric layer 201C, a reverse axis piezoelectric layer 202C, and another normal axis piezoelectric layer 203C arranged in a three piezoelectric layer alternating stack arrangement sandwiched between SHF or EHF detuned harmonically tuned top sensor electrode 2015C and detuned multi-layer metal acoustic SHF or EHF wave reflector bottom electrode 2013C. For the three piezoelectric layer 201C, 202C, 203C of bulk acoustic SHF or EHF wave resonator 2001C, simulation may predict optimal facilitation of suppressing parasitic lateral resonances by de-tuning of the resonant frequency of the bulk acoustic wave resonator 2001C, for de-tuning of the SHF or EHF detuned harmonically tuned top sensor electrode 2015 C and de-tuning of the multi-layer metal bottom de-tuned acoustic SHF or EHF wave reflector electrode 2013C.

Included in FIG. 2B is bulk acoustic SHF or EHF wave resonator 2001D in a further simplified view similar to the bulk acoustic wave resonator structure shown in FIGS. 1A and 1B and including a normal axis piezoelectric layer 201D, a reverse axis piezoelectric layer 202D, and another normal axis piezoelectric layer 203D, and another reverse axis piezoelectric layer 204D arranged in a four piezoelectric layer alternating stack arrangement sandwiched between SHF or EHF detuned harmonically tuned top sensor electrode 2015D and multi-layer metal acoustic SHF or EHF wave reflector bottom electrode 2013D. For the four piezoelectric layer 201D, 202D, 203D, 204D of bulk acoustic SHF or EHF wave resonator 2001D, simulation may predict optimal facilitation of suppressing parasitic lateral resonances by de-tuning of the resonant frequency of the bulk acoustic wave resonator 2001D, for de-tuning of the SHF or EHF detuned harmonically tuned top sensor electrode 2015 D and the multi-layer metal bottom de-tuned acoustic SHF or EHF wave reflector electrode 2013D. A bulk acoustic SHF or EHF wave resonator 2001E includes a normal axis piezoelectric layer 201E, a reverse axis piezoelectric layer 202E, another normal axis piezoelectric layer 203E, another reverse axis piezoelectric layer 204E, and yet another normal axis piezoelectric layer 205E arranged in a five piezoelectric layer alternating stack arrangement sandwiched between SHF or EHF detuned harmonically tuned top sensor electrode 2015E and multi-layer metal acoustic SHF or EHF wave reflector bottom electrode 2013E. For the five piezoelectric layer 201E, 202E, 203E, 204E, 205E of bulk acoustic SHF or EHF wave resonator 2001E, simulation may predict optimal facilitation of suppressing parasitic lateral resonances by de-tuning of the resonant frequency of the bulk acoustic wave resonator 2001E, for de-tuning of the SHF or EHF detuned harmonically tuned top sensor electrode 2015 E and the multi-layer metal bottom de-tuned acoustic SHF or EHF wave reflector electrode 2013E. A bulk acoustic SHF or EHF wave resonator 2001F includes a normal axis piezoelectric layer 201F, a reverse axis piezoelectric layer 202F, another normal axis piezoelectric layer 203F, another reverse axis piezoelectric layer 204F, yet another normal axis piezoelectric layer 205F, and yet another reverse axis piezoelectric layer 206F arranged in a six piezoelectric layer alternating stack arrangement sandwiched between SHF or EHF detuned harmonically tuned top sensor electrode 2015F and multi-layer metal acoustic SHF or EHF wave reflector bottom electrode 2013F. For the six piezoelectric layer 201F, 202F, 203F, 204F, 205F, 206F of bulk acoustic SHF or EHF wave resonator 2001F, simulation may predict optimal facilitation of suppressing parasitic lateral resonances by de-tuning of the resonant frequency of the bulk acoustic wave resonator 2001F, for de-tuning of the SHF or EHF detuned harmonically tuned top sensor electrode 2015 F and the multi-layer metal bottom de-tuned acoustic SHF or EHF wave reflector electrode 2013F.

In FIG. 2A, shown directly to the right of the bulk acoustic SHF or EHF wave resonator 2001A including the normal axis piezoelectric layer 201A and half-wavelength thick harmonically tuned top sensing electrode 2015A, is a corresponding diagram 2019A depicting its impedance versus frequency response during its electrical operation, as predicted by simulation. The diagram 2019A depicts the main resonant peak 2021A of the main resonant mode (e.g., main series resonant peak 2021A) of the bulk acoustic SHF or EHF wave resonator 2001A at its main resonant frequency (e.g., its 24 GHz series resonant frequency, e.g., its main series resonant frequency, e.g., Fs) and main parallel resonant peak 2022A of the bulk acoustic SHF or EHF wave resonator 2001A at its main parallel resonant frequency, Fp. The diagram 2019A also depicts the satellite resonance peaks 2023A, 2025A of the satellite resonant modes of the bulk acoustic SHF or EHF wave resonator 2001A at satellite frequencies above and below the main resonant frequency 2021A (e.g., above and below the 24 GHz series resonant frequency). Relatively speaking, the main resonant mode corresponding to the main resonance peak 2021A is the strongest resonant mode because it is stronger than other resonant modes of the resonator 2001A, (e.g., stronger than the satellite modes corresponding to relatively lesser satellite resonance peaks 2023A, 2025A).

Similarly, in FIGS. 2A and 2B, shown directly to the right of the bulk acoustic SHF or EHF wave resonators 2001B through 2001F are respective corresponding diagrams 2019B through 2019F depicting corresponding impedance versus frequency response during electrical operation, as predicted by simulation. The resonators 2001B, 2001D and 2001F comprise one wavelength thick harmonically tuned top sensing electrodes 2015B, 2015D and 2015F, respectively, while the resonators 2001C and 2001E comprise half-wavelength thick harmonically tuned top sensing electrodes 2015C and 2015E, respectively. The diagrams 2019B through 2019F depict respective example SHF main resonant peaks 2021B through 2021F of respective corresponding main resonant modes of bulk acoustic SHF wave resonators 2001B through 2001F at respective corresponding main resonant frequencies (e.g., respective 24 GHz series resonant frequencies, e.g., main series resonant frequencies, Fs) and main parallel resonant peak 2022B through 2022F of the bulk acoustic SHF or EHF wave resonator 2001A at its main parallel resonant frequencies, Fp. The diagrams 2019B through 2019F also depict respective example SHF satellite resonance peaks 2023B through 2023F, 2025B through 2025F of respective corresponding satellite resonant modes of the bulk acoustic SHF wave resonators 2001B through 2001F at respective corresponding SHF satellite frequencies above and below the respective corresponding main SHF resonant frequencies 2021B through 2021F (e.g., above and below the corresponding respective 24 GHz series resonant frequencies). Relatively speaking, for the corresponding respective main SHF resonant modes, its corresponding respective SHF main resonance peak 2021B through 2021F is the strongest for its bulk acoustic SHF wave resonators 2001B through 2001F (e.g., stronger than the corresponding respective SHF satellite modes and corresponding respective lesser SHF satellite resonance peaks 2023B, 2025B).

As mentioned previously, FIG. 2C shows additional alternative bulk acoustic wave resonator structures with additional numbers of alternating axis piezoelectric layers. A bulk acoustic SHF or EHF wave resonator 2001G includes four normal axis piezoelectric layers 201G, 203G, 205G, 207G, and four reverse axis piezoelectric layers 202G, 204G, 206G, 208G arranged in an eight piezoelectric layer alternating stack arrangement sandwiched between SHF or EHF detuned harmonically tuned top sensor electrode 2015G and multi-layer metal bottom de-tuned acoustic SHF or EHF wave reflector electrode 2013G. For the eight piezoelectric layer 201G, 202G, 203G, 204G, 205G, 206G, 207G, 208G of bulk acoustic SHF or EHF wave resonator 2001G, simulation may predict optimal facilitation of suppressing parasitic lateral resonances by de-tuning of the resonant frequency of the bulk acoustic wave resonator 2001G, for de-tuning of the SHF or EHF detuned harmonically tuned top sensor electrode 2015 G and the multi-layer metal bottom de-tuned acoustic SHF or EHF wave reflector electrode 2013G. A bulk acoustic SHF or EHF wave resonator 2001H includes five normal axis piezoelectric layers 201H, 203H, 205H, 207H, 209H and five reverse axis piezoelectric layers 202H, 204H, 206H, 208H, 210H arranged in a ten piezoelectric layer alternating stack arrangement sandwiched between SHF or EHF detuned harmonically tuned top sensor electrode 2015 H and multi-layer metal bottom acoustic SHF or EHF wave reflector electrode 2013H. For the ten piezoelectric layer 201H, 202H, 203H, 204H, 205H, 206H, 207H, 208H, 209H, 210H of bulk acoustic SHF or EHF wave resonator 2001H, simulation may predict optimal facilitation of suppressing parasitic lateral resonances by de-tuning of the resonant frequency of the bulk acoustic wave resonator 2001H, for de-tuning of the SHF or EHF detuned harmonically tuned top sensor electrode 2015H and the multi-layer metal bottom de-tuned acoustic SHF or EHF wave reflector electrode 2013H. A bulk acoustic SHF or EHF wave resonator 2001I includes nine normal axis piezoelectric layers 201I, 203I, 205I, 207I, 209I, 211, 213I, 215I, 217I and nine reverse axis piezoelectric layers 202I, 204I, 206I, 208I, 210I, 212I, 214I, 216I, 218I arranged in an eighteen piezoelectric layer alternating stack arrangement sandwiched between SHF or EHF detuned harmonically tuned top sensor electrode 2015I and multi-layer metal bottom de-tuned acoustic SHF or EHF wave reflector bottom electrode 2013I. For the eighteen piezoelectric layer 201I, 202I, 203I, 204I, 205I, 206I, 207I, 208I, 209I, 210I, 211I, 212I, 213I, 214I, 215I, 216I, 217I, 218I of bulk acoustic SHF or EHF wave resonator 2001H, simulation may predict optimal facilitation of suppressing parasitic lateral resonances by de-tuning of the resonant frequency of the bulk acoustic wave resonator 2001I, for de-tuning of the SHF or EHF detuned harmonically tuned top sensor electrode 2015I and the multi-layer metal bottom de-tuned acoustic SHF or EHF wave reflector electrode 2013I.

In the example resonators, 2001A through 2001F, of FIGS. 2A through 2B, respective sensing region 216A through 216F is explicitly shown. For the sake of simplicity in the example resonators 2001G through 2001I of FIG. 2C, respective sensing regions are present but are not explicitly shown. In the example resonators, 2001A through 2001I, of FIGS. 2A through 2C, a notional heavy dashed line is used in depicting respective etched edge region, 253A through 253, associated with the example resonators, 2001A through 2001I. Similarly, in the example resonators, 2001A through 2001, of FIGS. 2A through 2C, a laterally opposed etched edge region 254A through 254I may be arranged laterally opposite from etched edge region, 253A through 253. The respective etched edge region may, but need not, assist with acoustic isolation of the resonators, 2001A through 2001. The respective etched edge region may, but need not, help with avoiding acoustic losses for the resonators, 2001A through 2001I. The respective etched edge region, 253A through 253I, (and the laterally opposed etched edge region 254A through 254I) may extend along the thickness dimension of the respective piezoelectric layer stack. The respective etched edge region, 253A through 253I, (and the laterally opposed etched edge region 254A through 254I) may extend through (e.g., entirely through or partially through) the respective piezoelectric layer stack. The respective etched edge region, 253A through 253I may extend through (e.g., entirely through or partially through) the respective first piezoelectric layer, 201A through 201I. The respective etched edge region, 253B through 253I, (and the laterally opposed etched edge region 254B through 254I) may extend through (e.g., entirely through or partially through) the respective second piezoelectric layer, 202B through 202I. The respective etched edge region, 253C through 253I, (and the laterally opposed etched edge region 254C through 254I) may extend through (e.g., entirely through or partially through) the respective third piezoelectric layer, 203C through 203I. The respective etched edge region, 253D through 253, (and the laterally opposed etched edge region 254D through 254I) may extend through (e.g., entirely through or partially through) the respective fourth piezoelectric layer, 204D through 204I. The respective etched edge region, 253E through 253I, (and the laterally opposed etched edge region 254E through 254I) may extend through (e.g., entirely through or partially through) the respective additional piezoelectric layers of the resonators, 2001E through 2001I. The respective etched edge region, 253A through 253I, (and the laterally opposed etched edge region 254A through 254I) may extend along the thickness dimension of the respective multi-layer metal acoustic SHF or EHF wave reflector bottom electrode, 2013A through 2013I, of the resonators, 2001A through 2001I. The respective etched edge region, 253A through 253I, (and the laterally opposed etched edge region 254A through 254I) may extend through (e.g., entirely through or partially through) the respective, 2013A through 2013I. The respective etched edge region, 253A through 253I, (and the laterally opposed etched edge region 254A through 254I) may extend along the thickness dimension of the respective SHF or EHF detuned harmonically tuned top sensor electrode 2015A through 2015I of the resonators, 2001A through 2001I. The etched edge region, 253A through 253I, (and the laterally opposed etched edge region 254A through 254I) may extend through (e.g., entirely through or partially through) the respective multi-layer metal bottom de-tuned acoustic SHF or EHF wave reflector electrode, 2013A through 2013I.

As shown in FIGS. 2A through 2C, first mesa structures corresponding to the respective stacks of piezoelectric material layers may extend laterally between (e.g., may be formed between) etched edge regions 253A through 253I and laterally opposing etched edge region 254A through 254I. Second mesa structures corresponding to multi-layer metal bottom de-tuned acoustic SHF or EHF wave reflector electrode 2013A through 2013I may extend laterally between (e.g., may be formed between) etched edge regions 253A through 253I and laterally opposing etched edge region 254A through 254I. Third mesa structures corresponding to SHF or EHF detuned harmonically tuned top sensor electrode 2015A through 2015I may extend laterally between (e.g., may be formed between) etched edge regions 253A through 253I and laterally opposing etched edge region 254A through 254I.

In accordance with the teachings herein, various bulk acoustic SHF or EHF wave resonators may include: a seven piezoelectric layer alternating axis stack arrangement; a nine piezoelectric layer alternating axis stack arrangement; an eleven piezoelectric layer alternating axis stack arrangement; a twelve piezoelectric layer alternating axis stack arrangement; a thirteen piezoelectric layer alternating axis stack arrangement; a fourteen piezoelectric layer alternating axis stack arrangement; a fifteen piezoelectric layer alternating axis stack arrangement; a sixteen piezoelectric layer alternating axis stack arrangement; and a seventeen piezoelectric layer alternating axis stack arrangement; and that these stack arrangements may be sandwiched between respective SHF or EHF detuned harmonically tuned top sensor electrodes and respective multi-layer metal bottom de-tuned acoustic SHF or EHF wave reflector electrodes. As mentioned previously, in accordance with the teachings of this disclosure, number of member piezoelectric layers in an alternating piezoelectric axis arrangement may be increased in designs extending to higher resonant frequencies. This may, but need not boost quality factor (Q factor). A total quality factor of the BAW resonator including the sheet resistance of the top electrode may be within a range from approximately three hundred to approximately fifteen hundred.

Further, it should be understood that interposer layers as discussed previously herein with respect to FIG. 1A are explicitly shown in the simplified diagrams of the various resonators shown in FIGS. 2A, 2B and 2C. Such interposers may be included and interposed between adjacent piezoelectric layers in the various resonators shown in FIGS. 2A, 2B and 2C, and further may be included and interposed between adjacent piezoelectric layers in the various resonators having the alternating axis stack arrangements of various numbers of piezoelectric layers, as described in this disclosure. In some other alternative bulk acoustic wave resonator structures, fewer interposer layers may be employed. For example, FIG. 2D shows another alternative bulk acoustic wave resonator structure 2001J, similar to bulk acoustic wave resonator structure 2001I shown in FIG. 2C, but with differences. For example, relatively fewer interposer layers may be included in the alternative bulk acoustic wave resonator structure 2001J shown in FIG. 2D. For example, FIG. 2D shows a first interposer layer 261J interposed between second layer of (reverse axis) piezoelectric material 202J and third layer of (normal axis) piezoelectric material 203J, but without an interposer layer interposed between first layer of (normal axis) piezoelectric material 201J and second layer of (reverse axis) piezoelectric material 202J. As shown in FIG. 2D in a first detailed view 220J, without an interposer layer interposed between first layer of piezoelectric material 201J and second layer of piezoelectric material 202J, the first and second piezoelectric layer 201J, 202J may be a monolithic layer 222J of piezoelectric material (e.g., Aluminum Nitride (AlN)) having first and second regions 224J, 226J. A central region of monolithic layer 222J of piezoelectric material (e.g., Aluminum Nitride (AlN)) between first and second regions 224J, 226J may be oxygen rich. The first region 224J of monolithic layer 222J (e.g., bottom region 224J of monolithic layer 222J) has a first piezoelectric axis orientation (e.g., normal axis orientation) as representatively illustrated in detailed view 220J using a downward pointing arrow at first region 224J, (e.g., bottom region 224J). This first piezoelectric axis orientation (e.g., normal axis orientation, e.g., downward pointing arrow) at first region 224J of monolithic layer 222J (e.g., bottom region 224J of monolithic layer 222J) corresponds to the first piezoelectric axis orientation (e.g., normal axis orientation, e.g., downward pointing arrow) of first piezoelectric layer 201J. The second region 226J of monolithic layer 222J (e.g., top region 226J of monolithic layer 222J) has a second piezoelectric axis orientation (e.g., reverse axis orientation) as representatively illustrated in detailed view 220J using an upward pointing arrow at second region 226J, (e.g., top region 226J). This second piezoelectric axis orientation (e.g., reverse axis orientation, e.g., upward pointing arrow) at second region 226J of monolithic layer 222J (e.g., top region 226J of monolithic layer 222J) may be formed to oppose the first piezoelectric axis orientation (e.g., normal axis orientation, e.g., downward pointing arrow) at first region 224J of monolithic layer 222J (e.g., bottom region 224J of monolithic layer 222J) by adding gas (e.g., oxygen) to flip the axis while sputtering the second region 226J of monolithic layer 222J (e.g., top region 226J of monolithic layer 222J) onto the first region 224J of monolithic layer 222J (e.g., bottom region 224J of monolithic layer 222J). The second piezoelectric axis orientation (e.g., reverse axis orientation, e.g., upward pointing arrow) at second region 226J of monolithic layer 222J (e.g., top region 226J of monolithic layer 222J) corresponds to the second piezoelectric axis orientation (e.g., reverse axis orientation, e.g., upward pointing arrow) of second piezoelectric layer 202J.

Similarly, as shown in FIG. 2D in a second detailed view 230J, without an interposer layer interposed between third layer of piezoelectric material 203J and fourth layer of piezoelectric material 204J, the third and fourth piezoelectric layer 203J, 204J may be an additional monolithic layer 232J of piezoelectric material (e.g., Aluminum Nitride (AlN)) having first and second regions 234J, 236J. A central region of additional monolithic layer 232J of piezoelectric material (e.g., Aluminum Nitride (AlN)) between first and second regions 234J, 236J may be oxygen rich. The first region 234J of additional monolithic layer 232J (e.g., bottom region 234J of additional monolithic layer 232J) has the first piezoelectric axis orientation (e.g., normal axis orientation) as representatively illustrated in second detailed view 230J using the downward pointing arrow at first region 234J, (e.g., bottom region 224J). This first piezoelectric axis orientation (e.g., normal axis orientation, e.g., downward pointing arrow) at first region 234J of additional monolithic layer 232J (e.g., bottom region 234J of additional monolithic layer 232J) corresponds to the first piezoelectric axis orientation (e.g., normal axis orientation, e.g., downward pointing arrow) of third piezoelectric layer 203J. The second region 236J of additional monolithic layer 232J (e.g., top region 236J of additional monolithic layer 232J) has the second piezoelectric axis orientation (e.g., reverse axis orientation) as representatively illustrated in second detailed view 230J using the upward pointing arrow at second region 236J, (e.g., top region 236J). This second piezoelectric axis orientation (e.g., reverse axis orientation, e.g., upward pointing arrow) at second region 236J of additional monolithic layer 232J (e.g., top region 236J of additional monolithic layer 232J) may be formed to oppose the first piezoelectric axis orientation (e.g., normal axis orientation, e.g., downward pointing arrow) at first region 234J of additional monolithic layer 232J (e.g., bottom region 234J of additional monolithic layer 232J) by adding gas (e.g., oxygen) to flip the axis while sputtering the second region 236J of additional monolithic layer 232J (e.g., top region 236J of additional monolithic layer 232J) onto the first region 234J of additional monolithic layer 232J (e.g., bottom region 234J of additional monolithic layer 232J). The second piezoelectric axis orientation (e.g., reverse axis orientation, e.g., upward pointing arrow) at second region 236J of additional monolithic layer 232J (e.g., top region 236J of additional monolithic layer 232J) corresponds to the second piezoelectric axis orientation (e.g., reverse axis orientation, e.g., upward pointing arrow) of fourth piezoelectric layer 204J.

Similar to what was just discussed, without an interposer layer interposed between fifth layer of piezoelectric material 205J and sixth layer of piezoelectric material 206J, the fifth and sixth piezoelectric layer 205J, 206J may be another additional monolithic layer of piezoelectric material (e.g., Aluminum Nitride (AlN)) having first and second regions. More generally, for example in FIG. 2D, where N is an odd positive integer, without an interposer layer interposed between Nth layer of piezoelectric material and (N+1)th layer of piezoelectric material, the Nth and (N+1)th piezoelectric layer may be an (N+1)/2th monolithic layer of piezoelectric material (e.g., Aluminum Nitride (AlN)) having first and second regions. Accordingly, without an interposer layer interposed between seventeenth layer of piezoelectric material 217J and eighteenth layer of piezoelectric material 218J, the seventeenth and eighteenth piezoelectric layer 217J, 218J may be ninth monolithic layer of piezoelectric material (e.g., Aluminum Nitride (AlN)) having first and second regions.

The first interposer layer 261J is shown in FIG. 2D as interposing between a first pair of opposing axis piezoelectric layers 201J, 202J, and a second pair of opposing axis piezoelectric layers 203J, 204J. More generally, for example, where M is a positive integer, an Mth interposer layer is shown in FIG. 2D as interposing between an Mth pair of opposing axis piezoelectric layers and an (M+1)th pair of opposing axis piezoelectric layers. Accordingly, an eighth interposer layer is shown in FIG. 2D as interposing between an eighth pair of opposing axis piezoelectric layers 215J, 216J, and a ninth pair of opposing axis piezoelectric layers 217J, 218J. FIG. 2D shows an eighteen piezoelectric layer alternating axis stack arrangement sandwiched between SHF or EHF detuned harmonically tuned top sensor electrodes 2015 J and multi-layer metal bottom de-tuned acoustic SHF or EHF wave reflector electrode 2013J. Etched edge region 253J (and laterally opposing etched edge region 254J) may extend through (e.g., entirely through, e.g., partially through) the eighteen piezoelectric layer alternating axis stack arrangement and its interposer layers, and may extend through (e.g., entirely through, e.g., partially through) SHF or EHF detuned harmonically tuned top sensor electrodes 2015 J, and may extend through (e.g., entirely through, e.g., partially through) multi-layer metal bottom de-tuned acoustic SHF or EHF wave reflector electrode 2013J. As shown in FIG. 2D, a first mesa structure corresponding to the stack of eighteen piezoelectric material layers may extend laterally between (e.g., may be formed between) etched edge region 253J and laterally opposing etched edge region 254J. A second mesa structure corresponding to multi-layer metal bottom de-tuned acoustic SHF or EHF wave reflector electrode 2013J may extend laterally between (e.g., may be formed between) etched edge region 253J and laterally opposing etched edge region 254J. Third mesa structure corresponding to SHF or EHF detuned harmonically tuned top sensor electrodes 2015 J may extend laterally between (e.g., may be formed between) etched edge region 253J and laterally opposing etched edge region 254J.

As mentioned previously herein, one or more (e.g., one or a plurality of) interposer layers may be metal interposer layers. Alternatively or additionally, one or more (e.g., one or a plurality of) interposer layers may be dielectric interposer layers. Interposer layers may be metal and/or dielectric interposer layers. Alternatively or additionally, one or more (e.g., one or a plurality of) interposer layers may be formed of different metal layers. For example, high acoustic impedance metal layer such as Tungsten (W), Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited piezoelectric layer. Alternatively or additionally, one or more (e.g., one or a plurality of) interposer layers may be formed of different dielectric layers. For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide (SiO$_2$) may (but need not) facilitate compensating for temperature dependent frequency shifts. Alternatively or additionally, one or more (e.g., one or a plurality of) interposer layers may comprise metal and dielectric for respective interposer layers. For example, high acoustic impedance metal layer such as Tungsten (W), Molybdenum (Mo) may (but need not) raise effective electromechanical coupling coefficient (Kt2) while subsequently deposited amorphous dielectric layer such as Silicon Dioxide (SiO$_2$) may (but need not) facilitate compensating for temperature dependent frequency shifts. For example, in FIG. 2D one or more of the interposer layers (e.g., interposer layer 268J) may comprise metal and dielectric for respective interposer layers. For example, detailed view 240J of interposer 268J shows interposer 268J as comprising metal sub-layer 268JB over dielectric sub-layer 268JA. For interposer 268J, example thickness of metal sub-layer 268JB may be approximately two hundred Angstroms (200 A). For interposer 268J, example thickness of dielectric sub-layer 268JA may be approximately two hundred Angstroms (200 A). The second piezoelectric axis orientation (e.g., reverse axis orientation, e.g., upward pointing arrow) at region 244J (e.g., bottom region 244J) corresponds to the second piezoelectric axis orientation (e.g., reverse axis orientation, e.g., upward pointing arrow) of eighth piezoelectric layer 208J. The first piezoelectric axis orientation (e.g., normal axis orientation, e.g., downward pointing arrow) at region 246J (e.g., top region 246J) corresponds to the first piezoelectric axis orientation (e.g., normal orientation, e.g., downward pointing arrow) of ninth piezoelectric layer 209J.

FIG. 2D shows sensing region 216J acoustically coupled with SHF or EHF detuned harmonically tuned top sensor electrode 2015. Multi-layer metal bottom de-tuned acoustic SHF or EHF wave reflector electrode 2013J may comprise a first pair of metal top electrode layers (not shown). Multi-layer metal bottom de-tuned acoustic SHF or EHF wave reflector electrode 2013J may also include additional similar pairs (not shown) of alternating high acoustic impedance metal layers. The first pair of metal top electrode layers may comprise a first member of low acoustic impedance metal layer and a second member of high acoustic impedance metal layer (not shown). In addition to the first pair of metal bottom electrode layers (not shown), the multi-layer metal bottom de-tuned acoustic SHF or EHF wave reflector electrode may include additional pairs (not shown) of alternating high acoustic impedance/low acoustic metal layers. In multi-layer metal bottom de-tuned acoustic SHF or EHF wave reflector electrode 2013J, the first member of low acoustic impedance metal layer (not shown) may be arranged nearer to a piezoelectric layer (e.g., nearer to bottom piezoelectric layer 201J, e.g., nearer to stack of piezoelectric layers 254J) than second member of high acoustic impedance metal layer (not shown). This arrangement may facilitate suppressing parasitic lateral resonances in operation of the BAW resonator.

In FIG. 2D, an additional intervening high acoustic impedance layer may be present in multi-layer metal bottom de-tuned acoustic SHF or EHF wave reflector electrode 2013J but is not shown. This additional intervening high acoustic impedance layer may be very thin (e.g. thickness about one tenth or less of an acoustic wavelength of the main resonant frequency of the BAW resonator 2001J). However, in alternative examples, intervening high acoustic impedance layer may be otherwise embodied, e.g., in a very thin additional intervening multi-layer structure (not shown) in which an aggregate thickness of the entire additional intervening multi-layer structure is about one tenth or less of an acoustic wavelength of the main resonant frequency of the BAW resonator 2001J, e.g., various different materials comprising additional intervening multi-layer structure (not shown) in which an aggregate thickness of the entire additional intervening multi-layer structure is about one tenth or less of an acoustic wavelength of the main resonant frequency of the BAW resonator 2001J. As mentioned previously, in bottom de-tuned reflector electrodes 2013J, the first member having the relatively lower acoustic impedance of the first pair may be arranged substantially nearest, e.g. may substantially abut, the first piezoelectric layer (e.g. top piezoelectric layer of the BAW resonator, e.g., piezoelectric stack of the BAW resonator). It is theorized that because any intervening layers are so thin (e.g., in aggregate any intervening multi-layer structures are so thin), despite their presence, there is still facilitation of suppressing parasitic lateral resonances in operation of the BAW resonator.

As discussed, interposer layers shown in FIG. 1A, and as explicitly shown in the simplified diagrams of the various resonators shown in FIGS. 2A, 2B, 2C and 2D may be included and interposed between adjacent piezoelectric layers in the various resonators. Such interposer layers may laterally extend within the mesa structure of the stack of piezoelectric layers a full lateral extent of the stack, e.g., between the etched edge region of the stack and the opposing etched edge region of the stack. However, in some other alternative bulk acoustic wave resonator structures, interposer layers may be patterned during fabrication of the interposer layers (e.g., patterned using masking and selective etching techniques during fabrication of the interposer layers). Such patterned interposer layers need not extend a full lateral extent of the stack (e.g., need not laterally extend to any etched edge regions of the stack.) For example, FIG. 2E shows another alternative bulk acoustic wave resonator structure 2001K, similar to bulk acoustic wave resonator structure 2001J shown in FIG. 2D, but with differences. For example, in the alternative bulk acoustic wave resonator structure 2001K shown in FIG. 2E, patterned interposer layers (e.g., first patterned interposer layer 261K) may be interposed between sequential pairs of opposing axis piezoelectric layers (e.g., first patterned interposer layer 261K may be interposed between a first pair of opposing axis piezoelectric layers 201K, 202K, and a second pair of opposing axis piezoelectric layers 203K, 204K).

FIG. 2E shows an eighteen piezoelectric layer alternating axis stack arrangement having an active region of the bulk acoustic wave resonator structure 2001K sandwiched between overlap of SHF or EHF detuned harmonically tuned top sensor electrode 2015K and multi-layer metal acoustic SHF or EHF wave reflector bottom electrode 2013K. In FIG. 2E, patterned interposer layers (e.g., first patterned interposer layer 261K) may be patterned to have extent limited to the active region of the bulk acoustic wave resonator structure 2001K sandwiched between overlap of SHF or EHF detuned harmonically tuned top sensor electrode 2015K and multi-layer metal acoustic SHF or EHF wave reflector bottom electrode 2013K. A planarization layer 265K at a limited extent of multi-layer metal acoustic SHF or EHF wave reflector bottom electrode 2013K may facilitate fabrication of the eighteen piezoelectric layer alternating axis stack arrangement (e.g., stack of eighteen piezoelectric layers 201K through 218K).

Patterning of interposer layers may be done in various combinations. For example, some interposer layers need not be patterned (e.g., may be unpatterned) within lateral extent of the stack of piezoelectric layers (e.g., some interposer layers may extend to full lateral extent of the stack of piezoelectric layers). For example, first interposer layer 261J shown in FIG. 2D need not be patterned (e.g., may be unpatterned) within lateral extent of the stack of piezoelectric layers (e.g., first interposer layer 261J may extend to full lateral extent of the stack of piezoelectric layers). For example, in FIG. 2D interposer layers interposed between adjacent sequential pairs of normal axis and reverse axis piezoelectric layers need not be patterned (e.g., may be unpatterned) within lateral extent of the stack of piezoelectric layers (e.g., interposer layers interposed between sequential pairs of normal axis and reverse axis piezoelectric layers may extend to full lateral extent of the stack of piezoelectric layers). For example in FIG. 2D, first interposer layer 261J interposed between first sequential pair of normal axis and reverse axis piezoelectric layers 201J, 202J and adjacent second sequential pair of normal axis and reverse axis piezoelectric layers 203J, 204J need not be patterned within lateral extent of the stack of piezoelectric layers (e.g., first interposer layer 261J may extend to full lateral extent of the stack of piezoelectric layers). In contrast to these unpatterned interposer layers (e.g., in contrast to unpatterned interposer layer 261J) as shown in FIG. 2D, in FIG. 2E patterned interposer layers (e.g., first patterned interposer layer 261K) may be patterned, for example, to have extent limited to the active region of the bulk acoustic wave resonator structure 2001K shown in FIG. 2E. FIG. 2E shows sensing region 216J acoustically coupled with SHF or EHF detuned harmonically tuned top sensor electrode 2015K.

Figure 3A:
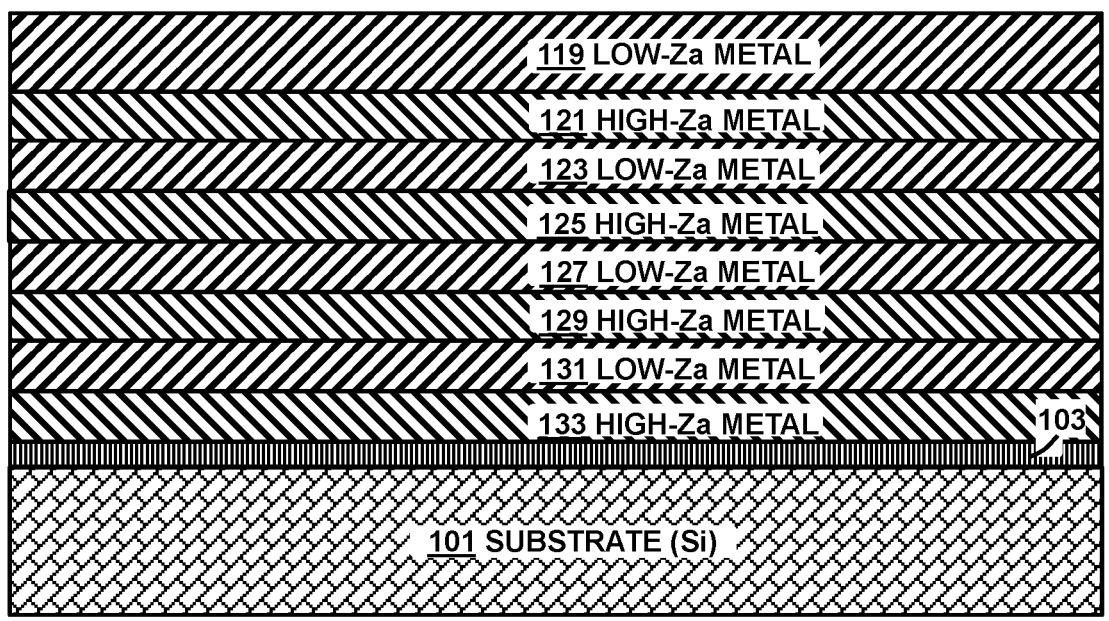
FIGS. 3A through 3C illustrate example integrated circuit structures used to form the example bulk acoustic wave resonator structure of FIG. 1A. Note that although AlN is used as an example piezoelectric layer material, the present disclosure is not intended to be so limited. For example, in some embodiments, the piezoelectric layer material may include other group III material-nitride (III-N) compounds (e.g., any combination of one or more of gallium, indium, and aluminum with nitrogen), and further, any of the foregoing may include doping, for example, of Scandium, Magnesium, Hafnium, Magnesium-Zirconium and/or Magnesium-Niobium doping.
Figure 3B:
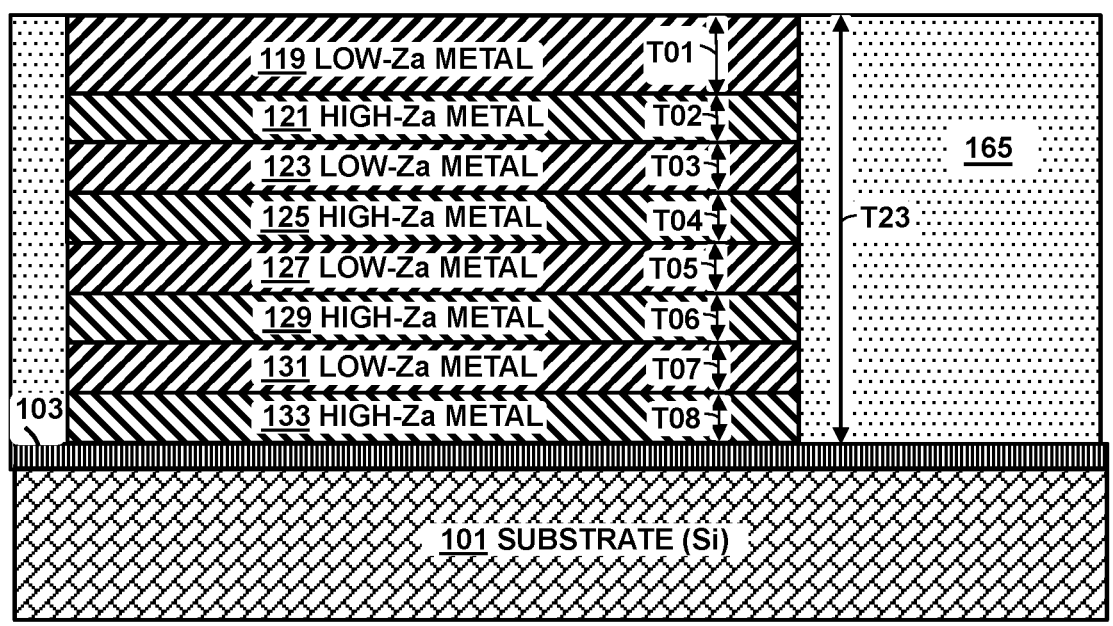
Figure 3C:
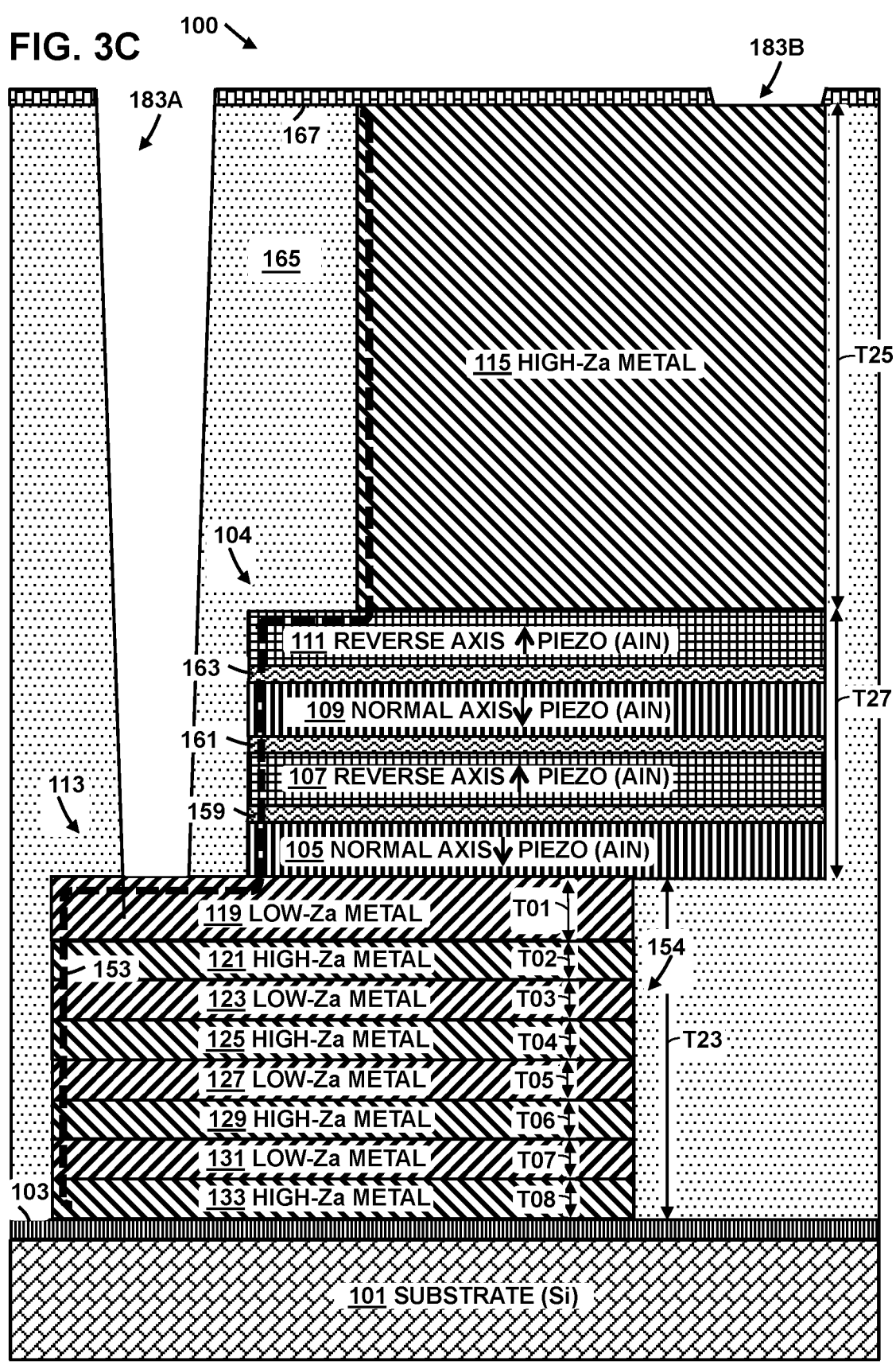

FIGS. 3A through 3C illustrate example integrated circuit structures used to form the example bulk acoustic wave resonator structure of FIG. 1A. As shown in FIG. 3A, magnetron sputtering may sequentially deposit layers on silicon substrate 101. Initially, a seed layer 103 of suitable material (e.g., aluminum nitride (AlN), e.g., silicon dioxide ($SiO_2$), e.g., aluminum oxide ($Al_2O_3$), e.g., silicon nitride ($Si_3N_4$, e.g., amorphous silicon (a-Si), e.g., silicon carbide (SiC)) may be deposited, for example, by sputtering from a respective target (e.g., from an aluminum, silicon, or silicon carbide target). The seed layer may have a layer thickness in a range from approximately one hundred Angstroms (100 A) to approximately one micron (1 um). In some examples, the seed layer 103 may also be at least partially formed of electrical conductivity enhancing material such as Aluminum (Al) or Gold (Au). Next, successive pairs of alternating layers of high acoustic impedance metal and low acoustic impedance metal may be deposited by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the fourth pair of bottom metal electrode layers, 133, 131, may be deposited by sputtering the high acoustic impedance metal for a first bottom metal electrode layer 133 of the pair on the seed layer 103, and then sputtering the low acoustic impedance metal for a second bottom metal electrode layer 131 of the pair on the first layer 133 of the pair. Similarly, the third pair of bottom metal electrode layers, 129, 127, may then be deposited by sequentially sputtering from the high acoustic impedance metal target and the low acoustic impedance metal target. Similarly, the second pair of bottom metal electrodes 125, 123, may then be deposited by sequentially sputtering from the high acoustic impedance metal target and the low acoustic impedance metal target. Similarly, the first pair of bottom metal electrodes 121, 119, may then be deposited by sequentially sputtering from the high acoustic impedance metal target and the low acoustic impedance metal target. Respective layer thicknesses of bottom metal electrode layers of the second, third and fourth pairs 119, 121, 123, 125, 127, 129, 131, 133 may correspond to approximately a quarter wavelength (e.g., a quarter of an acoustic wavelength) of the resonant frequency at the resonator (e.g., respective layer thickness of about six hundred Angstroms (660 A) for the example 24 GHz resonator.) However, in the figures, the first member 119 of the first pair of bottom metal electrode layers for the bottom acoustic reflector is depicted as relatively thicker (e.g., thickness of the first member 119 of the first pair of bottom metal electrode layers is depicted as relatively thicker) than thickness of remainder bottom acoustic layers. For example, a thickness of the first member 119 of the first pair of bottom metal electrode layers may be about 60 Angstroms greater, e.g., substantially greater, than an odd multiple (e.g., 1×, 3×, etc.) of a quarter of a wavelength (e.g., 60 Angstroms greater than one quarter of the acoustic wavelength) for the first member 119 of the first pair of bottom metal electrode layers. For example, if Titanium is used as the low acoustic impedance metal for a 24 GHz resonator (e.g., resonator having a main resonant frequency of about 24 GHz), a thickness for the first member 119 of the first pair of bottom metal electrode layers of the bottom acoustic may be about 690 Angstroms, while respective layer thicknesses shown in the figures for corresponding members of the other pairs of bottom metal electrode layers may be substantially thinner.

Next, as shown in FIG. 3B, the bottom electrode layers may be patterned (e.g., by photolithographic masking and etching) and planarized, for example using the planarization material 165. A suitable planarization material (e.g., Silicon Dioxide ($SiO_2$), Hafnium Dioxide (HfO2), Polyimide, or BenzoCyclobutene (BCB)). These materials may be deposited by suitable methods, for example, chemical vapor deposition, standard or reactive magnetron sputtering (e.g., in cases of $SiO_2$ or HfO2) or spin coating (e.g., in cases of Polyimide or BenzoCyclobutene (BCB)).

FIG. 3C shows that a stack of four layers of piezoelectric material, for example, four layers of Aluminum Nitride (AlN) having the wurtzite structure deposited by sputtering. For example, bottom piezoelectric layer 105, first middle piezoelectric layer 107, second middle piezoelectric layer 109, and top piezoelectric layer 111 may be deposited by sputtering. The four layers of piezoelectric material in the stack 104, may have the alternating axis arrangement in the respective stack 104. For example the bottom piezoelectric layer 105 may be sputter deposited to have the normal axis orientation, which is depicted in FIG. 3C using the downward directed arrow. The first middle piezoelectric layer 107 may be sputter deposited to have the reverse axis orientation, which is depicted in the FIG. 3C using the upward directed arrow. The second middle piezoelectric layer 109 may have the normal axis orientation, which is depicted in the FIG. 3C using the downward directed arrow. The top piezoelectric layer may have the reverse axis orientation, which is depicted in the FIG. 3C using the upward directed arrow. As mentioned previously herein, polycrystalline thin film AlN may be grown in the crystallographic c-axis negative polarization, or normal axis orientation perpendicular relative to the substrate surface using reactive magnetron sputtering of the Aluminum target in the nitrogen atmosphere. As was discussed in greater detail previously herein, changing sputtering conditions, for example by adding oxygen, may reverse the axis to a crystallographic c-axis positive polarization, or reverse axis, orientation perpendicular relative to the substrate surface.

Interposer layers may be sputtered between sputtering of piezoelectric layers, so as to be sandwiched between piezoelectric layers of the stack. For example, first interposer layer 159, may sputtered between sputtering of bottom piezoelectric layer 105, and the first middle piezoelectric layer 107, so as to be sandwiched between the bottom piezoelectric layer 105, and the first middle piezoelectric layer 107. For example, second interposer layer 161 may be sputtered between sputtering first middle piezoelectric layer 107 and the second middle piezoelectric layer 109 so as to be sandwiched between the first middle piezoelectric layer 107, and the second middle piezoelectric layer 109. For example, third interposer layer 163, may be sputtered between sputtering of second middle piezoelectric layer 109 and the top piezoelectric layer 111 so as to be sandwiched between the second middle piezoelectric layer 109 and the top piezoelectric layer 111.

As discussed previously, one or more of the interposer layers (e.g., interposer layers 159, 161, 163) may be metal interposer layers, e.g., high acoustic impedance metal interposer layers, e.g., Molybdenum metal interposer layers. These may be deposited by sputtering from a metal target. As discussed previously, one or more of the interposer layers (e.g., interposer layers 159, 161, 163) may be dielectric interposer layers, e.g., silicon dioxide interposer layers. These may be deposited by reactive sputtering from a Silicon target in an oxygen atmosphere. Alternatively or additionally, one or more (e.g., one or a plurality of) interposer layers may be formed of different metal layers. For example, high acoustic impedance metal layer such as Tungsten (W), Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited piezoelectric layer. Alternatively or additionally, one or more (e.g., one or a plurality of) interposer layers may be formed of different dielectric layers.

For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide ($SiO_2$) may (but need not) facilitate compensating for temperature dependent frequency shifts. Alternatively or additionally, one or more (e.g., one or a plurality of) interposer layers may comprise metal and dielectric for respective interposer layers. For example, high acoustic impedance metal layer such as Tungsten (W), Molybdenum (Mo) may (but need not) raise effective electromechanical coupling coefficient (Kt2). Subsequently deposited amorphous dielectric layer such as Silicon Dioxide ($SiO_2$) may (but need not) facilitate compensating for temperature dependent frequency shifts. Sputtering thickness of interposer layers may be as discussed previously herein. Interposer layers may facilitate sputter deposition of piezoelectric layers. For example, initial sputter deposition of second interposer layer 166 on reverse axis first middle piezoelectric layer 107 may facilitate subsequent sputter deposition of normal axis piezoelectric layer 109.

Similar to the previous discussion of patterning, etching and planarization in forming the bottom electrode layers of multilayer metal acoustic reflector electrode 113, the stack 104 of four piezoelectric layers 105, 107, 109, 111 and their interposers may be patterned (e.g., by photolithographic masking and etching) and planarized.

The harmonically tuned top sensor electrode 115 may be deposited by sputtering the high acoustic impedance metal onto the stack 104 of four piezoelectric layers 105, 107, 109, 111. Thickness of the harmonically tuned top electrode 115 may be approximately an integral multiple of a half of an acoustic wavelength (e.g., one wavelength) of the resonant frequency of the BAW resonator coupled with the sensing region. The harmonically tuned top sensor electrode 115 may be patterned (e.g., by photolithographic masking and etching) and planarized. In aggregate, the etching of harmonically tuned top sensor electrode 115, the etching of the stack 104 of four piezoelectric layers 105, 107, 109, 111, and the etching of multilayer metal acoustic reflector electrode 113 for etched edge region 153 extending there through as shown in FIG. 3C. A notional heavy dashed line is used in FIG. 3C depicting the etched edge region 153 associated with the harmonically tuned top sensor electrode 115. A first portion of etched edge region 153 may extend along the thickness dimension T25 of the harmonically tuned top sensor electrode 115. The mesa structure (e.g., third mesa structure) corresponding to the harmonically tuned top sensor electrode 115 may extend laterally between (e.g., may be formed between) etched edge region 153 and laterally opposing etched edge region 154. Dry etching may be used, e.g., reactive ion etching may be used to etch the materials of the harmonically tuned top sensor electrode 115. Chlorine based reactive ion etch may be used to etch Aluminum, in cases where Aluminum is used in the harmonically tuned top sensor electrode 115. Fluorine based reactive ion etch may be used to etch Tungsten (W), Molybdenum (Mo), Titanium (Ti), Silicon Nitride (SiN), Silicon Dioxide ($SiO_2$) and/or Silicon Carbide (SiC) in cases where these materials are used in the harmonically tuned top sensor electrode 115.

An isolation layer 167 may also be included and arranged over the planarization layer 165. For the acoustic resonator based sensor of this disclosure, a suitable dielectric material may be used for the isolation layer 167, for example Silicon Nitride, Silicon Dioxide, or Aluminum Nitride. Thickness of isolation layer 167 may be controlled, for example, to be very thin, for example, within a range from approximately fifty Angstroms to approximately three hundred Angstroms (approximately 50 A to approximately 300 A) for resonators designed to operate at approximately 24 GHz. After planarization layer 165 (e.g., in one or more steps) and the isolation layer 167 have been deposited, additional procedures of photolithographic masking, layer etching, and mask removal may be done to form a pair of etched acceptance locations 183A, 183B for electrical interconnections. Reactive ion etching or inductively coupled plasma etching with a gas mixture of argon, oxygen and a fluorine containing gas such as tetrafluoromethane (CF4) or Sulfur hexafluoride (SF6) may be used to etch through the isolation layer 167 and the planarization layer 165 to form the pair of etched acceptance locations 183A, 183B for electrical interconnections. Photolithographic masking, sputter deposition, and mask removal may then be used form electrical interconnects in the pair of etched acceptance locations 183A, 183B shown in FIG. 3C, so as to provide for the bottom electrical interconnect 169 and top electrical interconnect 171 that are shown explicitly in FIG. 1A. A suitable material, for example Gold (Au) or copper (CU) may be used for the bottom electrical interconnect 169 and top electrical interconnect 171.

FIGS. 4A through 4C show alternative example bulk acoustic wave resonators 400A through 400C to the example bulk acoustic wave resonator 100A shown in FIG. 1A. For example, the bulk acoustic wave resonator 400A shown in FIG. 4A may have a cavity 483A e.g., an air cavity 483A e.g., extending into substrate 401A e.g., extending into silicon substrate 401A e.g., arranged below multilayer metal acoustic reflector electrode 413A. The cavity 483A may be formed using techniques known to those with ordinary skill in the art. For example, the cavity 483A may be formed by initial photolithographic masking and etching of the substrate 401A (e.g., silicon substrate 401A), and deposition of a sacrificial material (e.g., phosphosilicate glass (PSG)). The phosphosilicate glass (PSG) may comprise 8% phosphorous and 92% silicon dioxide. The resonator 400A may be formed over the sacrificial material (e.g., phosphosilicate glass (PSG)). The sacrificial material may then be selectively etched away beneath the resonator 400A, leaving cavity 483A, beneath the resonator 400A. For example phosphosilicate glass (PSG) sacrificial material may be selectively etched away by hydrofluoric acid beneath the resonator 400A leaving cavity 483A beneath the resonator 400A. The cavity 483A may, but need not, be arranged to provide acoustic isolation of the structures, e.g., multilayer metal acoustic reflector electrode 413A, e.g., stack 404A of piezoelectric layers, e.g., resonator 400A, from the substrate 401A.

Similarly, in FIGS. 4B, 4C, a via 485B, 485C (e.g., through silicon via 485B, e.g., through silicon carbide via 485C) may, but need not, be arranged to provide acoustic isolation of the structures, e.g., multilayer metal acoustic reflector electrode 413B, 413C e.g., stack 404B, 404C, of piezoelectric layers, e.g., resonator 400B, 400C from the substrate 401B, 401C. The via 485B, 485C, (e.g., through silicon via 485B, e.g., through silicon carbide via 485C) may be formed using techniques (e.g., using photolithographic masking and etching techniques) known to those with ordinary skill in the art. For example, in FIG. 4B, backside photolithographic masking and etching techniques may be used to form the through silicon via 485B, and an additional passivation layer 487B may be deposited, after the resonator 400B is formed. For example, in FIG. 4C, backside photolithographic masking and etching techniques may be used to form the through silicon carbide via 485C, after the harmonically tuned top sensor electrode 415 C, and stack 404C, of piezoelectric layers are formed. In FIG. 4C, after the through silicon carbide via 485C is formed, backside photolithographic masking and deposition techniques may be used to form multilayer metal acoustic reflector electrode 413C, and additional passivation layer 487C.

In FIGS. 4A, 4B, 4C, multilayer metal acoustic reflector electrode 413A, 413B, 413C, may include the acoustically reflective bottom electrode stack of the plurality of bottom metal electrode layers, in which thicknesses of the bottom metal electrode layers may be related to wavelength (e.g., acoustic wavelength) at the main resonant frequency of the example resonator 400A, 400B, 400C. Respective layer thicknesses, (e.g., T02 through T04, explicitly shown in FIGS. 4A, 4B, 4C) for members of the pairs of bottom metal electrode layers may be about one quarter of the wavelength (e.g., one quarter acoustic wavelength) at the main resonant frequency of the example resonators 400A, 400B, 400C. Relatively speaking, in various alternative designs of the example resonators 400A, 400B, 400C, for relatively lower main resonant frequencies (e.g., five Gigahertz (5 GHz)) and having corresponding relatively longer wavelengths (e.g., longer acoustic wavelengths), may have relatively thicker bottom metal electrode layers in comparison to other alternative designs of the example resonators 400A, 400B, 400C, for relatively higher main resonant frequencies (e.g., twenty-four Gigahertz (24 GHz)). There may be corresponding longer etching times to form, e.g., etch through, the relatively thicker bottom metal electrode layers in designs of the example resonator 400A, 400B, 400C, for relatively lower main resonant frequencies (e.g., five Gigahertz (5 GHz)). Accordingly, in designs of the example resonators 400A, 400B, 400C, for relatively lower main resonant frequencies (e.g., five Gigahertz (5 GHz)) having the relatively thicker bottom metal electrode layers, there may be (but need not) be an advantage in etching time in having a relatively fewer number (e.g., four (4)) of bottom metal electrode layers, shown in 4A, 4B, 4C, in comparison to a relatively larger number (e.g., eight (8)) of bottom metal electrode layers, shown in FIG. 1A. The relatively larger number (e.g., eight (8)) of bottom metal electrode layers, shown in FIG. 1A may (but need not) provide for relatively greater acoustic isolation than the relatively fewer number (e.g., four (4)) of bottom metal electrode layers. However, in FIGS. 4A and 4E the cavity 483A, 483E, (e.g., air cavity 483A, 483E) may (but need not) be arranged to provide acoustic isolation enhancement relative to some designs without the cavity 483A. Similarly, in FIGS. 4B, 4C, the via 483B, 483C, (e.g., through silicon via 485B, e.g., through silicon carbide via 485C) may (but need not) be arranged to provide acoustic isolation enhancement relative to some designs without the via 483B, 483C.

In FIG. 4A, the cavity 483A may (but need not) be arranged to compensate for relatively lesser acoustic isolation of the relatively fewer number (e.g., four (4)) of bottom metal electrode layers. In FIG. 4A, the cavity 483A may (but need not) be arranged to provide acoustic isolation benefits, while retaining possible electrical conductivity improvements and etching time benefits of the relatively fewer number (e.g., four (4)) of bottom metal electrode layers, e.g., particularly in designs of the example resonator 400A for relatively lower main resonant frequencies (e.g., five Gigahertz (5 GHz)). Similarly, in FIGS. 4B, 4C, the via 483B, 483C, may (but need not) be arranged to compensate for relatively lesser acoustic isolation of the relatively fewer number (e.g., four (4)) of bottom metal electrode layers. In FIGS. 4B, 4C, the via 483B, 483C, may (but need not) be arranged to provide acoustic isolation benefits, while retaining possible electrical conductivity improvement benefits and etching time benefits of the relatively fewer number (e.g., four (4)) of bottom metal electrode layers, e.g., particularly in designs of the example resonator 400B, 400C, for relatively lower main resonant frequencies (e.g., five Gigahertz (5 GHz), e.g., below six Gigahertz (6 GHz), e.g., below five Gigahertz (5 GHz)).

Although in various example resonators, 100A, 400A, 400B, polycrystalline piezoelectric layers (e.g., polycrystalline Aluminum Nitride (AlN)) may be deposited (e.g., by sputtering), in another example resonator 400C, alternative single crystal or near single crystal piezoelectric layers (e.g., single/near single crystal Aluminum Nitride (AlN)) may be deposited (e.g., by metal organic chemical vapor deposition (MOCVD)). Normal axis piezoelectric layers (e.g., normal axis Aluminum Nitride (AlN) piezoelectric layers) may be deposited by MOCVD using techniques known to those with skill in the art. As discussed previously herein, the interposer layers may be deposited by sputtering, but alternatively may be deposited by MOCVD. Reverse axis piezoelectric layers (e.g., reverse axis Aluminum Nitride (AlN) piezoelectric layers) may likewise be deposited via MOCVD. For the example resonators 400C shown in FIG. 4C, the alternating axis piezoelectric stack 404C comprised of piezoelectric layers 405C, 407C, 409C, 411C, as well as interposer layers 459C, 461C, 463C, extending along stack thickness dimension T27 fabricated using MOCVD on a silicon carbide substrate 401C. For example, aluminum nitride of piezoelectric layers 405C, 407C, 409C, 411C, may grow nearly epitaxially on silicon carbide (e.g., 4H SiC) by virtue of the small lattice mismatch between the polar axis aluminum nitride wurtzite structure and specific crystal orientations of silicon carbide. Alternative small lattice mismatch substrates may be used (e.g., sapphire, e.g., aluminum oxide). By varying the ratio of the aluminum and nitrogen in the deposition precursors, an aluminum nitride film may be produced with the desired polarity (e.g., normal axis, e.g., reverse axis). For example, normal axis aluminum nitride may be synthesized using MOCVD when a nitrogen to aluminum ratio in precursor gases approximately 1000. For example, reverse axis aluminum nitride may synthesized when the nitrogen to aluminum ratio is approximately 27000. In accordance with the foregoing, FIG. 4C shows MOCVD synthesized normal axis piezoelectric layer 405C, MOCVD synthesized reverse axis piezoelectric layer 407C, MOCVD synthesized normal axis piezoelectric layer 409C, and MOCVD synthesized reverse axis piezoelectric layer 411C. For example, normal axis piezoelectric layer 405C may be synthesized by MOCVD in a deposition environment where the nitrogen to aluminum gas ratio is relatively low, e.g., 1000 or less. Next an oxyaluminum nitride layer, 459C at lower temperature, may be deposited by MOCVD that may reverse axis (e.g., reverse axis polarity) of the growing aluminum nitride under MOCVD growth conditions, and has also been shown to be able to be deposited by itself under MOCVD growth conditions. Increasing the nitrogen to aluminum ratio into the several thousands during the MOCVD synthesis may enable the reverse axis piezoelectric layer 407C to be synthesized. Interposer layer 461C may be an oxide layer such as, but not limited to, aluminum oxide or silicon dioxide. This oxide layer may be deposited in a low temperature physical vapor deposition process such as sputtering or in a higher temperature chemical vapor deposition process. Normal axis piezoelectric layer 409C may be grown by MOCVD on top of interposer layer 461C using growth conditions similar to the normal axis layer 405C as discussed previously, namely MOCVD in a deposition environment where the nitrogen to aluminum gas ratio is relatively low, e.g., 1000 or less. Next an aluminum oxynitride, interposer layer 463C may be deposited in a low temperature MOCVD process followed by a reverse axis piezoelectric layer 411C synthesized in a high temperature MOCVD process and an atmosphere of nitrogen to aluminum ratio in the several thousand range. Upon conclusion of these depositions, the piezoelectric stack 404C shown in FIG. 4C may be realized.

Figure 5:
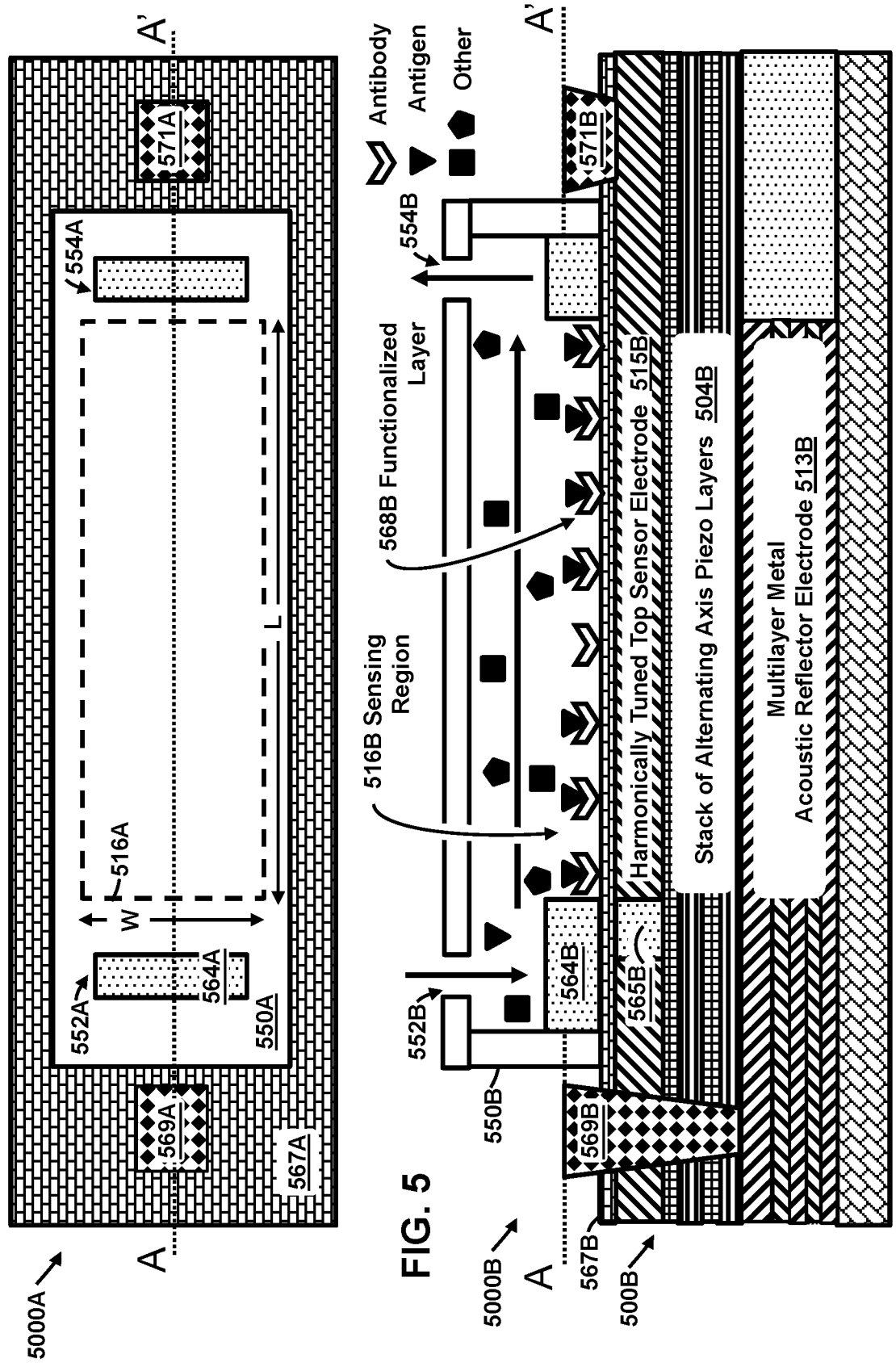
FIG. 5 shows a simplified top view of an example fluidic system of this disclosure, along with a simplified cross sectional view of the fluidic system showing operation of an example bulk acoustic wave resonator structure and sensing region of this disclosure.

FIG. 5 shows a simplified top plan view of an example fluidic system 5000A of this disclosure, along with a simplified cross sectional view of the fluidic system 5000B showing operation of an example bulk acoustic wave resonator structure 500B and sensing region 516A, 516B of this disclosure. Top plan view of fluidic system 5000A shows resonator electrical interconnects 569A, 569B extending through isolation layer 567A. Fluid containment member 550A (e.g., microfluidic containment 550A) provides for fluid circulation there through, for example, by including fluid entrance aperture 552A (e.g., microfluidic entrance aperture 552A) to provide for fluid entering an inner fluid lumen of fluid containment member 550A, and by including fluid exit aperture 554A (e.g., microfluidic exit aperture 554A) to provide for fluid exiting the inner fluid lumen of fluid containment member 550A. Top plan view of fluidic system 5000A shows lateral support features 564A as visible through fluid entrance aperture 552A and fluid exit aperture 554A. Top plan view of fluidic system 5000A shows a dashed line rectangle representatively illustrating sensing region 516A associated with the bulk acoustic wave resonator structure disposed proximate a surface of the inner fluid lumen of fluid containment member 550A.

Sensing region 516A may have a sensing area within a range from approximately sixteen hundred square microns to approximately twenty five thousand six hundred square microns. Sensing region 516A may have a sensing area of approximately sixty four hundred square microns. Sensing region 516A may have a width dimension W of approximately forty (40) microns wide. Sensing region 516A may have a length dimension L of approximately one hundred sixty (160) microns long. These width and length dimensions of sensing region 516A may accommodate a microfluidic channel of the inner fluid lumen of fluid containment member 550A. Dimensions of the bulk acoustic wave resonator associated with sensing region 516A may be sized to approximately accommodate the dimensions of sensing region 516A.

FIG. 5 shows simplified cross sectional view of the fluidic system 5000B showing operation of the example bulk acoustic wave resonator structure 500B and sensing region 516B. Cross sectional view of fluidic system 5000B shows resonator electrical interconnects 569B, 569B extending through isolation layer 567B. Fluid containment member 550B (e.g., microfluidic containment 550B) may provide for fluid circulation there through, for example, by including fluid entrance aperture 552B (e.g., microfluidic entrance aperture 552B) to provide for fluid entering the inner fluid lumen of fluid containment member 550B, and by including fluid exit aperture 554B (e.g., microfluidic exit aperture 554B) to provide for fluid exiting the inner fluid lumen of fluid containment member 550B. Fluid circulation through fluid containment member 550B is depicted using a downward pointing dark arrow at fluid entrance aperture 552B, a horizontal dark arrow extending laterally through the inner fluid lumen (e.g., microfluidic channel) of fluid containment member 550B, and an upward pointing dark arrow at fluid exit aperture 554B. Target analytes, depicted using solid black triangles may be suspended in the fluid flow (e.g. liquid flow, e.g., liquid flow comprising water), along with other particles (e.g., un-targeted particle) depicted. Functionalized layer 568B may comprise antibodies targeted for binding with the target analytes (e.g., target antigens) suspended in the circulation of the fluid flow through the inner lumen (e.g., microfluidic channel) of fluid containment member 550B. Surface features of the antibodies conform to complementary surface features of target analytes (e.g., target antigens) to facilitate selectivity in binding of the antibodies with target analytes (e.g., target antigens). This is representatively illustrated in the cross sectional view of fluidic system 5000B by the surface features of antibodies being depicted with angled surface features, and by the target analytes (e.g., target antigens) being depicted with complementary, e.g, triangular, surface features. For example, the antibodies depicted in FIG. 5 may be coronavirus antibodies, the target antigens may be coronavirus, and the fluid flow may be liquid derived from a blood sample from an infected patient.

Cross sectional view of fluidic system 5000B shows lateral support features 564B. The cross sectional view of fluidic system 5000B shows sensing region 516B associated with the bulk acoustic wave resonator structure 500B disposed proximate a surface of the inner fluid lumen of fluid containment 550B. Details of the bulk acoustic wave resonator structure 500B have already been discussed in detail with reference similar bulk acoustic wave resonator 100 shown in FIG. 1A. Accordingly, the bulk acoustic wave resonator structure 500B is only briefly discussed here. As shown in FIG. 5, bulk acoustic wave resonator structure 500B may comprise a stack of alternating axis piezoelectric layers 504B sandwiched between multilayer metal acoustic reflector electrode 513B and harmonically tuned top sensor electrode 515B.

Top sensor electrode 515B may be a harmonically tuned top sensor electrode 515B, e.g., may have a thickness of approximately an integral multiple of a half acoustic wavelength of the main resonant frequency of BAW resonator 500B, e.g., e.g., may have a thickness of approximately $N*\lambda/2$ where N is an integer. For example, harmonically tuned top sensor electrode 515B may have a thickness of approximately a half acoustic wavelength of the main resonant frequency of BAW resonator 500B. For example, harmonically tuned top sensor electrode 515B may have a thickness of approximately an acoustic wavelength of the main resonant frequency of BAW resonator 500B. Top sensor electrode 515B may be a non-harmonically tuned top sensor electrode 515B, e.g., may have a thickness that is not approximately an integral multiple of a half acoustic wavelength of the main resonant frequency of BAW resonator 500B. For example, in a case where top sensor electrode 515B may be a non-harmonically tuned top sensor electrode 515B, top sensor electrode 515B may have a thickness that is approximately a tenth (0.1) of an acoustic wavelength of the main resonant frequency of BAW resonator 500B. Top sensor electrode 515B may have thickness that may be within a range from approximately one tenth of the acoustic wavelength of the main resonant frequency of BAW resonator 500B to approximately one acoustic wavelength of the main resonant frequency of BAW resonator 500B.

Planarization material 568B may be used to electrically insulate harmonically tuned top sensor electrode 515B from bottom electrical interconnect 569B. Bottom electrical interconnect 569B may be electrically coupled with multilayer metal acoustic reflector electrode 513B. Top electrical interconnect 571B may be electrically coupled with harmonically tuned top sensor electrode 515B. The stack of alternating axis piezoelectric layers 504B may be electrically and acoustically coupled with the multilayer metal acoustic reflector electrode 513B and the harmonically tuned top sensor electrode 504B to excite the piezoelectrically excitable resonance mode (e.g., main resonance mode, e.g., thickness extensional main resonance mode) of BAW resonator 500B acoustically coupled with the sensing region 516B at the resonant frequency (e.g., main resonant frequency). For example, such excitation may be done by using the multilayer metal acoustic reflector electrode 513B and the harmonically tuned top sensor electrode 515B to apply an oscillating electric field having a frequency corresponding to the resonant frequency (e.g., main resonant frequency) of the BAW resonator 500B acoustically coupled with the sensing region 516B.

Sensing region 516A, 516B may comprise a functionalized layer to facilitate binding to an analyte. For example, the functionalized layer may comprise antibodies. The functionalized layer of sensing region 516A, 516B may comprise a self-assembled monolayer. The functionalized layer of sensing region 516A, 516B may comprise one or more binding biomolecules (e.g., antibodies) configured to bind with target biomolecules (e.g., antigens, e.g., coronavirus).

For example, antibodies of the functionalized layer acoustically coupled with bulk acoustic wave resonator 500B at the sensing region 516B may selectively bind the mass of one or more analytes (e.g., antigens, e.g., coronavirus). The mass of one or more antigens (e.g., coronavirus) binding to antibodies of the functionalized layer acoustically coupled with bulk acoustic wave resonator 500B may cause detectable resonance frequency shifts (e.g., decrease in resonance frequency) in operation of bulk acoustic wave resonators 500B in its thickness extensional main resonant mode. Electrical circuitry may be coupled with bulk acoustic wave resonator 500B to determine the resonance frequency shift. This may detect the presence of the targeted antigen (e.g., coronavirus).

Further, mass sensitivity may increase with the square of frequency. The thickness extensional main resonant mode BAW resonator 500B may operate with resonant frequencies in the Super High Frequency band (e.g., resonant frequency of 24.25 GHz, or higher bands, e.g., higher resonant frequencies), and so their mass sensitivity may be much higher than resonators operating below the Super High Frequency band. Sensitivity is discussed in greater detail subsequently herein. Sensitivity of the fluidic system 5000A, 5000B when the sensing region 516A, 516B may be exposed to fluid may be within a range from approximately one half part per million per one hundred attograms to approximately fifty parts per million per one hundred attograms, e.g., for a sensing area of approximately sixty four hundred square microns. Sensitivity of the fluidic system 5000A, 5000B when the sensing region 116 may be exposed to fluid may be within a range from one KiloHertz CentiMeter Squared per NanoGram to approximately two hundred KiloHertz CentiMeter Squared per NanoGram.

As discussed fluid containment member 550B (e.g., microfluidic containment 550B) may provide for fluid circulation there through, for example, by including fluid entrance aperture 552B (e.g., microfluidic entrance aperture 552B) to provide for fluid entering the inner fluid lumen of fluid containment member 550B, and by including fluid exit aperture 554B (e.g., microfluidic exit aperture 554B) to provide for fluid exiting the inner fluid lumen of fluid containment member 550B. The fluid flow may be liquid derived from a blood sample from an infected patient. The functionalized layer of sensing region 516A, 516B may have an affinity for a constituent of blood. For example, the functionalized layer of sensing region 516A, 516B may comprise antibodies that may have an affinity for a virus (e.g., antigen) constituent of blood from an infected patient. However, in other examples the functionalized layer of sensing region 516A, 516B may have an affinity for a biomarker (e.g., glucose, e.g., prostate specific antigen) constituent of blood from a patient managing a disease (e.g., diabetes, e.g., prostate cancer).

In another example, fluid containment member 550B may be an insertable hollow microneedle having an inner lumen bore and one or more apertures to access an interstitial fluid of a patient. The functionalized layer of sensing region 516A, 516B may have an affinity for a biomarker (e.g., glucose) constituent of interstitial fluid of a patient managing a disease (e.g., diabetes). Microneedles may be desirable because their small size and extremely sharp tip may reduce insertion pain and tissue trauma to the patient. The length of the microneedles may be kept short enough to not penetrate to the pain receptors in the inner layers of the patient's skin. For example microneedle length may be one (1) millimeter or less. The inner lumen bore of the hollow microneedle may, for example, have a cross-sectional dimension of greater than 25 microns. The inner lumen bore of the hollow microneedle may, for example, have a cross-sectional dimension of greater than 100 microns. Advantageously, BAW resonators of this disclosure operating at high frequencies (e.g., 24 GHz) may be made small, e.g., with dimensions small enough to accommodate being disposed in the inner lumen bore of the hollow microneedle having access to the interstitial fluid, e.g., the sensing region 516A, 516B of BAW resonator 500B may contact the interstitial fluid of a patient via the microneedle having access to the interstitial fluid.

Broadly speaking, a fluid need not necessarily be a liquid. Broadly speaking air or more particularly a patient's breath may be recognized as fluid. Accordingly, in another example, a patient's breath, or portions thereof may circulate through fluid containment member 550B. The functionalized layer of sensing region 516A, 516B may have an affinity for a biomarker (e.g., acetone, e.g., tetrahydrocannabinol (THC)) constituent of a person's breath, which may be associated with a person's condition (e.g., lipid oxidation, e.g., marijuana intoxication).

In other examples, air circulating through fluid containment member 550B may provide for detection of targeted analytes of interest. For example, in cases where infectious disease carriers may be airborne, tainted air may be circulated through fluid containment member 550B. The functionalized layer of sensing region 516A, 516B may have an affinity for airborne infections disease carriers. Sensing region 516A, 516B of BAW resonator 500B may detect airborne infections disease carriers. Similarly, coughs or sneezes of infected people may give rise to respiratory droplets that include infectious disease carrier constituents (e.g., coronavirus). The functionalized layer of sensing region 516A, 516B may have an affinity for infectious disease carrier constituents (e.g., coronavirus). Sensing region 516A, 516B of BAW resonator 500B may detect infectious disease carrier constituents (e.g., coronavirus).

In other examples, tainted air circulating through fluid containment member 550B may provide for detection of other targeted analytes of interest. Polluted air may include particulate matter. Sensing region 516A, 516B of BAW resonator 500B may be used to detect particulate matter. Tainted air may include a toxin (e.g., hydrocarbon gas, e.g., carbon monoxide e.g., a nerve agent). Sensing region 516A, 516B of BAW resonator 500B may detect the toxin. Tainted air may include a toxin (e.g., hydrocarbon gas, e.g., carbon monoxide e.g., a nerve agent). Sensing region 516A, 516B of BAW resonator 500B may detect the toxin. Tainted air may include volatile organic compounds (e.g., hydrocarbons, e.g., alcohols, e.g., ammonia, e.g., acetone, e.g., ketones, e.g., aldehydes, e.g., esters, e.g., heterocycles). Sensing region 516A, 516B of BAW resonator 500B may detect volatile organic compounds. Further, tainted air may be indicative of other dangers. Sensing region 516A, 516B of BAW resonator 500B may detect presence of explosives (e.g., trinitrotoluene (TNT), 1,3,5-trinitro-1,3,5-triazacyclohexane (RDX)).

In other examples, air circulating through fluid containment member 550B may provide for detection of changes in environmental variables. Sensing region 516A, 516B of BAW resonator 500B may detect changes in environment variables (e.g., changes in air temperature, e.g., changes in air pressure, e.g., changes in air humidity).

In other examples, fluid (e.g., water) circulating through fluid containment member 550B may provide for detection of changes in water quality (e.g., presence of toxins, e.g., presence of heavy metals, e.g., presence of lead). Sensing region 516A, 516B of BAW resonator 500B may detect changes in water quality (e.g., presence of toxins, e.g., presence of heavy metals, e.g., presence of lead).

Figure 6A:
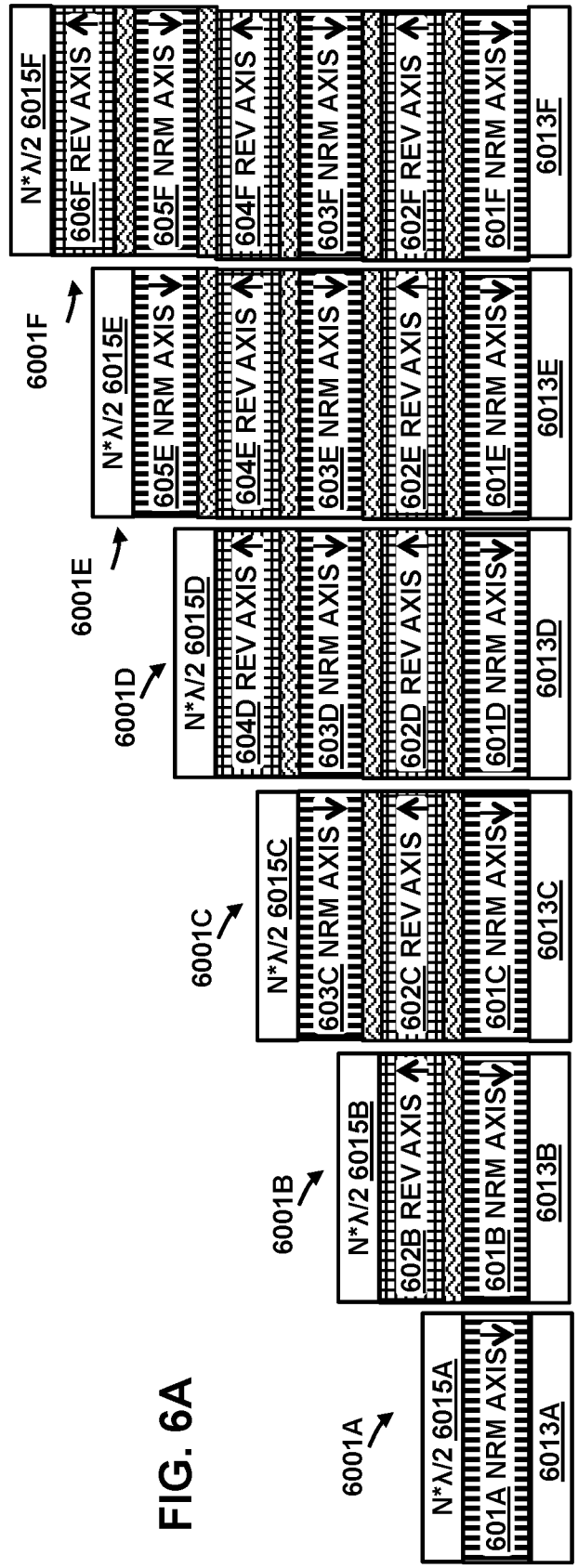
FIGS. 6A through 6C are simplified diagrams of various example resonators of this disclosure, along with respective diagrams illustrating respective corresponding properties as predicted by simulation.
Figure 6A:
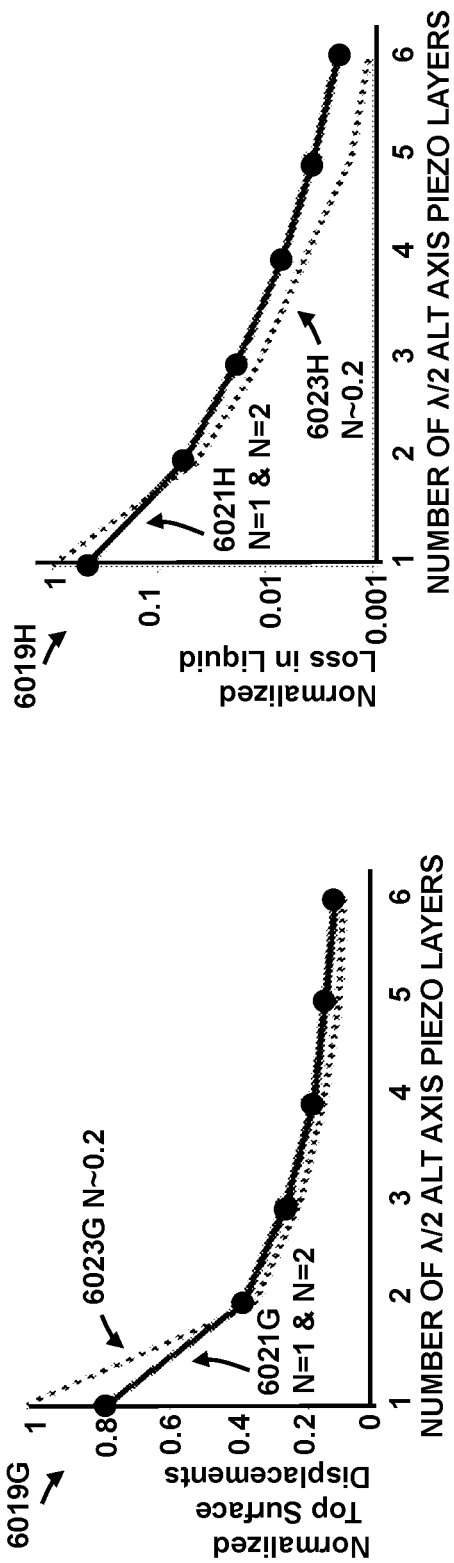
Figure 6B:
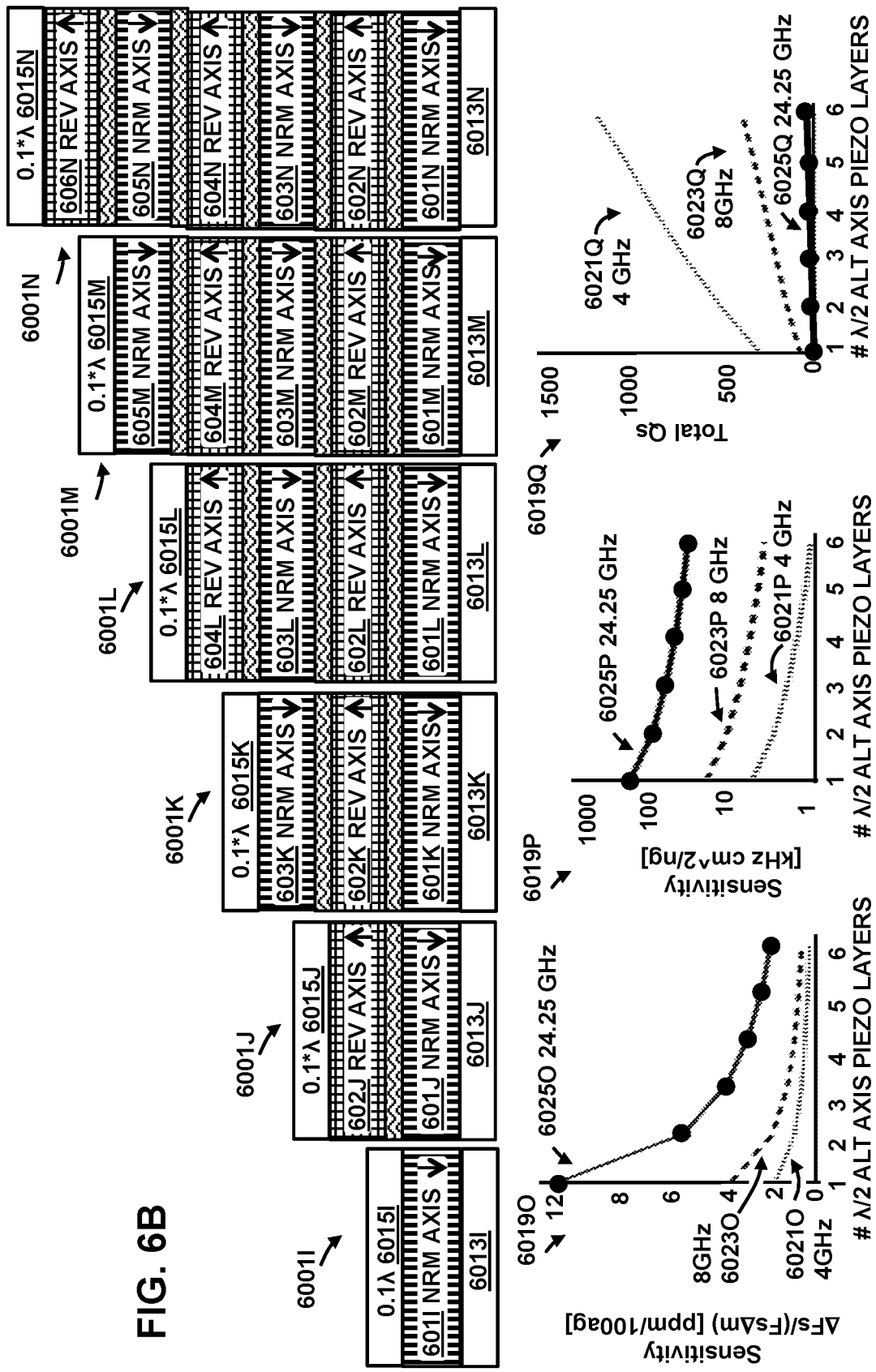
Figure 6C:
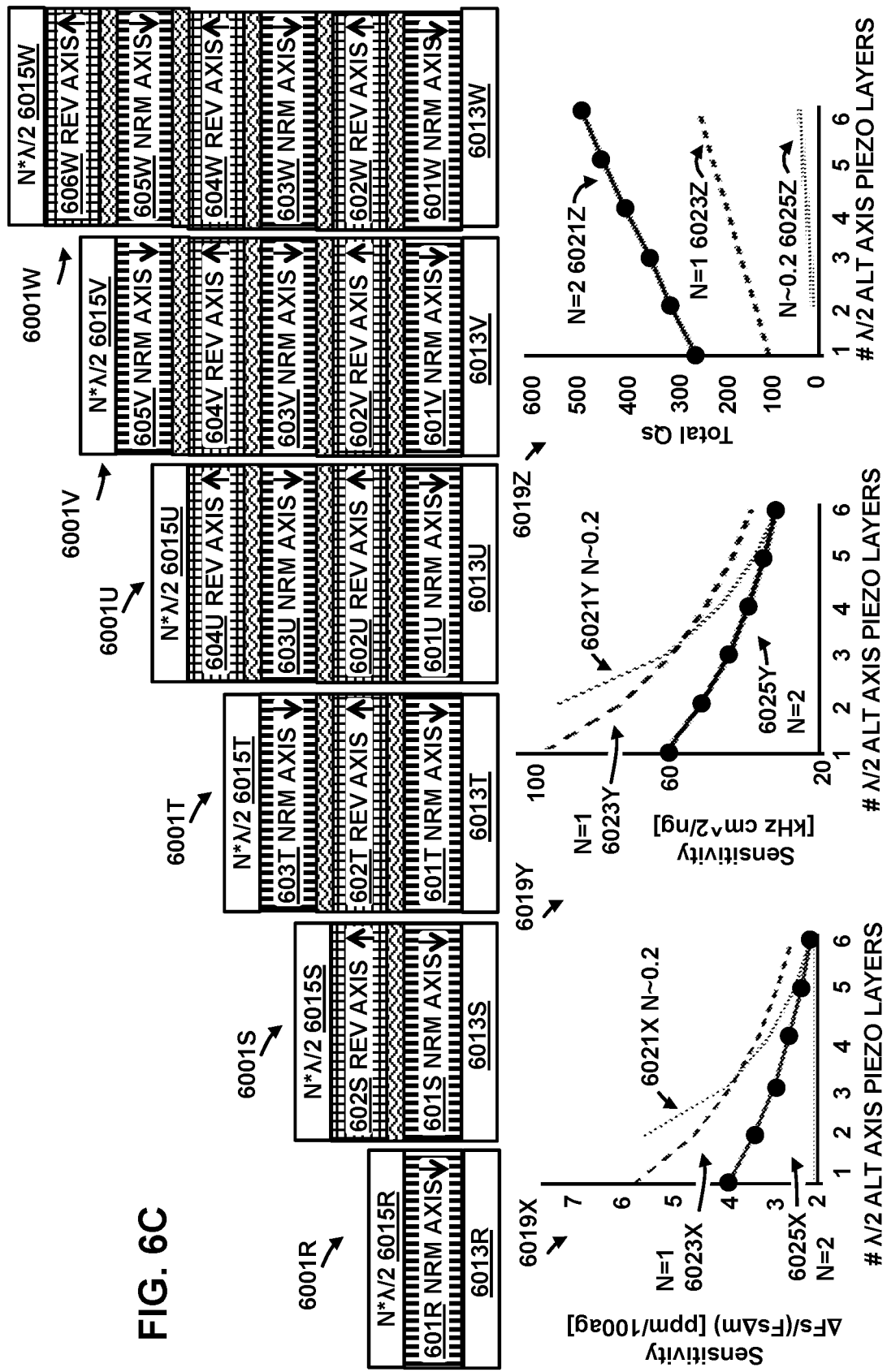

FIGS. 6A through 6C are simplified diagrams of various example resonators of this disclosure, along with respective diagrams illustrating respective corresponding properties as predicted by simulation. The respective top halves of FIGS. 6A through 6C depict respective simplified depictions of six BAW resonators: 6001A through 6001F in FIG. 6A, 6001I through 6001N in FIG. 6B, and 6001R through 6001W in FIG. 6C.

BAW resonators 6001A, 6001I, 60001R comprise respective normal axis piezoelectric layers 601A, 601I, 601R sandwiched between respective multilayer metal acoustic reflector electrodes 6013A, 6013I, 6013R and top sensor electrodes 6015A, 6015I, 6015R.

BAW resonators 6001B, 6001J, 6001S comprise respective two layer alternating arrangements of normal axis piezoelectric layers 601B, 601J, 601S and reverse axis piezoelectric layers 602B, 602J, 602S sandwiched between respective multilayer metal acoustic reflector electrodes 6013B, 6013J, 6013S and top sensor electrodes 6015B, 6015J, 6015S.

BAW resonators 6001C, 6001K, 6001T comprise respective three layer alternating arrangements of normal axis piezoelectric layers 601C, 601K, 601T, reverse axis piezoelectric layers 602C, 602K, 602T and second normal axis piezoelectric layers 603C, 603K, 603T sandwiched between respective multilayer metal acoustic reflector electrodes 6013C, 6013K, 6013T and top sensor electrodes 6015C, 6015K, 6015T.

BAW resonators 6001D, 6001L, 6001U comprise respective four layer alternating arrangements of normal axis piezoelectric layers 601D, 601L, 601U, reverse axis piezoelectric layers 602D, 602L, 602U, second normal axis piezoelectric layers 603D, 603L, 603U and second reverse axis piezoelectric layers 604D, 604L, 604U sandwiched between respective multilayer metal acoustic reflector electrodes 6013D, 6013L, 6013U and top sensor electrodes 6015D, 6015L, 6015U.

BAW resonators 6001E, 6001M, 6001V comprise respective five layer alternating arrangements of normal axis piezoelectric layers 601E, 601M, 601V, reverse axis piezoelectric layers 602E, 602M, 602V, second normal axis piezoelectric layers 603E, 603M, 603V, second reverse axis piezoelectric layers 604E, 604M, 604V, and third normal axis piezoelectric layers 605E, 605M, 605V sandwiched between respective multilayer metal acoustic reflector electrodes 6013E, 6013M, 6013V and top sensor electrodes 6015E, 6015M, 6015V.

BAW resonators 6001F, 6001N, 6001W comprise respective six layer alternating arrangements of normal axis piezoelectric layers 601F, 601N, 601W, reverse axis piezoelectric layers 602F, 602N, 602W, second normal axis piezoelectric layers 603F, 603N, 603W, second reverse axis piezoelectric layers 604F, 604N, 604W, third normal axis piezoelectric layers 605F, 605N, 605W and third reverse axis piezoelectric layers 606F, 606N, 606W sandwiched between respective multilayer metal acoustic reflector electrodes 6013F, 6013N, 6013W and top sensor electrodes 6015F, 6015N, 6015W.

As shown in FIG. 6A, for BAW resonators 6001A through 6001F, thickness of top sensor electrodes 6015A through 6015F may vary with N times a half acoustic wavelength ($\lambda/2$) of BAW resonator resonant frequency, with N being 0.2 or N being 1 or N being 2. Harmonic top sensor electrodes having thicknesses that are approximately an integral multiple (e.g., N=1, e.g., N=2) of a half acoustic wavelength ($\lambda/2$) of BAW resonator resonant frequency may differing performance characteristics relative to non-harmonic top sensor electrodes having thicknesses that are not approximately an integral multiple (e.g., N~0.2) of a half acoustic wavelength ($\lambda/2$) of BAW resonator resonant frequency. For purposes of simulation, BAW resonators 6001A through 6001F are designed to have a main resonant frequency of 24.25 GHz and have a sensing region area at the top sensor electrodes 6015A through 6015F of approximately 80×80 microns. For N being 0.2 the thicknesses of piezoelectric layers abutting the multilayer metal acoustic reflector electrodes 6013A through 6013F and top sensor electrodes 6015A through 6015F have been adjusted in such way that the main resonance frequency of resonators 6001A through 6015F is substantially the same as for N being 1 or N being 2.

A lower left diagram 6019G in FIG. 6A shows a normalized (e.g., ratioed) top surface displacement of top sensor electrodes 6015A through 6015F of BAW resonators 6001A through 6001F versus number of half acoustic wavelength ($\lambda/2$) alternating axis piezoelectric layers as calculated from finite-element simulations. The displacement of top sensor electrodes 6015A through 6015F of BAW resonators 6001A through 6001F may create a pressure wave in a liquid placed of the top surface and therefore may lead to Quality factor (Q fractor) loss for resonators 6001A through 6001F operating in the thickness extensional mode. For reference, simulation results of displacement of top sensor electrodes 6015A through 6015F of BAW resonators 6001A through 6001F have been normalized (e.g., ratioed) relative to displacement of top sensor electrode 6015A for N=0.2 design. Trace 6021G shows that for harmonic top sensor electrodes having thicknesses that are approximately an integral multiple (e.g., N=1, e.g., N=2) of a half acoustic wavelength ($\lambda/2$), as number of alternating axis piezoelectric layers range from one piezoelectric layer to six piezoelectric layers, normalized ratio of top surface displacement of top sensor electrodes 6015A through 6015F ranges from about 0.8 to 0.1. Trace 6023G shows that for non-harmonic top sensor electrodes having thicknesses that are not approximately an integral multiple (e.g., N~0.2) of a half acoustic wavelength ($\lambda/2$), as number of alternating axis piezoelectric layers range from one piezoelectric layer to six piezoelectric layers, normalized ratio of top surface displacement of top sensor electrodes 6015A through 6015F ranges from about 1 to 0.1. This shows that increasing number of alternating axis piezoelectric layers in BAW resonators 6001A through 6001F from one layer to six layers correspondingly decreases normalized ratio of top surface displacement. It is theorized that for a given oscillating voltage amplitude applied to the BAW resonators 6001A through 6001F the displacement of each piezoelectric layer and therefore the displacement of top sensor electrodes 6015A through 6015F of BAW resonators 6001A through 6001F may decrease proportionately to the number of number of alternating axis piezoelectric layers. Decreasing normalized ratio of top surface displacement in thickness extensional resonant mode BAW resonators operable in liquid by increasing number of alternating axis piezoelectric layers may be important, since this may limit acoustic energy losses in liquid.

A lower right diagram 6019H in FIG. 6A shows estimated normalized (e.g., ratioed) energy loss in liquid ratios versus number of half acoustic wavelength ($\lambda/2$) alternating axis piezoelectric layers. For reference, energy losses in liquid for BAW resonators 6001A through 6001F have been normalized to energy losses in liquid BAW resonator 6001A with N=0.2 non-harmonic top sensing electrode 6015A. It is theorized that energy loss in liquid may be proportional to the body force of top electrode on liquid multiplied by the displacement of top sensor electrodes 6015A through 6015F of BAW resonators 6001A through 6001F. Since it is theorized that the body force of top electrode on liquid may be proportional to the squared displacement of top sensor electrode, therefore the energy loss in liquid for the thickness extensional mode may be proportional to the third power of the displacement of top sensor electrodes 6015A through 6015F of BAW resonators 6001A through 6001F. Trace 6021H shows that for harmonic top sensor electrodes having thicknesses that are approximately an integral multiple (e.g., N=1, e.g., N=2) of a half acoustic wavelength ($\lambda/2$), as number of alternating axis piezoelectric layers range from one piezoelectric layer to six piezoelectric layers, normalized ratio of loss in liquid for BAW resonators 6001A through 6001F may range from about 0.8 to 0.002. Trace 6023H shows that for non-harmonic top sensor electrodes having thicknesses that are not approximately an integral multiple (e.g., N~0.2) of a half acoustic wavelength ($\lambda/2$), as number of alternating axis piezoelectric layers range from one piezoelectric layer to six piezoelectric layers, normalized ratio of loss in liquid for BAW resonators 6001A through 6001F ranges from about 1 to 0.001. This may indicate that thickness extensional resonant mode BAW resonators operable in liquid with increasing number of alternating axis piezoelectric layers may limit acoustic energy losses in liquid, e.g., by a factor up to 500 for BAW resonators 6001F with harmonic electrodes having N=1 or N=2, and by a factor up to 1000 for BAW resonator 6001F with non-harmonic electrode having N=0.2. Notably, the normalized results presented in diagrams 6019G and 6019H need not necessarily depend on specific frequency for which the BAW resonators 6001A through 6001F have been designed for, nor the specific sensing area sizes of BAW resonators 6001A through 6001F, as should be appreciated by one skilled in the art, e.g., upon learning from this disclosure.

FIG. 6B shows BAW resonators 6001I through 6001N having non-harmonic top sensor electrodes 6015I through 6015N having thicknesses that are not approximately an integral multiple (e.g., N~0.2) of a half acoustic wavelength ($\lambda/2$) of the resonant frequency of BAW resonators 6001I through 6001N (e.g., non-harmonic top sensor electrodes 6015I through 6015N may have thicknesses of 0.1 acoustic wavelength of the resonant frequency of BAW resonators 6001I through 6001N). For purposes of simulation, BAW resonators 6001I through 6001N are designed to have a sensing region area at the top sensor electrodes 6015A through 6015F of approximately 80×80 microns.

Lower left diagram 6019O and center diagram 6019P of FIG. 6B show sensitivity of BAW resonators 6001I through 6001N versus number of half acoustic wavelength ($\lambda/2$) alternating axis piezoelectric layers for varied designs of BAW resonators 6001I through 6001N having varied main resonant frequencies of 4 GHz, 8 GHz and 24.25 GHz. Units of sensitivity for the lower left diagram 6019O of FIG. 6B are in parts per million per one hundred attograms, e.g., for 80×80 microns squared resonator sensing area. These units for sensitivity may be particularly helpful for understanding sensitivity in terms of virus detection. Electronics may measure one part per million or better in frequency shift of resonant frequency (e.g., delta Fs). A virus, e.g., coronavirus may have a mass of 100 attograms in water. Accordingly, the change in mass (delta m) for detecting one virus, e.g., one coronavirus, binding to an antibody of the functionalized layer at the sensing region of the BAW resonator may be 100 attograms. A sensitivity for a limit of detection for detecting one virus, e.g., one coronavirus may having a mass of 100 attograms in water, may be one part per million per one hundred attograms, e.g., for 80×80 microns squared resonator sensing area (assuming electronics measuring one part per million in frequency shift of resonant frequency).

Trace 6021O shows sensitivity ranging from about 2 parts per million per one hundred attograms to about 0.35 parts per million per one hundred attograms as number of alternating axis piezoelectric layers range from one piezoelectric layer to six piezoelectric layers, for BAW resonators 6001I through 6001N designed to operate at a main resonant frequency of 4 GHz. Trace 6023O shows sensitivity ranging from about 4 parts per million per one hundred attograms to about 0.7 parts per million per one hundred attograms as number of alternating axis piezoelectric layers range from one piezoelectric layer to six piezoelectric layers, for BAW resonators 6001I through 6001N designed to operate at a main resonant frequency of 8 GHz. Trace 6025O shows sensitivity ranging from about 12 parts per million per one hundred attograms to about 2.1 parts per million per one hundred attograms as number of alternating axis piezoelectric layers range from one piezoelectric layer to six piezoelectric layers, for BAW resonators 6001I through 6001N designed to operate at a main resonant frequency of 24.25 GHz. This diagram 6019O may show that BAW resonators operating at high frequency may demonstrate enhanced sensitivity. Moreover, BAW resonators operating at high frequency may have sufficient sensitivity to detect one virus, e.g., one coronavirus. This diagram 6019O may also show that although BAW resonators may show decreasing sensitivity as number of alternating axis piezoelectric layers increase, higher frequency resonators may still retain sufficient sensitivity.

Units of sensitivity for the lower center diagram 6019P of FIG. 6B are in kHz cm^2 per nanogram. These units of sensitivity may be equivalent to the sensitivity units of parts per million per one hundred attograms, e.g., for 80×80 microns squared resonator sensing area, used in the other sensitivity diagram 6019O just discussed and shown in the lower left of FIG. 6B. Trace 6021P shows sensitivity ranging from about 5 kHz cm^2 per nanogram to about 0.9 kHz cm^2 per nanogram as number of alternating axis piezoelectric layers range from one piezoelectric layer to six piezoelectric layers, for BAW resonators 6001I through 6001N designed to operate at a main resonant frequency of 4 GHz. Trace 6023P shows sensitivity ranging from about 20 kHz cm^2 per nanogram to about 3.5 kHz cm^2 per nanogram as number of alternating axis piezoelectric layers range from one piezoelectric layer to six piezoelectric layers, for BAW resonators 6001I through 6001N designed to operate at a main resonant frequency of 8 GHz. Trace 6025P shows sensitivity ranging from about 180 kHz cm^2 per nanogram to about 32 kHz cm^2 per nanogram as number of alternating axis piezoelectric layers range from one piezoelectric layer to six piezoelectric layers, for BAW resonators 6001I through 6001N designed to operate at a main resonant frequency of 24.25 GHz.

A lower right diagram 6019Q of FIG. 6B shows a vertical axis of Total Qs, e.g., total quality factor at series resonance including electrical resistance of non-harmonic top sensor electrodes 6015I through 6015N having thicknesses of 0.1 acoustic wavelength of the resonant frequency of BAW resonators. Notably, the calculation of Total Qs may be performed in two steps. First, two-dimensional finite-element calculations of Q-factor at series resonance frequency Fs for each BAW resonator 6001I through 6001N having an area corresponding to a 50 ohm resonator design at the respective frequency may be performed, without initially accounting for series resistance of the top sensing electrodes 6015I through 6015N. Second, series resistance of the top sensing electrodes 6015I through 6015N may be estimated for one square geometry, and Total Qs may be calculated for a fixed 80×80 microns squared resonator sensing area. As resonator frequency may increase, there may be an electrode thinning, which may in turn increase electrical resistance and may decrease Total Qs below what may be required. The lower right diagram 6019Q of FIG. 6B shows Total Qs versus number of half acoustic wavelength ($\lambda/2$) alternating axis piezoelectric layers for varied designs of BAW resonators 6001I through 6001N having varied main resonant frequencies of 4 GHz, 8 GHz and 24.25 GHz.

Trace 6021Q shows Total Qs, e.g., total quality factor at series resonance ranging from about 300 to about 1200 as number of alternating axis piezoelectric layers range from one piezoelectric layer to six piezoelectric layers, for BAW resonators 6001I through 6001N designed to operate at a main resonant frequency of 4 GHz. Trace 6023Q shows Total Qs, e.g., total quality factor at series resonance ranging from about 90 to about 400 as number of alternating axis piezoelectric layers range from one piezoelectric layer to six piezoelectric layers, for BAW resonators 6001I through 6001N designed to operate at a main resonant frequency of 8 GHz. Trace 6025Q shows Total Qs, e.g., total quality factor at series resonance ranging from about 4 to about 45 as number of alternating axis piezoelectric layers range from one piezoelectric layer to six piezoelectric layers, for BAW resonators 6001I through 6001N designed to operate at a main resonant frequency of 24.25 GHz.

The lower right diagram 6019Q of FIG. 6B may show that Total Qs, e.g., total quality factor may decrease as resonators are designed to operate at higher frequency. However, the lower right diagram 6019Q of FIG. 6B may also show that Total Qs, e.g., total quality factor may increase as number of alternating axis piezoelectric layers increase, e.g., ranging from one piezoelectric layer to six piezoelectric layers. Further, the lower right diagram 6019Q of FIG. 6B may show that Total Qs, e.g., total quality factor may suffer using non-harmonic electrodes (e.g., non-harmonic top sensor electrodes 6015I through 6015N having thicknesses of 0.1 acoustic wavelength). The lower right diagram 6019Q of FIG. 6B may show that Total Qs, e.g., total quality factor may suffer using non-harmonic electrodes, particularly as BAW resonators are designed to operate at higher frequencies. It is theorized that as resonator frequency may increase, there may be an electrode thinning, which may in turn increase electrical resistance and may decrease Total Qs below what may be required.

In FIG. 6C, for BAW resonators 6001R through 6001W, thickness of top sensor electrodes 6015R through 6015W may vary with N times a half acoustic wavelength ($\lambda/2$) of BAW resonator resonant frequency, with N being 0.2 or N being 1 or N being 2. Harmonic top sensor electrodes having thicknesses that are approximately an integral multiple (e.g., N=1, e.g., N=2) of a half acoustic wavelength ($\lambda/2$) of BAW resonator resonant frequency may have differing performance characteristics relative to non-harmonic top sensor electrodes having thicknesses that are not approximately an integral multiple (e.g., N~0.2) of a half acoustic wavelength ($\lambda/2$) of BAW resonator resonant frequency. For purposes of simulation, BAW resonators 6001R through 6001W are designed to have a main resonant frequency of 24.25 GHz and have a sensing region area at the top sensor electrodes 6015R through 6015W of approximately 80×80 square microns.

Lower left diagram 6019X and center diagram 6019Y of FIG. 6C show sensitivity of BAW resonators 6001R through 6001W versus number of half acoustic wavelength ($\lambda/2$) alternating axis piezoelectric layers for varied designs of BAW resonators 6001R through 6001W having varied thickness of top sensor electrodes 6015R through 6015W. Units of sensitivity for the lower left diagram 6019X of FIG. 6C are in parts per million per one hundred attograms, e.g., for 80×80 square microns resonator sensing area. As mentioned previously, these units for sensitivity may be particularly helpful for understanding sensitivity in terms of virus detection. Electronics may measure one part per million or better in frequency shift of resonant frequency (e.g., delta Fs). A virus, e.g., coronavirus may have a mass of 100 attograms in water. Accordingly, the change in mass (delta m) for detecting one virus, e.g., one coronavirus, binding to an antibody of the functionalized layer at the sensing region of the BAW resonator may be 100 attograms. A sensitivity for a limit of detection for detecting one virus, e.g., one coronavirus may having a mass of 100 attograms in water, may be one part per million per one hundred attograms e.g., for 80×80 square microns resonator sensing area (assuming electronics measuring one part per million, or better, in frequency shift of resonant frequency).

Trace 6021X shows sensitivity ranging from less than about 6 parts per million per one hundred attograms to about 2 parts per million per one hundred attograms, e.g., for 80×80 square microns resonator sensing area, as number of alternating axis piezoelectric layers range from two piezoelectric layers to six piezoelectric layers, for BAW resonators 6001R through 6001W designed for a non-harmonic top sensor electrode having a thickness that is not approximately an integral multiple (e.g., N~0.2) of a half acoustic wavelength ($\lambda/2$) of the resonant frequency of BAW resonators 6001R through 6001W, (e.g., non-harmonic top sensor electrodes 6015R through 6015W may have thicknesses of 0.1 acoustic wavelength of the resonant frequency of BAW resonators 6001R through 6001W). (Total Qs, e.g., total quality factor, may be too low (e.g., Total Qs of about 4) to provide meaningful data for a one piezoelectric layer resonator, so it is omitted from Trace 6021X)

Trace 6023X shows sensitivity ranging from about 6 parts per million per one hundred attograms to about 3 parts per million per one hundred attograms, e.g., for 80×80 square microns resonator sensing area, as number of alternating axis piezoelectric layers range from one piezoelectric layer to six piezoelectric layers, for BAW resonators 6001R through 6001W designed for harmonic top sensor electrodes having thicknesses that are approximately one half acoustic wavelength (e.g., N=1 of a half acoustic wavelength ($\lambda/2$)). Trace 6025X shows sensitivity ranging from about 4 parts per million per one hundred attograms to about 2 parts per million per one hundred attograms, e.g., for 80×80 square microns resonator sensing area, as number of alternating axis piezoelectric layers range from one piezoelectric layer to six piezoelectric layers, for BAW resonators 6001R through 6001W designed for harmonic top sensor electrodes having thicknesses that are approximately one acoustic wavelength (e.g., N=2 of a half acoustic wavelength ($\lambda/2$)). This diagram 6019X may show that BAW resonators operating at high frequency (e.g., 24.25 GHz may demonstrate relatively high sensitivity. Moreover, BAW resonators operating at high frequency may have sufficient sensitivity to detect one virus, e.g., one coronavirus. This diagram 6019X may also show that although BAW resonators may show decreasing sensitivity as number of alternating axis piezoelectric layers increase, relatively high frequency resonators (e.g., 24.25 GHz) may still retain sufficient sensitivity. This diagram 6019X may also show that although BAW resonators may show decreasing sensitivity as thickness of top sensor electrodes 6015R through 6015W may increase, relatively high frequency resonators (e.g., 24.25 GHz) may still retain sufficient sensitivity.

Units of sensitivity for the lower center diagram 6019Y of FIG. 6C are in kHz cm^2 per nanogram. These units of sensitivity may be equivalent to the sensitivity units of parts per million per one hundred attograms, e.g., for 80×80 square microns resonator sensing area, used in the other sensitivity diagram 6019X just discussed and shown in the lower left of FIG. 6C.

Trace 6021Y shows sensitivity ranging from less than about 95 kHz cm^2 per nanogram to about 30 kHz cm^2 per nanogram as number of alternating axis piezoelectric layers range from two piezoelectric layers to six piezoelectric layers, for BAW resonators 6001R through 6001W designed for a non-harmonic top sensor electrode having a thickness that is not approximately an integral multiple (e.g., N~0.2) of a half acoustic wavelength ($\lambda/2$) of the resonant frequency of BAW resonators 6001R through 6001W, (e.g., non-harmonic top sensor electrodes 6015R through 6015W may have thicknesses of about 0.1 acoustic wavelength of the resonant frequency of BAW resonators 6001R through 6001W). (Total Qs, e.g., total quality factor, may be too low to provide meaningful data for a one piezoelectric layer resonator, so it is omitted from Trace 6021X)

Trace 6023Y shows sensitivity ranging from about 100 kHz cm^2 per nanogram to about 40 kHz cm^2 per nanogram as number of alternating axis piezoelectric layers range from one piezoelectric layer to six piezoelectric layers, for BAW resonators 6001R through 6001W designed for harmonic top sensor electrodes having thicknesses that are approximately one half acoustic wavelength (e.g., N=1 of a half acoustic wavelength ($\lambda/2$)). Trace 6025Y shows sensitivity ranging from about 60 kHz cm^2 per nanogram to about 30 kHz cm^2 per nanogram as number of alternating axis piezoelectric layers range from one piezoelectric layer to six piezoelectric layers, for BAW resonators 6001R through 6001W designed to operate for harmonic top sensor electrodes having thicknesses that are approximately one acoustic wavelength (e.g., N=2 of a half acoustic wavelength ($\lambda/2$)).

A lower right diagram 6019Z of FIG. 6C shows a vertical axis of Total Qs, e.g., total quality factor at series resonance for varied designs of BAW resonators 6001R through 6001W operating a main resonant frequency of 24.25 GHz and having varied thickness of top sensor electrodes 6015R through 6015W. Notably, the calculation of Total Qs may be performed in two steps. First, two-dimensional finite-element calculations of Q-factor at series resonance frequency Fs for each BAW resonator 6001R through 6001W, e.g., having an area corresponding to 50 ohm design at the respective frequency may be performed without accounting for series resistance of the top sensing electrodes 6015R through 6015W. Second, series resistance of the top sensing electrodes 6015R through 6015W be estimated for one square geometry, and Total Qs may be calculated for a fixed 80×80 microns squared resonator sensing area. At relatively high resonator frequency (e.g., 24.25 GHz), there may be an electrode thinning, which may in turn increase electrical resistance, and may decrease Total Qs below what may be required. The lower right diagram 6019Z of FIG. 6C shows Total Qs versus number of half acoustic wavelength ($\lambda/2$) alternating axis piezoelectric layers for varied designs of BAW resonators 6001R through 6001W having varied thickness of top sensor electrodes 6015R through 6015W.

Trace 6021Z shows Total Qs, e.g., total quality factor at series resonance ranging from about 280 to about 540 as number of alternating axis piezoelectric layers range from one piezoelectric layer to six piezoelectric layers, for BAW resonators 6001R through 6001W designed for harmonic top sensor electrodes having thicknesses that are approximately one acoustic wavelength (e.g., N=2 of a half acoustic wavelength ($\lambda/2$)). Trace 6023Z shows Total Qs, e.g., total quality factor at series resonance ranging from about 110 to about 270 as number of alternating axis piezoelectric layers range from one piezoelectric layer to six piezoelectric layers, for BAW resonators 6001R through 6001W designed for harmonic top sensor electrodes having thicknesses that are approximately one half acoustic wavelength (e.g., N=1 of a half acoustic wavelength ($\lambda/2$)). Trace 6025Z shows Total Qs, e.g., total quality factor at series resonance ranging from about 12 to about 45 as number of alternating axis piezoelectric layers range from two piezoelectric layers to six piezoelectric layers, for BAW resonators 6001R through 6001W having a thickness that is not approximately an integral multiple (e.g., N~0.2) of a half acoustic wavelength ($\lambda/2$) of the resonant frequency of BAW resonators 6001R through 6001W, (e.g., non-harmonic top sensor electrodes 6015R through 6015W may have thicknesses of 0.1 acoustic wavelength of the resonant frequency of BAW resonators 6001R through 6001W).

The lower right diagram 6019Z of FIG. 6C may show that Total Qs, e.g., total quality factor may decrease as resonators are designed to operate at higher frequency. However, the lower right diagram 6019Z of FIG. 6C may also show that Total Qs, e.g., total quality factor may increase as number of alternating axis piezoelectric layers increase, e.g., ranging from one piezoelectric layer to six piezoelectric layers. Further, the lower right diagram 6019Z of FIG. 6C may show that Total Qs, e.g., total quality factor, may suffer using non-harmonic electrodes (e.g., non-harmonic top sensor electrodes 6015I through 6015N having thicknesses of 0.1 acoustic wavelength). The lower right diagram 6019Z of FIG. 6C may show that Total Qs, e.g., total quality factor may suffer using non-harmonic electrodes, particularly as BAW resonators are designed to operate at higher frequencies. It is theorized that as resonator frequency may increase, there may be an electrode thinning, which may in turn increase electrical resistance and may decrease Total Qs below what may be required, unless electrodes are thickened, e.g., using harmonically tuned top sensor electrodes.

Figure 7A:
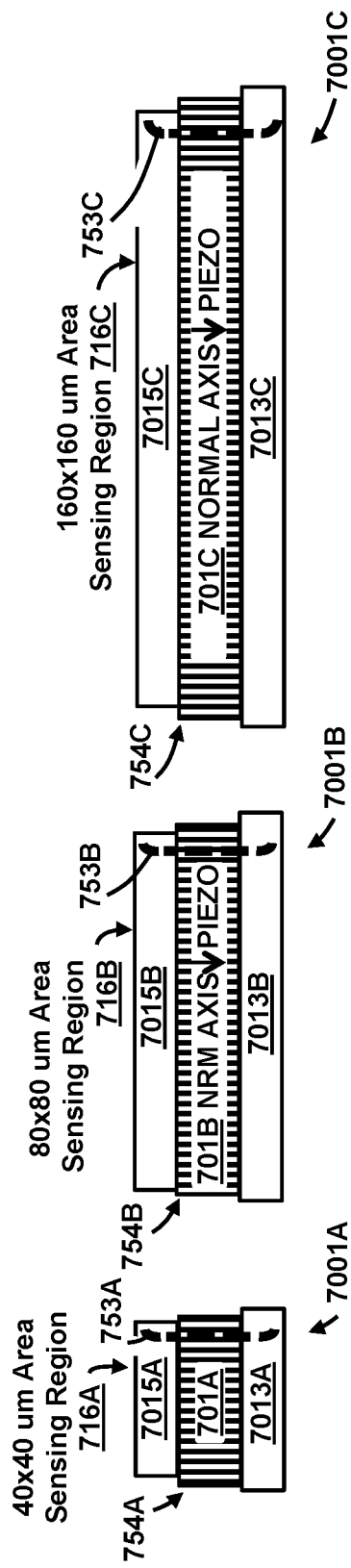
FIGS. 7A and 7B are simplified diagrams of various additional example resonators of this disclosure, along with respective diagrams illustrating respective corresponding properties as predicted by simulation.
Figure 7A:
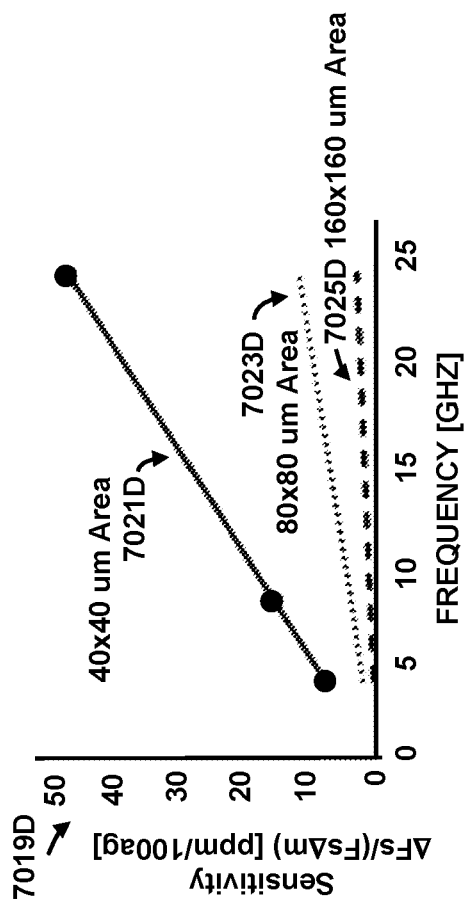
Figure 7B:
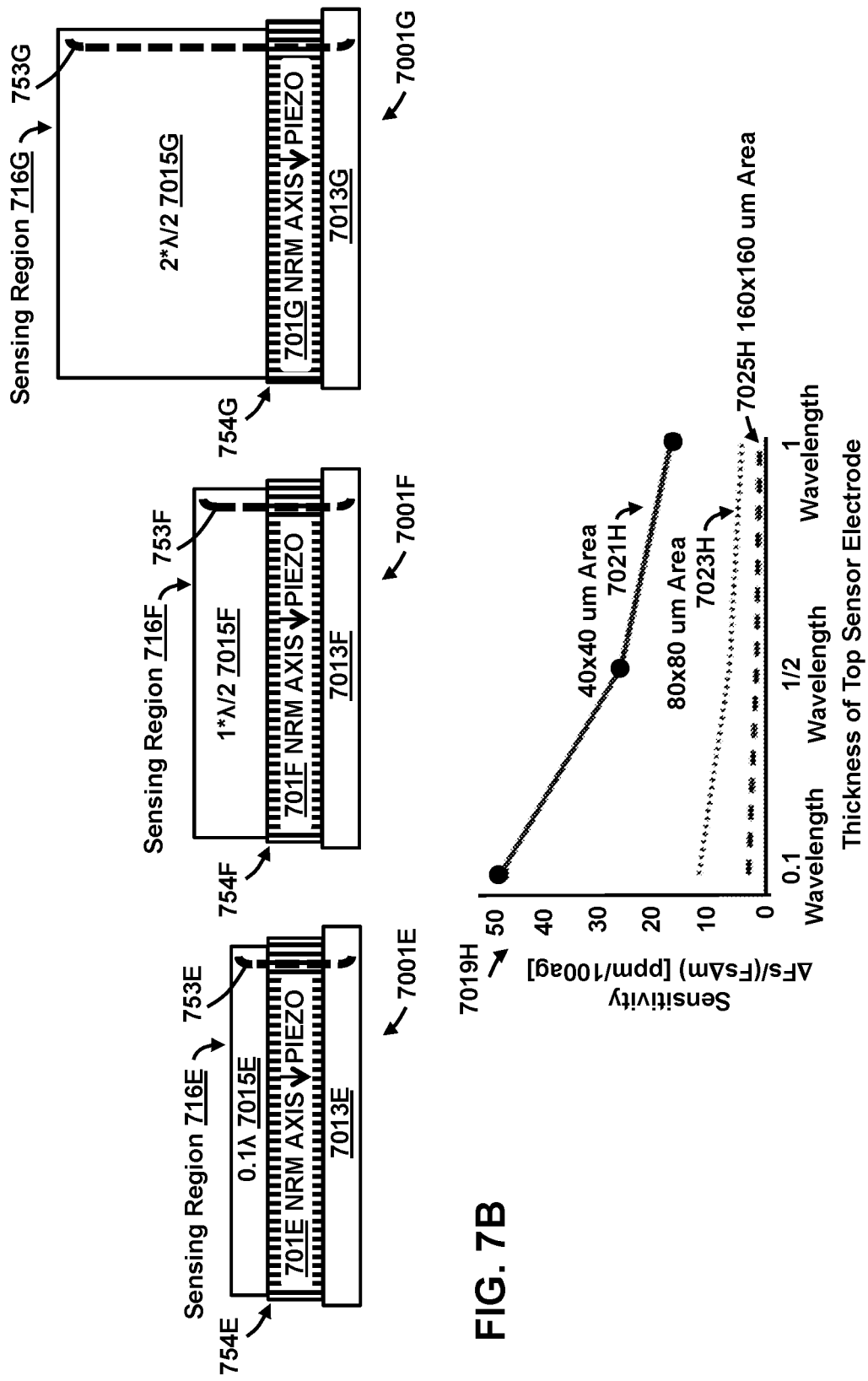

FIGS. 7A and 7B are simplified diagrams of various additional example resonators of this disclosure, along with respective diagrams illustrating respective corresponding properties as predicted by simulation. A top half of FIG. 7A shows BAW resonators 7001A, 7001B, 7001C that may comprise respective normal axis piezoelectric layers 701A, 701B, 701C sandwiched between respective multilayer metal acoustic reflector electrodes 7013A, 7013B, 7013C and top sensor electrodes 7015A, 7015B, 7015C. BAW resonators 7001A, 7001B, 7001C may have respective etched edge regions 753A, 753B, 753C, and respective opposing etched edge regions 754A, 754B, 754C. FIG. 7A shows BAW resonators 7001A through 7001C having non-harmonic top sensor electrodes 7015A, 7015B, 7015C having thicknesses that are not approximately an integral multiple (e.g., N~0.2) of a half acoustic wavelength ($\lambda/2$) of the resonant frequency of BAW resonators 7001A through 7001C (e.g., non-harmonic top sensor electrodes 7015A through 7015C may have thicknesses of about 0.1 acoustic wavelength of the resonant frequency of BAW resonators 7001A through 7001C). Area size of respective sensing regions 716A through 716C is varied for corresponding BAW resonators 7001A, 7001B, 7001C. For example, sensing region 716A of BAW resonator 7001A may have an area size of 40×40 microns. Sensing region 716B of BAW resonator 7001B may have an area size of 80×80 microns. Sensing region 716C of BAW resonator 7001C may have an area size of 160×160 microns.

Diagram 7019D shown in FIG. 7A shows sensitivity of BAW resonators 7001A through 7001C versus resonant frequencies of 4 GHz, 8 GHz and 24 GHz for varied designs of BAW resonators 7001A through 7001C having varied sizes of 40×40 microns (corresponding to BAW resonator 7001A), 80×80 microns (corresponding to resonator 7001B) and 160×160 microns (corresponding to resonator 7001C). Units of sensitivity for diagram 7019D of FIG. 7A are in parts per million per one hundred attograms. These units for sensitivity may be particularly helpful for understanding sensitivity in terms of virus detection. Electronics may measure one part per million or better in frequency shift of resonant frequency (e.g., delta Fs). A virus, e.g., coronavirus may have a mass of 100 attograms in water. Accordingly, the change in mass (delta m) for detecting one virus, e.g., one coronavirus, binding to an antibody of the functionalized layer at the sensing region of the BAW resonator may be 100 attograms. A sensitivity for a limit of detection for detecting one virus, e.g., one coronavirus may having a mass of 100 attograms in water, may be one part per million per one hundred attograms (assuming electronics measuring one part per million in frequency shift of resonant frequency).

Trace 7021D shows sensitivity ranging from about 2 parts per million per one hundred attograms to about 50 parts per million per one hundred attograms as designs for resonant frequency range through 4 GHz, 8 GHz and 24 GHz, for BAW resonator 7001A having area size of 40×40 microns.

Trace 7023D shows sensitivity ranging from about 2 parts per million per one hundred attograms to about 12 parts per million per one hundred attograms as designs for resonant frequency range through 4 GHz, 8 GHz and 24 GHz, for BAW resonator 7001B having area size of 80×80 microns.

Trace 7025D shows sensitivity ranging from about 0.5 parts per million per one hundred attograms to about 3 parts per million per one hundred attograms as designs for resonant frequency range through 4 GHz, 8 GHz and 24 GHz, for BAW resonator 7001C having area size of 160×160 microns.

This diagram 7019D may show that BAW resonators operating at high frequency may demonstrate enhanced sensitivity. Moreover, BAW resonators operating at high frequency may have sufficient sensitivity to detect one virus, e.g., one coronavirus. This diagram 7019D may also show that although BAW resonators may show decreasing sensitivity as area size increases, higher frequency resonators may still retain sufficient sensitivity. It may be desirable, in some ways to increase area size to some extent, for example to fill a base of a microfluidic channel. Further, increasing area size to some extent, may increase a probability of detecting a low concentration analyte quickly. However, in terms of maintaining BAW resonator sensitivity, diagram 7019D shows that it may be desirable to limit increases in sensing region area size. Rather than increases in sensing region area size, it may be desirable instead to effectively increase area by employing an array of BAW resonators, e.g., having an aggregated increased area size.

A top half of FIG. 7B shows BAW resonators 7001E, 7001F, 7001G designed for operation at a 24.25 GHz main resonant frequency that may comprise respective normal axis piezoelectric layers 701E, 701F, 701G sandwiched between respective multilayer metal acoustic reflector electrodes 7013E, 7013F, 7013G and top sensor electrodes 7015E, 7015F, 7015G. BAW resonators 7001E, 7001F, 7001G may have respective etched edge regions 753E, 753F, 753CG, and respective opposing etched edge regions 754E, 754F, 754G. FIG. 7B shows BAW resonators 7001E through 7001G may have varied thickness of top sensor electrodes 7015E, 7015F, 7015G. For example, BAW resonator 7001E may have varied thickness of its top sensor electrodes 7015E, but one example of BAW resonator 7001E is shown in FIG. 7B as having a non-harmonic top sensor electrode 7015E having a thickness that is not approximately an integral multiple (e.g., N~0.2) of a half acoustic wavelength ($\lambda/2$) of the resonant frequency of BAW resonator 7001E (e.g., one example of BAW resonator 7001E is shown in FIG. 7B as having thicknesses of 0.1 acoustic wavelength of the resonant frequency of BAW resonator 7001E). The example resonator 7001E shown in FIG. 7B having top electrode thicknesses of 0.1 acoustic wavelength may have different piezoelectric layer thickness than the other example resonators (e.g., 7001F, 7001G) shown in FIG. 7B having harmonic top electrodes. For non-harmonic (e.g., 0.1 acoustic wavelength) electrode examples, the piezoelectric layer may be sandwiched between top and bottom 0.1 acoustic wavelength electrodes, and the entire thickness of the stack of the piezoelectric layer sandwiched between top and bottom 0.1 acoustic wavelength electrodes may be about a half acoustic wavelength. For example, the piezoelectric layer may be about nine hundred Angstroms thick (900 A thick) and the bottom and top Mo electrodes may be about two hundred seventy Angstroms thick (270 A). In contrast, example resonators having harmonic top electrodes may have full half wavelength thick piezoelectric layers, for example, having thicknesses of about 2200 A each and a bottom multilayer metal acoustic reflector electrode. BAW resonator 7001F may have varied thickness of its top sensor electrodes 7015F, but one example of BAW resonator 7001F is shown in FIG. 7B as having a harmonic top sensor electrode 7015F having a thickness that is approximately an integral multiple (e.g., N=1) of a half acoustic wavelength ($\lambda/2$) of the resonant frequency of BAW resonator 7001F (e.g., one example of BAW resonator 7001F is shown in FIG. 7B as having thicknesses of a half acoustic wavelength of the resonant frequency of BAW resonator 7001F). BAW resonator 7001G may have varied thickness of its top sensor electrodes 7015F, but one example of BAW resonator 7001G is shown in FIG. 7B as having a harmonic top sensor electrode 7015G having a thickness that is approximately an integral multiple (e.g., N=2) of a half acoustic wavelength ($\lambda/2$) of the resonant frequency of BAW resonator 7001G (e.g., one example of BAW resonator 7001G is shown in FIG. 7B as having thicknesses of one acoustic wavelength of the resonant frequency of BAW resonator 7001G). Area size of respective sensing regions 716E through 716G is varied for corresponding BAW resonators 7001E, 7001F, 7001G. For example, sensing regions 716E through 716G of BAW resonators 7001E through 7001G may have area sizes ranging from 40×40 microns, through 80×80 microns, and through 160×160 microns.

Diagram 7019H shown in FIG. 7B shows sensitivity of BAW resonators (e.g., BAW resonators 7001E through 7000G) versus thickness of top sensor electrodes (e.g., top sensor electrodes 7015E through 7015G) for varied designs of BAW resonators 7001A through 7001C having varied sensor region area sizes of 40×40 microns, 80×80 microns and 160×160 microns. Units of sensitivity for diagram 7019H of FIG. 7B are in parts per million per one hundred attograms. Trace 7021H shows sensitivity ranging from about 50 parts per million per one hundred attograms to about 16 parts per million per one hundred attograms as designs for top sensor electrode thickness ranging through 0.1 acoustic wavelength, one half acoustic wavelength, and one acoustic wavelength of the 24.25 GHz BAW resonator, for sensing regions having area size of 40×40 microns.

Trace 7023H shows sensitivity ranging from about 12 parts per million per one hundred attograms to about 4 parts per million per one hundred attograms as designs for top sensor electrode thickness ranging through 0.1 acoustic wavelength, one half acoustic wavelength, and one acoustic wavelength of the 24.25 GHz BAW resonator, for sensing regions having area size of 80×80 microns.

Trace 7025H shows sensitivity ranging from about 3 parts per million per one hundred attograms to about 1 part per million per one hundred attograms as designs for top sensor electrode thickness ranging through 0.1 acoustic wavelength, one half acoustic wavelength, and one acoustic wavelength of the 24.25 GHz BAW resonator, for sensing regions having area size of 160×160 microns.

This diagram 7019H may show that BAW resonators operating at high frequency (e.g., 24.25 GHz) may demonstrate enhanced sensitivity. Moreover, BAW resonators operating at high frequency (e.g., 24.25 GHz) may have sufficient sensitivity to detect one virus, e.g., one coronavirus. This diagram 7019H may also show that although BAW resonators may show decreasing sensitivity as area size increases, high frequency resonators (e.g., 24.25 GHz) may still retain sufficient sensitivity. Although, increasing thickness of the top sensor electrode, e.g., to one acoustic wavelength may decrease sensitivity somewhat, limiting area size of sensing regions of BAW resonators (e.g., to 80×80 microns or 40×40 microns) may still provide very high sensitivity.

Figure 8B:
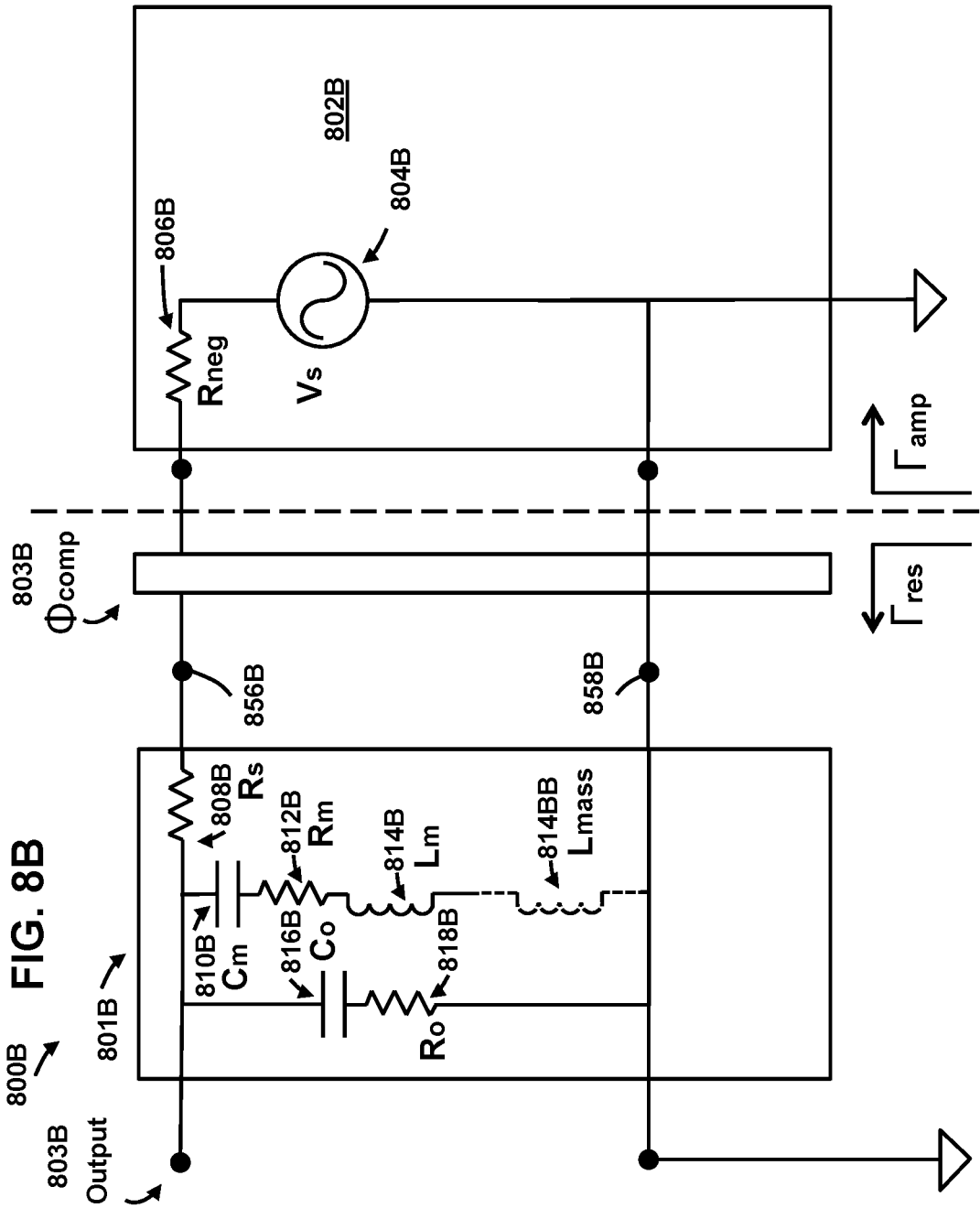
FIG. 8B shows a schematic of and example circuit implementation of the oscillator shown in FIG. 8A.

FIGS. 8A and 8B show an example oscillator 800A, 800B (e.g., millimeter wave oscillator 800A, 800B, e.g., Super High Frequency (SHF) wave oscillator 800A, 800B, e.g., Extremely High Frequency (EHF) wave oscillator 800A, 800B) using the bulk acoustic wave resonator structure of FIG. 1A. For example, FIGS. 8A and 8B shows simplified views of bulk acoustic wave resonator 801A, 801B and electrical coupling nodes 856A, 858A, 856B, 858B that may be electrically coupled with bulk acoustic wave resonator 801A, 801B. As shown in FIGS. 8A and 8B, electrical coupling nodes 856A, 858A, 856B, 858B may facilitate an electrical coupling of bulk acoustic wave resonator 801A, 801B with electrical oscillator circuitry (e.g., active oscillator circuitry 802A, 802B), for example, through phase compensation circuitry 803A, 803B (Φcomp). The example oscillator 800A, 800B may be a negative resistance oscillator, e.g., in accordance with a one-port model as shown in FIGS. 8A and 8B. The electrical oscillator circuitry, e.g., active oscillator circuitry may include one or more suitable active devices (e.g., one or more suitably configured amplifying transistors) to generate a negative resistance commensurate with resistance of the bulk acoustic wave resonator 801A, 801B. In other words, energy lost in bulk acoustic wave resonator 801A, 801B may be replenished by the active oscillator circuitry, thus allowing steady oscillation, e.g., steady SHF or EHF wave oscillation. To ensure oscillation start-up, active gain (e.g., negative resistance) of active oscillator circuitry 802A, 802B may be greater than one. As illustrated on opposing sides of a notional dashed line in FIGS. 8A and 8B, the active oscillator circuitry 802A, 802B may have a complex reflection coefficient of the active oscillator circuitry (Γamp), and the bulk acoustic wave resonator 801A, 801B together with the phase compensation circuitry 803A, 803B (Φcomp) may have a complex reflection coefficient (Γres). To provide for the steady oscillation, e.g., steady SHF or EHF wave oscillation, a magnitude may be greater than one for |Γamp Γres|, e.g., magnitude of a product of the complex reflection coefficient of the active oscillator circuitry (Γamp) and the complex reflection coefficient (Γres) of the resonator to bulk acoustic wave resonator 801A, 801B together with the phase compensation circuitry 803A, 803B (Φcomp) may be greater than one. Further, to provide for the steady oscillation, e.g., steady SHF or EHF wave oscillation, phase angle may be an integer multiple of three-hundred-sixty degrees for ∠Γamp Γres, e.g., a phase angle of the product of the complex reflection coefficient of the active oscillator circuitry (Γamp) and the complex reflection coefficient (Γres) of the resonator to bulk acoustic wave resonator 801A, 801B together with the phase compensation circuitry 803A, 803B (Φcomp) may be an integer multiple of three-hundred-sixty degrees. The foregoing may be facilitated by phase selection, e.g., electrical length selection, of the phase compensation circuitry 803A, 803B (Φcomp).

In the simplified view of FIG. 8A, the bulk acoustic wave resonator 801A may have a sensing region 816 acoustically coupled with the bulk acoustic wave resonator 801A via a harmonically tuned top sensor electrode 815A of the bulk acoustic wave resonator 801A. The bulk acoustic wave resonator 801A (e.g., bulk acoustic SHF or EHF wave resonator) includes first normal axis piezoelectric layer 805A, first reverse axis piezoelectric layer 807A, and another normal axis piezoelectric layer 809A, and another reverse axis piezoelectric layer 811A arranged in a four piezoelectric layer alternating axis stack arrangement sandwiched between a detuned SHF or EHF harmonically tuned top sensor electrode 815A and de-tuned multilayer metal acoustic SHF or EHF wave reflector electrode 813A. General structures and applicable teaching of this disclosure for the detuned SHF or EHF harmonically tuned top sensor electrode 815A and the de-tuned multilayer metal acoustic SHF or EHF wave reflector electrode 813A have already been discussed in detail previously herein with respect of FIGS. 1A and 4A through 4C, which for brevity are incorporated by reference rather than repeated fully here. As already discussed, the de-tuned multilayer metal acoustic SHF or EHF wave reflector electrode 813A is directed to respective pairs of metal electrode layers, in which a first member of the pair has a relatively low acoustic impedance (relative to acoustic impedance of an other member of the pair), in which the other member of the pair has a relatively high acoustic impedance (relative to acoustic impedance of the first member of the pair), and in which the respective pairs of metal electrode layers have layer thicknesses corresponding to one quarter wavelength (e.g., one quarter acoustic wavelength) at a main resonant frequency of the resonator. Accordingly, it should be understood that the bulk acoustic SHF or EHF wave resonator 801A shown in FIG. 8A may include a de-tuned multilayer metal acoustic SHF or EHF wave reflector electrode 813A. Similarly, SHF or EHF harmonically tuned top sensor electrode 815A may be detuned.

For example, to provide for de-tuning (e.g., tuning up) of the SHF or EHF harmonically tuned top sensor electrode 815A, thickness (e.g., one acoustic wavelength thickness) of the harmonically tuned top sensor electrode 815A may be made somewhat thinner. For example, thickness of the SHF or EHF harmonically tuned top sensor electrode 815A may be about 260 Angstroms lesser, e.g., about 10% thinner than an acoustic wavelength corresponding to an example BAW resonator resonant frequency of 24.25 GHz.

An output 816A of the oscillator 800A may be coupled to the bulk acoustic wave resonator 801A (e.g., coupled to harmonically tuned top sensor electrode 815A). It should be understood that interposer layers as discussed previously herein with respect to FIG. 1A are explicitly shown in the simplified view the example resonator 801A shown in FIG. 8A. Such interposer layers may be included and interposed between adjacent piezoelectric layers. For example, a first interposer layer is arranged between first normal axis piezoelectric layer 805A and first reverse axis piezoelectric layer 807A. For example, a second interposer layer is arranged between first reverse axis piezoelectric layer 807A and another normal axis piezoelectric layer 809A. For example, a third interposer is arranged between the another normal axis piezoelectric layer 809A and another reverse axis piezoelectric layer 811A. As discussed previously herein, such interposer may be metal or dielectric, and may, but need not provide various benefits, as discussed previously herein. Alternatively or additionally, one or more (e.g., one or a plurality of) interposer layers may comprise metal and dielectric for respective interposer layers. For example, high acoustic impedance metal layer such as Tungsten (W) or Molybdenum (Mo) may (but need not) raise effective electromechanical coupling coefficient (Kt2). Subsequently deposited amorphous dielectric layer such as Silicon Dioxide ($SiO_2$) may (but need not) facilitate compensating for temperature dependent frequency shifts. Alternatively or additionally, one or more (e.g., one or a plurality of) interposer layers may be formed of different metal layers. For example, high acoustic impedance metal layer such as Tungsten (W) or Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited piezoelectric layer. Alternatively or additionally, one or more (e.g., one or a plurality of) interposer layers may be formed of different dielectric layers. For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide ($SiO_2$) may (but need not) facilitate compensating for temperature dependent frequency shifts.

A notional heavy dashed line is used in depicting an etched edge region 853A associated with example resonator 801A. The example resonator 801A may also include a laterally opposing etched edge region 854A arranged opposite from the etched edge region 853A. The etched edge region 853A (and the laterally opposing etch edge region 854A) may similarly extend through various members of the example resonator 801A of FIG. 8A, in a similar fashion as discussed previously herein with respect to the etched edge region 253D (and the laterally opposing etch edge region 254D) of example resonator 2001D shown in FIG. 2B. As shown in FIG. 8A, a first mesa structure corresponding to the stack of four piezoelectric material layers 805A, 807A, 809A, 811A may extend laterally between (e.g., may be formed between) etched edge region 853A and laterally opposing etched edge region 854A. A second mesa structure corresponding to multi-layer metal bottom de-tuned acoustic SHF or EHF wave reflector electrode 813A may extend laterally between (e.g., may be formed between) etched edge region 853A and laterally opposing etched edge region 854A. Third mesa structure corresponding to harmonically tuned top sensor electrode 815A may extend laterally between (e.g., may be formed between) etched edge region 853A and laterally opposing etched edge region 854A.

FIG. 8B shows a schematic of an example circuit implementation of the oscillator shown in FIG. 8A. Active oscillator circuitry 802B may include active elements, symbolically illustrated in FIG. 8B by alternating voltage source 804B (Vs) coupled through negative resistance 806B (Rneg), e.g., active gain element 806B, to example bulk acoustic wave resonator 801B (e.g., bulk acoustic SHF or EHF wave resonator) via phase compensation circuitry 803B (Φcomp). The representation of example bulk acoustic wave resonator 801B (e.g., bulk acoustic SHF or EHF wave resonator) may include passive elements, symbolically illustrated in FIG. 8B by electrode ohmic loss parasitic series resistance 808B (Rs), motional capacitance 810B (Cm), acoustic loss motional resistance 812B (Rm), motional inductance 814B (Lm), static or plate capacitance 816B (Co), and acoustic loss parasitic 818B (Ro). Additionally, a variable mass inductance 814BB (Lmass) is depicted in dashed line to represent the variable mass of an analyte binding to the functionalized layer of the sensing region of the BAW resonator. An output 816B of the oscillator 800B may be coupled to the bulk acoustic wave resonator 801B (e.g., coupled to the detuned SHF or EHF harmonically tuned top sensor electrode of bulk acoustic wave resonator 801B).

Figure 8C:
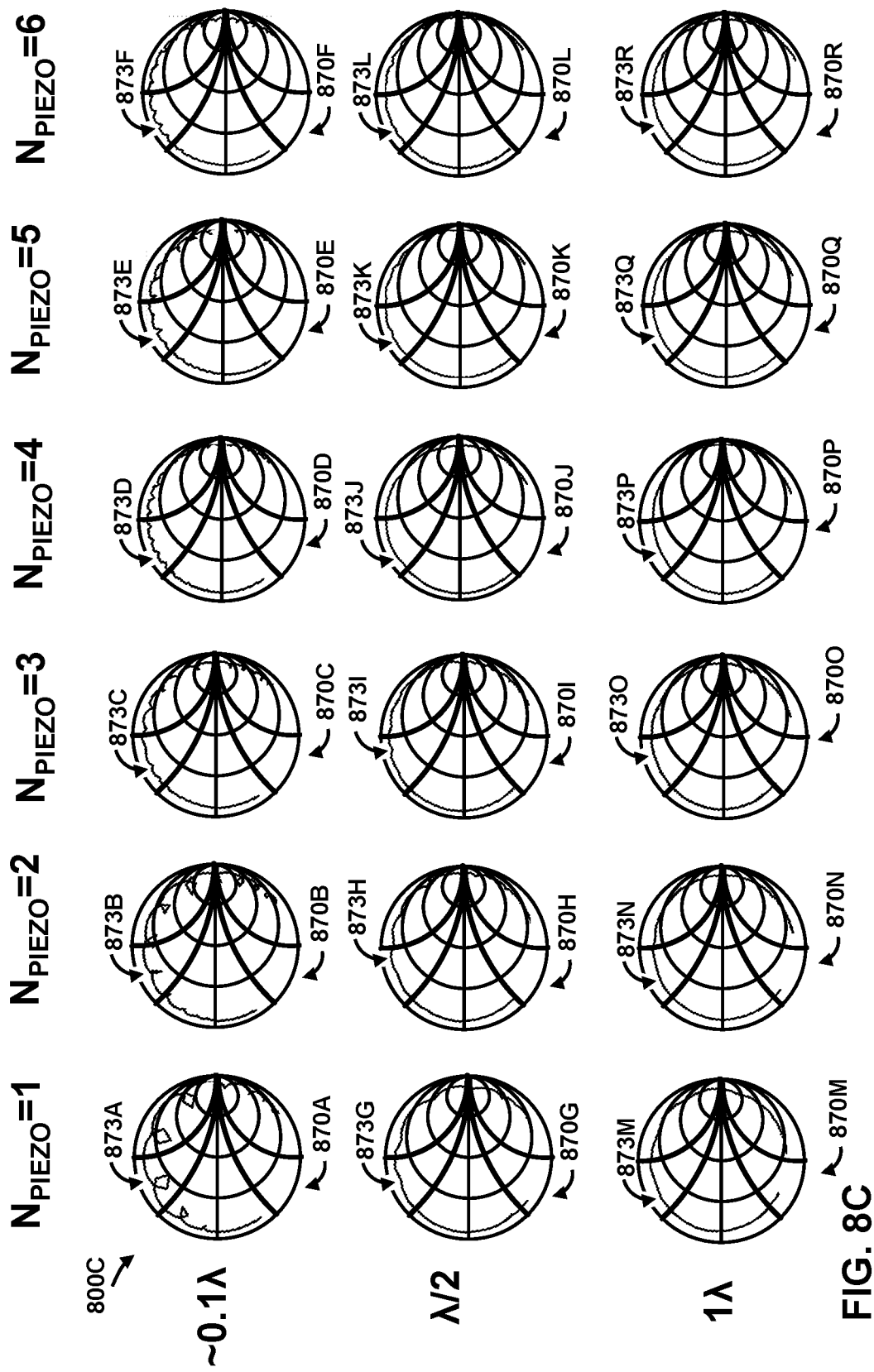
FIG. 8C shows an array of eighteen Smith charts showing Scattering parameters (S-parameters) at various operating frequencies corresponding various example BAW resonators having from one to six piezoelectric layers in alternating piezoelectric axis stack arrangements, and having top electrodes thickness varying from about a tenth of the acoustic wavelength of the BAW resonators to one half of the acoustic wavelength of the BAW resonators, to one acoustic wavelength of the BAW resonators.

FIG. 8C shows an array of eighteen Smith charts showing Scattering-parameters (S-parameters, e.g., S11) at various operating frequencies corresponding various example BAW resonators having from one to six piezoelectric layers in alternating piezoelectric axis stack arrangements, and having top electrodes thickness varying from about a tenth of the acoustic wavelength of the BAW resonators to one half of the acoustic wavelength of the BAW resonators, to one acoustic wavelength of the BAW resonators. The Smith charts have been simulated using two-dimensional finite element models of resonators, for example, having characteristic impedance of 50 ohm at respective series resonance frequencies. For example, a first row of Smith charts 870A through 870F include respective trances 873A through 873F of Scattering-parameters (S-parameters, e.g., S11) over frequency corresponding to BAW resonators of this disclosure having top electrode thickness of about a tenth of acoustic wavelength (~0.1λ) of the main resonant frequency of the BAW resonator and having from 1 piezoelectric layer (e.g., Npiezo=1) to an increasing number alternating axis piezoelectric layers, up to six alternating axis piezoelectric layers (e.g., Npiezo=6). It is theorized in this disclosure that uneven artifacts apparent in respective traces 873A through 873F of may correspond to parasitic lateral resonances. It is theorized in this disclosure that increasing number of alternating axis piezoelectric layers in BAW resonators of this disclosure may facilitate suppressing parasitic lateral resonances. This may be indicated in FIG. 8C by fewer/less uneven artifacts being present in trace 873F (corresponding to a BAW resonator having six alternating axis piezoelectric layers (e.g., Npiezo=6)) relative to more uneven artifacts being present in trace 873A (corresponding to a BAW resonator having one piezoelectric layer (e.g., Npiezo=1)).

For example, a second row of Smith charts 870G through 870L include respective trances 873G through 873L of Scattering-parameters (S-parameters, e.g., S11) over frequency corresponding to BAW resonators of this disclosure having top electrode thickness of about half of an acoustic wavelength (λ/2) of the main resonant frequency of the BAW resonator and having from 1 piezoelectric layer (e.g., Npiezo=1) to an increasing number alternating axis piezoelectric layers, up to six alternating axis piezoelectric layers (e.g., Npiezo=6). It is theorized in this disclosure that uneven artifacts apparent in respective traces 873G through 873L may correspond to parasitic lateral resonances. It is theorized in this disclosure that increasing number of alternating axis piezoelectric layers in BAW resonators of this disclosure may facilitate suppressing parasitic lateral resonances. This may be indicated in FIG. 8C by fewer/less uneven artifacts being present in trace 873L (corresponding to a BAW resonator having six alternating axis piezoelectric layers (e.g., Npiezo=6)) relative to more uneven artifacts being present in trace 873G (corresponding to a BAW resonator having one piezoelectric layer (e.g., Npiezo=1)). Further, comparing traces 873A through 873F of the first row of Smith charts 870A through 870F to traces 873G through 873L of the second row of Smith charts 870G through 870L may show fewer/less uneven artifacts being present in traces 873G through 873L of the second row of Smith charts 870G through 870L, relative to more uneven artifacts being present in traces 873A through 873F of the first row of Smith charts 870A through 870F. Accordingly it is theorized in this disclosure that increasing top electrode thickness, e.g., from a tenth of acoustic wavelength (~0.1λ) to about half of an acoustic wavelength (λ/2) (e.g. increasing thickness to provide a harmonic top electrode) may facilitate suppressing parasitic lateral resonances.

For example, a third row of Smith charts 870M through 870R include respective trances 873M through 873R of Scattering-parameters (S-parameters, e.g., S11) over frequency corresponding to BAW resonators of this disclosure having top electrode thickness of about one acoustic wavelength (1λ) of the main resonant frequency of the BAW resonator and having from 1 piezoelectric layer (e.g., Npiezo=1) to an increasing number alternating axis piezoelectric layers, up to six alternating axis piezoelectric layers (e.g., Npiezo=6). It is theorized in this disclosure that uneven artifacts that are decreasingly apparent in respective traces 873M through 873R may correspond to decreasing parasitic lateral resonances. It is theorized in this disclosure that increasing number of alternating axis piezoelectric layers in BAW resonators of this disclosure may facilitate suppressing parasitic lateral resonances. This may be indicated in FIG. 8C by fewer/less uneven artifacts being present in trace 873R (corresponding to a BAW resonator having six alternating axis piezoelectric layers (e.g., Npiezo=6)) relative to more uneven artifacts being present in trace 873M (corresponding to a BAW resonator having one piezoelectric layer (e.g., Npiezo=1)). Further, comparing traces 873G through 873L of the second row of Smith charts 870G through 870L to traces 873M through 873R of the third row of Smith charts 870M through 870R may show fewer/less uneven artifacts being present in traces 873M through 873R of the third row of Smith charts 870M through 870R, relative to more uneven artifacts being present in traces 873G through 873L of the second row of Smith charts 870G through 870R. Accordingly, it is theorized in this disclosure that increasing top electrode thickness further, e.g., from about a half acoustic wavelength (λ/2) to about one acoustic wavelength (1λ) may further facilitate suppressing parasitic lateral resonances.

FIGS. 9A and 9B are simplified diagrams of a frequency spectrum illustrating application frequencies and application frequency bands of the example bulk acoustic wave resonators shown in FIG. 1A and FIGS. 4A through 4C and the example oscillators shown in FIGS. 8A and 8B. A widely used standard to designate frequency bands in the microwave range by letters is established by the United States Institute of Electrical and Electronic Engineers (IEEE). In accordance with standards published by the IEEE, as defined herein, and as shown in FIGS. 9A and 9B are application bands as follows: L Band (1 GHz-2 GHz), S Band (2 GHz-4 GHz), C Band (4 GHz-8 GHz), X Band (8 GHz-12 GHz), Ku Band (12 GHz-18 GHz), K Band (18 GHz-27 GHz), Ka Band (27 GHz-40 GHz), V Band (40 GHz-75 GHz), and W Band (75 GHz-110 GHz). FIG. 9A shows a first frequency spectrum portion 9000A in a range from one Gigahertz (1 GHz) to eight Gigahertz (8 GHz), including application bands of L Band (1 GHz-2 GHz), S Band (2 GHz-4 GHz) and C Band (4 GHz-8 GHz). As described subsequently herein, the 3rd Generation Partnership Project standards organization (e.g., 3GPP) has standardized various 5G frequency bands. For example, included is a first application band 9010 (e.g., 3GPP 5G n77 band) (3.3 GHz-4.2 GHz) configured for fifth generation broadband cellular network (5G) applications. As described subsequently herein, the first application band 9010 (e.g., 5G n77 band) includes a 5G sub-band 9011 (3.3 GHz-3.8 GHz). The 3GPP 5G sub-band 9011 includes Long Term Evolution broadband cellular network (LTE) application sub-bands 9012 (3.4 GHz-3.6 GHz), 9013 (3.6 GHz-3.8 GHz), and 9014 (3.55 GHz-3.7 GHz). A second application band 9020 (4.4 GHz-5.0 GHz) includes a sub-band 9021 for China specific applications. Discussed next are Unlicensed National Information Infrastructure (UNII) bands. A third application band 9030 includes a UNII-1 band 9031 (5.15 GHz-5.25 GHz) and a UNII-2A band 9032 (5.25 GHz 5.33 GHz). An LTE band 9033 (LTE Band 252) overlaps the same frequency range as the UNII-1 band 6031. A fourth application band 9040 includes a UNII-2C band 9041 (5.490 GHz-5.735 GHz), a UNII-3 band 9042 (5.735 GHz-5.85 GHz), a UNII-4 band 9043 (5.85 GHz-5.925 GHz), a UNII-5 band 9044 (5.925 GHz-6.425 GHz), a UNII-6 band 9045 (6.425 GHz-6.525 GHz), a UNII-7 band 9046 (6.525 GHz-6.875 GHz), and a UNII-8 band 9047 (6.875 GHz-7125 GHz). An LTE band 9048 overlaps the same frequency range (5.490 GHz-5.735 GHz) as the UNII-3 band 9042. A sub-band 9049A shares the same frequency range as the UNII-4 band 9043. An LTE band 9049B shares a subsection of the same frequency range (5.855 GHz-5.925 GHz).

FIG. 9B shows a second frequency spectrum portion 9000B in a range from eight Gigahertz (8 GHz) to one-hundred and ten Gigahertz (110 GHz), including application bands of X Band (8 GHz-12 GHz), Ku Band (12 GHz-18 GHz), K Band (18 GHz-27 GHz), Ka Band (27 GHz-40 GHz), V Band (40 GHz-75 GHz), and W Band (75 GHz-110 GHz). A fifth application band 9050 includes 3GPP 5G bands configured for fifth generation broadband cellular network (5G) applications, e.g., 3GPP 5G n258 band 9051 (24.25 GHz-27.5 GHz), e.g., 3GPP 5G n261 band 9052 (27.5 GHz-28.35 GHz), e.g., 3GPP 5G n257 band 9053 (26.5 GHz-29.5). FIG. 9B shows an EESS (Earth Exploration Satellite Service) band 9051A (23.6 GHz-24 GHz) adjacent to the 3GPP 5G n258 band 9051 (24.25 GHz-27.5 GHz). As will be discussed in greater detail subsequently herein, an example EESS notch filter of the present disclosure may facilitate protecting the EESS (Earth Exploration Satellite Service) band 9051A (23.6 GHz-24 GHz) from energy leakage from the adjacent 3GPP 5G n258 band 9051 (24.25 GHz-27.5 GHz). For example, this may facilitate satisfying (e.g., facilitate compliance with) a specification of a standards setting organization, e.g., International Telecommunications Union (ITU) specifications, e.g., ITU-R SM.329 Category A/B levels of −20 db W/200 MHz, e.g., 3rd Generation Partnership Project (3GPP) 5G specifications, e.g., 3GPP 5G, unwanted (out-of-band & spurious) emission levels, worst case of −20 db W/200 MHz. Alternatively or additionally, this may facilitate satisfying (e.g., facilitate compliance with) a regulatory requirement, e.g., a government regulatory requirement, e.g., a Federal Communications Commission (FCC) decision or requirement, e.g., a European Commission decision or requirement of −42 db W/200 MHz for 200 MHz for Base Stations (BS) and −38 db W/200 MHz for User Equipment (UE), e.g., European Commission Decision (EU) 2019/784 of 14 May 2019 on harmonization of the 24.25-27.5 GHz frequency band for terrestrial systems capable of providing wireless broadband electronic communications services in the Union, published May 16, 2019, which is hereby incorporated by reference in its entirety, e.g., a European Organization for the Exploitation of Meteorological Satellites (EUMETSAT) decision, requirement, recommendation or study, e.g., a ESA/EU-METSAT/EUMETNET study result of −54.2 db W/200 MHz for Base Stations (BS) and 50.4 db W/200 MHz for User Equipment (UE), e.g., the United Nations agency of the World Meteorological Organization (WMO) decision, requirement, recommendation or study, e.g., the WMO decision of −55 db W/200 MHz for Base Stations (BS) and −51 db W/200 MHz for User Equipment (UE). These specifications and/or decisions and/or requirements may be directed to suppression of energy leakage from an adjacent band, e.g., energy leakage from an adjacent 3GPP 5G band, e.g., suppression of transmit energy leakage from the adjacent 3GPP 5G n258 band 9051 (24.250 GHz-27.500 GHz), e.g. limiting of spurious out of n258 band emissions. A sixth application band 9060 includes the 3GPP 5G n260 band 9060 (37 GHz-40 GHz). A seventh application band 9070 includes United States WiGig Band for IEEE 802.11ad and IEEE 802.11ay 9071 (57 GHz-71 GHz), European Union and Japan WiGig Band for IEEE 802.11ad and IEEE 802.11ay 9072 (57 GHz-66 GHz), South Korea WiGig Band for IEEE 802.11ad and IEEE 802.11ay 9073 (57 GHz-64 GHz), and China WiGig Band for IEEE 802.11ad and IEEE 802.11ay 9074 (59 GHz-64 GHz). An eighth application band 9080 includes an automobile radar band 9080 (76 GHz-81 GHz).

Accordingly, it should be understood from the foregoing that the acoustic wave devices (e.g., resonators, e.g., oscillators) of this disclosure may be implemented in the respective application frequency bands just discussed. For example, the layer thicknesses of the detuned harmonically tuned top sensor electrodes and the de-tuned multilayer metal acoustic reflector electrodes and piezoelectric layers in alternating axis arrangement for the example acoustic wave devices (e.g., the example 24 GHz bulk acoustic wave resonators) of this disclosure may be scaled up and down as needed to be implemented in the respective application frequency bands just discussed. This is likewise applicable to example oscillators (e.g., bulk acoustic wave resonator based oscillators) of this disclosure to be implemented in the respective application frequency bands just discussed. The following examples pertain to further embodiments for acoustic wave devices, including but not limited to, e.g., bulk acoustic wave resonators, e.g., bulk acoustic wave resonator based oscillators, and from which numerous permutations and configurations will be apparent.

Example 1 is a bulk acoustic wave (BAW) resonator comprising a substrate, a first layer of piezoelectric material having a first piezoelectric axis orientation, and a top electrode electrically and acoustically coupled with the first layer of piezoelectric material to excite a resonance mode at a main resonant frequency of the BAW resonator in a Super High Frequency (SHF) band or Extremely High Frequency (EHF) band.

Example 2, the subject matter of Example 1 optionally includes in which the main resonant frequency of the BAW resonator is in a 3rd Generation Partnership Project (3GPP) band.

Example 3, the subject matter of Example 1 optionally includes in which the main resonant frequency of the BAW resonator is in a 3GPP n77 band 9010 as shown in FIG. 9A.

Example 4, the subject matter of Example 1 optionally includes in which the main resonant frequency of the BAW resonator is in a 3GPP n79 band 9020 as shown in FIG. 9A.

Example 5, the subject matter of Example 1 optionally includes in which the main resonant frequency of the BAW resonator is in a 3GPP n258 band 9051 as shown in FIG. 9B.

Example 6, the subject matter of Example 1 optionally includes in which the main resonant frequency of the BAW resonator is in a 3GPP n261 band 9052 as shown in FIG. 9B.

Example 7, the subject matter of Example 1 optionally includes in which the main resonant frequency of the BAW resonator is in a 3GPP n260 band as shown in FIG. 9B.

Example 8, the subject matter of Example 1 optionally includes in which the main resonant frequency of the BAW resonator is in an Institute of Electrical and Electronic Engineers (IEEE) S band as shown in FIG. 9A.

Example 9, the subject matter of Example 1 optionally includes in which the main resonant frequency of the BAW resonator is in an Institute of Electrical and Electronic Engineers (IEEE) C band as shown in FIG. 9A.

Example 10, the subject matter of Example 1 optionally includes in which the main resonant frequency of the BAW resonator is in an Institute of Electrical and Electronic Engineers (IEEE) X band as shown in FIG. 9B.

Example 11, the subject matter of Example 1 optionally includes in which the main resonant frequency of the BAW resonator is in an Institute of Electrical and Electronic Engineers (IEEE) Ku band as shown in FIG. 9B.

Example 12, the subject matter of Example 1 optionally includes in which the main resonant frequency of the BAW resonator is in an Institute of Electrical and Electronic Engineers (IEEE) K band as shown in FIG. 9B.

Example 13, the subject matter of Example 1 optionally includes in which the main resonant frequency of the BAW resonator is in an Institute of Electrical and Electronic Engineers (IEEE) Ka band as shown in FIG. 9B.

Example 14, the subject matter of Example 1 optionally includes in which the main resonant frequency of the BAW resonator is in an Institute of Electrical and Electronic Engineers (IEEE) V band as shown in FIG. 9B.

Example 15, the subject matter of Example 1 optionally includes in which the main resonant frequency of the BAW resonator is in an Institute of Electrical and Electronic Engineers (IEEE) W band as shown in FIG. 9B.

Example 16, the subject matter of Example 1 optionally includes in which the main resonant frequency of the BAW resonator is in UNII-1 band 9031, as shown in FIG. 9A.

Example 17, the subject matter of Example 1 optionally includes in which the main resonant frequency of the BAW resonator is in UNII-2A band 9032, as shown in FIG. 9A.

Example 18, the subject matter of Example 1 optionally includes in which the main resonant frequency of the BAW resonator is in UNII-2C band 9041, as shown in FIG. 9A.

Example 19, the subject matter of Example 1 optionally includes in which the main resonant frequency of the BAW resonator is in UNII-3 band 9042, as shown in FIG. 9A.

Example 20, the subject matter of Example 1 optionally includes in which the main resonant frequency of the BAW resonator is in UNII-4 band 9043, as shown in FIG. 9A.

Example 21, the subject matter of Example 1 optionally includes in which the main resonant frequency of the BAW resonator is in UNII-5 band 9044, as shown in FIG. 9A.

Example 22, the subject matter of Example 1 optionally includes in which the main resonant frequency of the BAW resonator is in UNII-6 band 9045, as shown in FIG. 9A.

Example 23, the subject matter of Example 1 optionally includes in which the main resonant frequency of the BAW resonator is in UNII-7 band 9046, as shown in FIG. 9A.

Example 24, the subject matter of Example 1 optionally includes in which the main resonant frequency of the BAW resonator is in UNII-8 band 9047, as shown in FIG. 9A.

Example 25, the subject matter of any one or more of Examples 1 through 24 optionally include a sensing region acoustically coupled with the top electrode.

Example 26, the subject matter of any one or more of Examples 1 through 25 optionally include a second layer of piezoelectric material having a second piezoelectric axis orientation substantially opposing the first piezoelectric axis orientation of the first layer of piezoelectric material.

Example 27, the subject matter of any one or more of Examples 1 through 26 optionally include in which a sensitivity associated with the BAW resonator is within a range from approximately one half part per million per one hundred attograms to approximately fifty parts per million per one hundred attograms.

Example 28, the subject matter of any one or more of Examples 1 through 27 optionally include in which a sensitivity associated with the BAW resonator is within a range from one KiloHertz CentiMeter Squared per NanoGram to approximately two hundred KiloHertz CentiMeter Squared per NanoGram.

Example 29, the subject matter of any one or more of Examples 1 through 28 optionally include in which the BAW resonator is associated with detection of an analyte.

Example 30, the subject matter of any one or more of Examples 1 through 29 optionally include in which the BAW resonator is associated with detection of a biomolecule.

Example 31, the subject matter of any one or more of Examples 1 through 30 optionally include in which the BAW resonator is associated with detection of an infectious agent.

Example 32, the subject matter of any one or more of Examples 1 through 31 optionally include in which the BAW resonator is associated with detection of a virus.

Example 33, the subject matter of any one or more of Examples 1 through 32 optionally include in which the BAW resonator is associated with detection of a coronavirus.

Example 34, the subject matter of any one or more of Examples 1 through 33 optionally include in which the BAW resonator is associated with detection of a SARS-Cov-2 virus.

Example 35, the subject matter of any one or more of Examples 1 through 31 optionally include in which the BAW resonator is associated with detection of bioweapon.

Example 36, the subject matter of any one or more of Examples 1 through 31 optionally include in which the BAW resonator is associated with detection of anthrax.

Example 37, the subject matter of any one or more of Examples 1 through 30 optionally include in which the BAW resonator is associated with detection of a biomarker.

Example 38, the subject matter of any one or more of Examples 1 through 30 optionally include in which the BAW resonator is associated with detection of acetone.

Example 39, the subject matter of any one or more of Examples 1 through 30 optionally include in which the BAW resonator is associated with detection of a prostate specific antigen.

Example 40, the subject matter of any one or more of Examples 1 through 30 optionally include in which the BAW resonator is associated with detection of a cancer biomarker.

Example 41, the subject matter of any one or more of Examples 1 through 30 optionally include in which the BAW resonator is associated with detection of glucose.

Example 42, the subject matter of any one or more of Examples 1 through 29 optionally include in which the BAW resonator is associated with detection of an air pollutant.

Example 43, the subject matter of any one or more of Examples 1 through 29 optionally include in which the BAW resonator is associated with detection of particulate matter.

Example 44, the subject matter of any one or more of Examples 1 through 29 optionally include in which the BAW resonator is associated with detection of a toxin.

Example 45, the subject matter of any one or more of Examples 1 through 29 optionally include in which the BAW resonator is associated with detection of carbon monoxide.

Example 46, the subject matter of any one or more of Examples 1 through 29 optionally include in which the BAW resonator is associated with detection of a volatile organic compound.

Example 47, the subject matter of any one or more of Examples 1 through 29 optionally include in which the BAW resonator is associated with detection of a hydrocarbon gas.

Example 48, the subject matter of any one or more of Examples 1 through 29 optionally include in which the BAW resonator is associated with detection of a biological weapon.

Example 49, the subject matter of any one or more of Examples 1 through 29 optionally include in which the BAW resonator is associated with detection of a chemical weapon.

Example 50, the subject matter of any one or more of Examples 1 through 29 optionally include in which the BAW resonator is associated with detection of a nerve agent.

Example 51, the subject matter of any one or more of Examples 1 through 29 optionally include in which the BAW resonator is associated with detection of a Sarin.

Example 52, the subject matter of any one or more of Examples 1 through 29 optionally include in which the BAW resonator is associated with detection of a water pollutant.

Example 53, the subject matter of any one or more of Examples 1 through 29 optionally include in which the BAW resonator is associated with detection of a heavy metal.

Example 54, the subject matter of any one or more of Examples 1 through 29 optionally include in which the BAW resonator is associated with detection of lead.

Example 55, the subject matter of any one or more of Examples 1 through 29 optionally include in which the BAW resonator is associated with detection of a heavy metal.

Example 56, the subject matter of any one or more of Examples 1 through 29 optionally include in which the BAW resonator is associated with detection of an antigen.

Example 57, the subject matter of any one or more of Examples 1 through 29 optionally include in which the BAW resonator is associated with detection of an antibody.

Example 58, the subject matter of any one or more of Examples 1 through 29 optionally include in which the BAW resonator is associated with detection of a constituent of blood.

Example 59, the subject matter of any one or more of Examples 1 through 29 optionally include in which the BAW resonator is associated with detection of a constituent of interstitial fluid.

Example 60, the subject matter of any one or more of Examples 1 through 29 optionally include in which the BAW resonator is associated with detection of a constituent of breadth.

Example 61, the subject matter of any one or more of Examples 1 through 29 optionally include in which the BAW resonator is associated with detection of tetrahydrocannabinol.

Example 62, the subject matter of any one or more of Examples 1 through 29 optionally include in which the BAW resonator is associated with detection of an explosive.

Example 63, the subject matter of any one or more of Examples 1 through 29 optionally include in which the BAW resonator is associated with detection of trinitrotoluene (TNT).

Example 64, the subject matter of any one or more of Examples 1 through 29 optionally include in which the BAW resonator is associated with detection of 1,3,5-trinitro-1,3,5-triazacyclohexane (RDX).

Example 65, the subject matter of any one or more of Examples 1 through 29 optionally include in which the BAW resonator is associated with detection of a chemical associated with a chemical weapon.

Example 66, the subject matter of any one or more of Examples 1 through 29 optionally include in which the BAW resonator is associated with detection of dimethyl methylphosphonate.

Example 67, the subject matter of any one or more of Examples 1 through 29 optionally include a functionalized layer acoustically coupled with the top electrode of the BAW resonator, the functionalized layer having an selective analyte affinity.

Example 68, the subject matter of any one or more of Examples 1 through 29 optionally include a functionalized layer acoustically coupled with the top electrode of the BAW resonator, the functionalized layer having an selective analyte binding affinity.

Example 69, the subject matter of any one or more of Examples 1 through 29 optionally include a molecularly imprinted polymer layer acoustically coupled with the top electrode.

Example 70, the subject matter of any one or more of Examples 1 through 29 optionally include a metal-organic framework acoustically coupled with the top electrode.

Example 71, the subject matter of any one or more of Examples 1 through 29 optionally include a layer of bacteria acoustically coupled with the top electrode.

Example 72, the subject matter of any one or more of Examples 1 through 28 optionally include in which the BAW resonator is associated with detection of a change in an environmental variable.

Example 73, the subject matter of any one or more of Examples 1 through 28 optionally include in which the BAW resonator is associated with detection of a change in pressure.

Example 74, the subject matter of any one or more of Examples 1 through 28 optionally include in which the BAW resonator is associated with detection of a change in temperature.

Example 75, the subject matter of any one or more of Examples 1 through 28 optionally include in which the BAW resonator is associated with detection of a change in humidity.

Example 76, the subject matter of any one or more of Examples 1 through 28 optionally include in which the BAW resonator is associated with detection of a change in a flux of neutrons.

Example 77, the subject matter of any one or more of Examples 1 through 28 optionally include in which the BAW resonator is associated with detection of a change in a magnetic field.

Example 78, the subject matter of any one or more of Examples 1 through 28 optionally include in which the BAW resonator is associated with detection of terahertz radiation.

Example 79, the subject matter of any one or more of Examples 1 through 28 optionally include in which the BAW resonator is associated with detection of solar blind ultraviolet light Example 80, the subject matter of any one or more of Examples 1 through 28 optionally include in which the BAW resonator is associated with detection of infrared light.

Example 81, the subject matter of any one or more of Examples 1 through 28 optionally include a nanoporous layer acoustically coupled with the top electrode.

Example 82, the subject matter of any one or more of Examples 1 through 28 optionally include a nanocomposite layer acoustically coupled with the top electrode.

Example 83, the subject matter of any one or more of Examples 1 through 28 optionally include a nanostructured layer acoustically coupled with the top electrode.

Example 84, the subject matter of any one or more of Examples 1 through 28 optionally include a magnetostrictive layer acoustically coupled with the top electrode.

Example 85, the subject matter of any one or more of Examples 1 through 28 optionally include a multiferroic layer acoustically coupled with the top electrode.

Example 86, the subject matter of any one or more of Examples 1 through 28 optionally include a magnetoelectric layer acoustically coupled with the top electrode.

Example 87, the subject matter of any one or more of Examples 1 through 28 optionally include a heterostructure layer acoustically coupled with the top electrode.

Example 88, the subject matter of any one or more of Examples 1 through 28 optionally include a perovskite layer acoustically coupled with the top electrode.

Example 89, the subject matter of any one or more of Examples 1 through 28 optionally include magnetostrictive exchange biased multilayers acoustically coupled with the top electrode.

Example 90, the subject matter of any one or more of Examples 1 through 28 optionally include antiparallel magnetostrictive exchange biased multilayers acoustically coupled with the top electrode.

Example 91, the subject matter of any one or more of Examples 1 through 28 optionally include a metallic glass acoustically coupled with the top electrode.

Example 92, the subject matter of any one or more of Examples 1 through 28 optionally include a tunable region acoustically coupled with the top electrode.

Example 93, the subject matter of any one or more of Examples 1 through 28 optionally include in which the BAW resonator forms a portion of a filter.

Example 94, the subject matter of any one or more of Examples 1 through 28 optionally include in which the BAW resonator forms a portion of a tunable filter.

Example 95, the subject matter of any one or more of Examples 1 through 94 optionally include in which the top electrode is electrically and acoustically coupled with the first layer of piezoelectric material to excite a thickness extensional main mode of the BAW resonator.

Example 96, the subject matter of any one or more of Examples 1 through 95 optionally include in which the BAW resonator comprises at least one additional piezoelectric layer.

Example 97, the subject matter of any one or more of Examples 1 through 96 optionally include in which the BAW resonator comprises two additional layers of piezoelectric material with alternating piezoelectric axis orientations.

Example 98, the subject matter of any one or more of Examples 1 through 97 optionally include in which the BAW resonator comprises three additional layers of piezoelectric material with alternating piezoelectric axis orientations.

Example 99, the subject matter of any one or more of Examples 1 through 98 optionally include in which the BAW resonator comprises four additional layers of piezoelectric material with alternating piezoelectric axis orientations.

Example 100, the subject matter of any one or more of Examples 1 through 99 optionally include in which the BAW resonator comprises five additional layers of piezoelectric material with alternating piezoelectric axis orientations.

Example 101, the subject matter of any one or more of Examples 1 through 100 optionally include in which the top electrode has sheet resistance of less than one Ohm per square.

Example 102, the subject matter of any one or more of Examples 1 through 101 optionally include in which the top electrode a harmonically tuned top electrode.

Example 103, the subject matter of any one or more of Examples 1 through 102 optionally include in which the top electrode has a thickness that is approximately an integral multiple of a half of an acoustic wavelength of the main resonant frequency of the BAW resonator.

Example 104, the subject matter of any one or more of Examples 1 through 102 optionally include in which the top electrode has a thickness that is approximately half an acoustic wavelength of the main resonant frequency of the BAW resonator.

Example 105, the subject matter of any one or more of Examples 1 through 102 optionally include in which the top electrode has a thickness that is approximately an acoustic wavelength of the main resonant frequency of the BAW resonator.

Example 106, the subject matter of any, the subject matter of any one or more of Examples 1 through 105 optionally include in which the BAW resonator is a plurality of BAW resonators.

Example 107, the subject matter of example 106 optionally includes in which the plurality of BAW resonators have different respective main resonant frequencies.

Example 108, the subject matter of any one or more examples 106 through 107 optionally include in which differing functionalized layers are coupled with respective members of the plurality of BAW resonators.

Example 109, the subject matter of any one or more examples 106 through 108 optionally include in which differing functionalized layers are coupled with respective members of the plurality of BAW resonators to facilitate detection of differing analytes.

Example 110, the subject matter of any one or more examples 106 through 109 optionally include in which a member of the plurality of BAW resonators is a reference BAW resonator that is substantially shielded.

Example 111, the subject matter of any one or more examples 106 through 110 optionally include in which a plurality of heaters respectively are thermally coupled with respective top electrodes regions of respective of BAW resonators.

Example 112, the subject matter of example 111 optionally includes a heaters controller coupled with the plurality of heaters to selectively activate and to selectively deactivate the members of the plurality of heaters.

Example 113, the subject matter of example 112 optionally includes a timing controller coupled with the heaters controller to control timing of the heaters controller selectively activating and to selectively deactivating the members of the plurality of heaters.

Example 114, the subject matter of example 113 optionally includes the timing controller is coupled with the heaters controller to control respective temperatures of the respective top electrodes.

Example 115, the subject matter of example 113 optionally includes the timing controller is coupled with the heaters controller to control respective temperatures of the respective top electrodes to be different from one another.

Example 116, the subject matter of example 113 optionally includes the timing controller coupled with the heaters controller to control respective temperatures of respective functionalized layers coupled with respective top electrodes, so as to control respective analyte adsorption at the respective functionalized layers.

Example 117, the subject matter of example 113 optionally includes the timing controller coupled with the heaters controller to vary respective temperatures of respective top electrodes over time.

Example 118, the subject matter of any one or more examples 111 through 117 optionally include a resonant signals receiver coupled with the plurality of BAW resonators.

Example 119, the subject matter of any one or more examples 111 through 117 optionally include a resonant signals receiver wirelessly coupled with the plurality of BAW resonators.

Example 120, the subject matter of any one or more examples 111 through 117 optionally include a frequency sweep signals transmitter coupled with the plurality of BAW resonators.

Example 121, the subject matter of any one or more examples 111 through 117 optionally include a frequency sweep signals transmitter wirelessly coupled with the plurality of BAW resonators.

Example 122, the subject matter of any one or more examples 111 through 121 optionally include a replaceable cartridge supportively coupled with the plurality of Bulk Acoustic Wave (BAW) resonators.

Example 123, the subject matter of any one or more examples 111 through 122 optionally include a computing system coupled with the plurality of Bulk Acoustic Wave (BAW) resonators.

Example 124, the subject matter of example 123 optionally includes the computing system having a wireless communication capability.

Example 125, the subject matter of any one or more of examples 1 through 124 optionally include wherein the BAW resonator forms a portion of fluidic system.

Example 126, the subject matter of any one or more of examples 1 through 125 optionally include wherein the BAW resonator forms a portion of microfluidic system.

Example 127, the subject matter of any one or more of examples 1 through 124 optionally include a hollow microneedle in which the BAW resonator is disposed within the hollow microneedle.

Figure 9C:
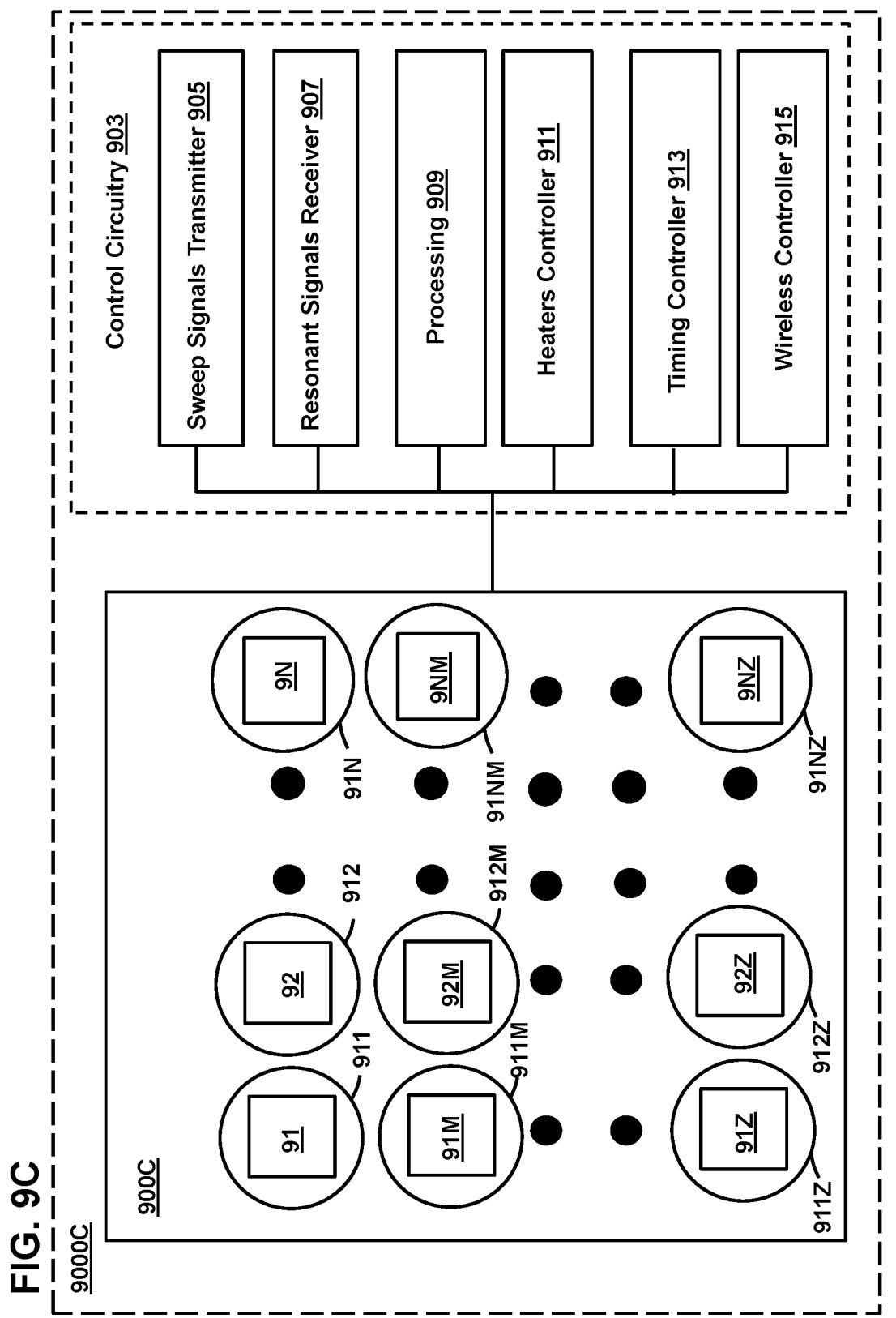
FIG. 9C shows a simplified system employing an array of BAW resonator structures for sensing according to this disclosure.

FIG. 9C shows a simplified system 9000C employing an array 900C of BAW resonator structures 91 through 9N, 91M through 9NM, through to 91Z through 9NZ, for sensing according to this disclosure. As shown in FIG. 9C, system 9000C may include a plurality heaters 911 through 91N, 911M through 91NM, through to 911Z through 91NZ that may be thermally coupled with respective BAW resonator structures 91 through 9N, 91M through 9NM, through to 91Z through 9NZ. The heaters may be electrical heaters. The heaters may be resistive heaters. Respective heaters may be respective resonant heaters, e.g., individually identifiable based on respective resonant frequency of respective resonant heaters, e.g., respective differing resonant heaters may have respective resonant frequencies differing from one another. Respective heaters may be individually addressable, e.g., based on respective resonant frequency of respective resonant heaters. Respective heaters may be wirelessly activatable, e.g., selectively activatable, e.g., selectively activatable based on respective differing resonant frequencies of respective differing respective resonant heaters. The heaters may be wirelessly deactivatable e.g., selectively deactivatable, e.g., selectively deactivatable based on respective differing resonant frequencies of respective differing respective resonant heaters.

The plurality of heaters (e.g., resonant heaters) may be fabricated separately from the plurality of BAW resonators. The plurality of heaters (e.g., resonant heaters) may be thermally coupled with the plurality of BAW resonators after fabrication. Alternatively, the plurality of heaters (e.g., resonant heaters) may be integrally fabricated along with the plurality of BAW resonators. The plurality of heaters (e.g., resonant heaters) may be integrally coupled with the plurality of BAW resonators. Alternatively, the heaters may be recognized as a heating function integral with prolonged operation of the plurality of BAW resonators. In other words, operational duration of the plurality of BAW resonators may result in heating of the plurality of BAW resonators. The plurality of heaters may be a plurality heater functions integral with duration of operation of respective BAW resonators and heat produced thereby. By the system 9000C controlling time duration of operation of the plurality of BAW resonators, heating of the BAW resonators (e.g., the heating function), may be controlled by the system 9000C. By the system 9000C controlling time duration of heating during operation of the plurality of BAW resonators, temperature of the respective sensing regions of the respective BAW resonators may be controlled by the system 9000C. By the system 9000C controlling frequency selective power level of operation of the plurality of BAW resonators, heating of the BAW resonators (e.g., the heating function), may be controlled by the system 9000C. By the system 9000C controlling frequency selective power level of operation of the plurality of BAW resonators, temperature of the respective sensing regions of the respective BAW resonators may be controlled by the system 9000C.

The BAW resonators of array 900C may be similar to those already discussed, for example, they may be similar to the BAW resonator shown in FIG. 1A. For example, the BAW resonators of array 900C may include respective sensing regions and respective functionalized layers acoustically coupled with respective harmonic top senor electrodes, which may be similar to sensing region 116 and functionalized layer 168 acoustically coupled with harmonic top senor electrode 115 shown in FIG. 1A. For the plurality of BAW resonators of array 900C, respective sensing regions may comprise respective functionalized layers that are different from one another, e.g., to facilitate respective responses to differing environmental variables. For the plurality of BAW resonators of array 900C, the respective sensing regions may sensing areas may be different sizes from one another, e.g., to facilitate respective differing responses to an environmental variable. The plurality of BAW resonators of array 900C may be designed and fabricated having differing piezoelectric layer thickness, e.g., to have respective resonant frequencies that are different from one another.

In the system 9000C employing the array 900C of BAW resonators as shown in FIG. 9C, one or more members of the plurality of BAW resonators may be reference BAW resonators. Reference BAW resonators may be substantially shielded from one or more environmental variable. It may be assumed that other members of the plurality of BAW resonators may be unshielded BAW resonators, e.g., substantially unshielded from environmental variables, e.g., to facilitate the unshielded BAW resonators sensing changes in the environmental variables. Noise may be reduced by comparing sensory output of one or more unshielded BAW resonators to output or one or more shielded (reference) BAW resonators. The BAW resonators of array 900C may be used in combination with the fluidic system shown and discussed with respect to FIG. 5 (e.g., the BAW resonators of array 900C shown in FIG. 9C may be used in place of BAW resonator 500B shown in FIG. 5).

System 9000C may comprise control circuitry 903. The control circuitry 903 may be electrically coupled with the plurality of BAW resonators of array 900C. For example, the control circuitry 903 may be wirelessly coupled with the plurality of BAW resonators of array 900C. The control circuitry 903 may comprise a frequency sweep signals transmitter 905, e.g., wirelessly coupled with the plurality of BAW resonators of array 900C, e.g., to transmit a sweep of frequency signals, e.g., a sweep of frequency signals comprising the respective differing resonant frequencies of differing members of the plurality of BAW resonators of array 900C, e.g., to stimulate resonant sensing at the respective differing resonant frequencies of differing members of the plurality of BAW resonators of array 900C.

The control circuitry 903 may comprise a resonant signals receiver 907, e.g., wirelessly coupled with the plurality of BAW resonators of array 900C, e.g., to receive resonant sensing signals from the plurality of BAW resonators of array 900C in response to their sensing activation by the sweep of frequency signals from frequency sweep signals transmitter 905. The resonant signals receiver 907 may receive respective signals differing in frequency corresponding to respective differing resonant frequencies of differing members of the plurality of BAW resonators of array 900C. The resonant signals receiver 907 may receive responsive resonant sensing signals at the respective differing resonant frequencies of differing members of the plurality of BAW resonators of array 900C.

The control circuitry 903 may comprise processing 909 (e.g., a suitable programmed microprocessor). The processing 909 may be communicatively coupled with the frequency sweep signals transmitter 905 and the resonant signals receiver 907. The processing 909 may control operation of the frequency sweep signals transmitter 905. The processing 909 may control operation of the resonant signals receiver 907. The processing 909 may receive from the resonant signals receiver 907 the resonant sensing signals of the plurality of BAW resonators of array 900C.

The processing 909 may process these resonant sensing signals. For example, processing 909 may use respective frequencies of the resonant sensing signals to identify respective members of the plurality of BAW resonators of array 900C that generated the resonant sensing signals. For example, processing 909 may identify different resonant sensor responses from different respective members of the plurality of BAW resonators of array 900C e.g., using respective differing resonant frequencies of BAW resonators of array 900C. In some cases at least a portion of system 9000C may be implemented wirelessly. The processing 909 may use respective frequencies of the resonant sensing signals to wirelessly identify respective members of the plurality of BAW resonators of array 900C that generated the resonant sensing signals. For example, processing 909 may wirelessly identify different resonant sensor responses from different respective members of the plurality of BAW resonators of array 900C e.g., using respective differing resonant frequencies of BAW resonators of array 900C.

The control circuitry 903 may comprise a heaters controller 911. The heaters controller 911 may be coupled with the processing 909. The heaters controller 911 may be coupled with the plurality of heaters to selectively activate and to selectively deactivate respective members of the plurality of heaters. The control circuitry 903 may comprise a timing controller 913. The timing controller 913 may be coupled with the heaters controller to control duration of operation of the heaters. The timing controller 913 may be coupled with the heaters controller to control timing of the heaters controller selectively activating and selectively deactivating members of the plurality of heaters. The timing controller 913 may be coupled with the heaters controller to control respective temperatures of respective sensing regions associated with respective of BAW resonators. The timing controller 913 may be coupled with the heaters controller 911 to control respective temperatures of respective sensing regions to be different from one another. The timing controller 913 may be coupled with the heaters controller to control respective temperatures of respective sensing regions to control respective analyte adsorption at the sensing regions. The timing controller 913 is coupled with the heaters controller 911 to control respective temperatures of respective sensing regions to control respective analyte desorption at the sensing regions. The timing controller 913 may be coupled with the heaters controller 911 to vary respective temperatures of respective sensing regions over time. Respective temperatures of respective sensing regions associated with respective of BAW resonators of the array 900C may be controlled by the timing controller 913 coupled with the heaters controller 911, for example, while the resonant signals receiver 907 coupled with the BAW resonators of the array 900C may receive respective resonant signals therefrom over time.

The heaters controller 911 may be coupled with the frequency sweep signals transmitter to control frequency selective power level of operation of respective members of the plurality of BAW resonators, e.g., heating of the BAW resonators (e.g., the heating function). The heaters controller 911 may be coupled with the frequency sweep signals transmitter to control frequency selective power level transmission to respective members of the plurality of BAW resonators, so as to control heating of the BAW resonators (e.g., the heating function). The heaters controller 911 may be coupled with the frequency sweep signals transmitter to control frequency selective power level of operation of respective members of the plurality of BAW resonators, so as to control temperature of respective members of the plurality of BAW resonators. The heaters controller 911 may be coupled with the frequency sweep signals transmitter to control frequency selective power level transmission to respective members of the plurality of BAW resonators, so as to control temperature of the BAW resonators.

Figure 10:
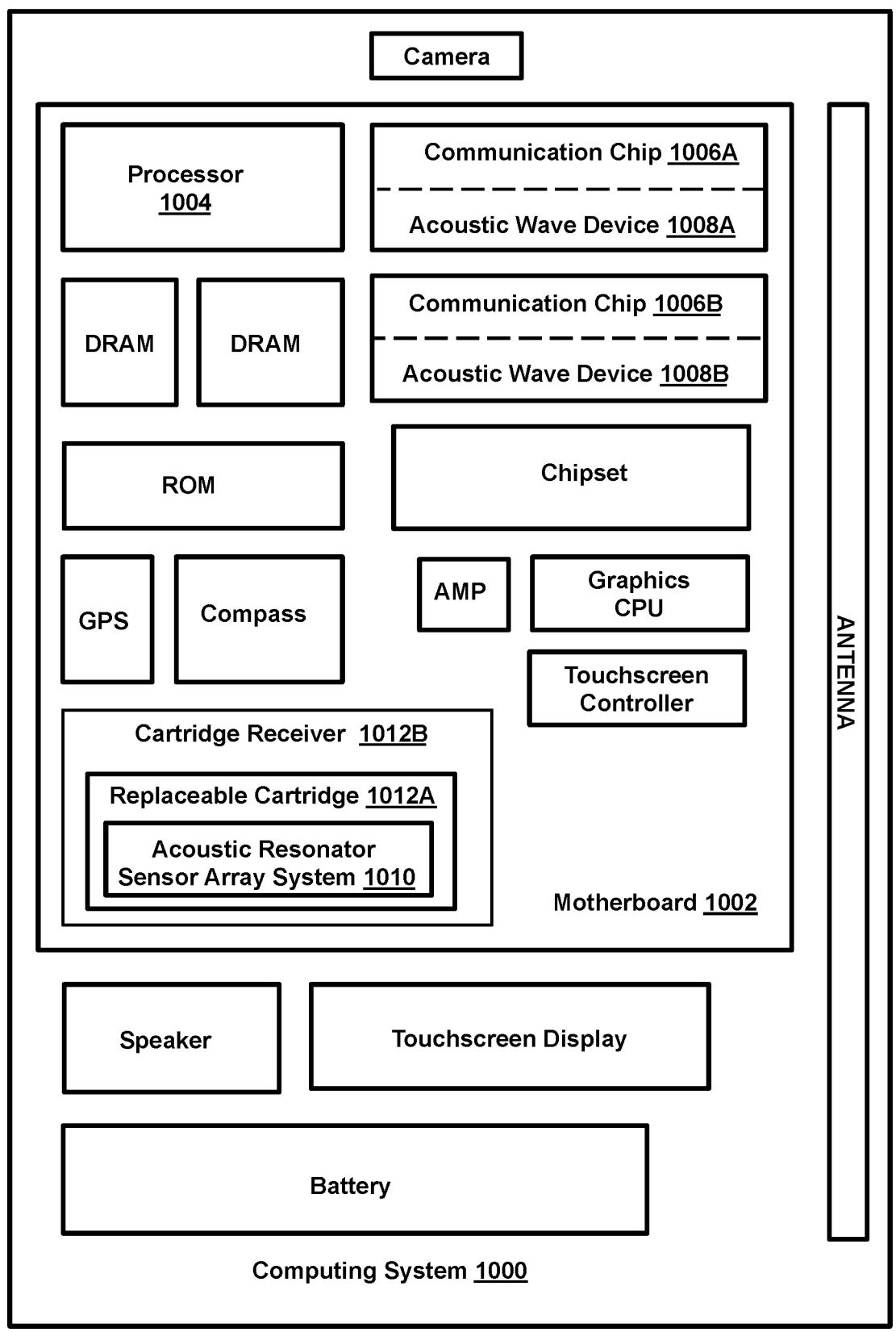
FIG. 10 illustrates a computing system implemented with integrated circuit structures or devices using the techniques disclosed herein, in accordance with an embodiment of the present disclosure.

FIG. 10 illustrates a computing system implemented with integrated circuit structures or devices formed using the techniques disclosed herein, in accordance with an embodiment of the present disclosure. As may be seen, the computing system 1000 houses a motherboard 1002. The motherboard 1002 may include a number of components, including, but not limited to, a processor 1004 and at least one communication chip 1006A, 1006B each of which may be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

The computing system 1000 may house acoustic resonator sensor array system 1010. Acoustic resonator sensor array system 1010 shown in FIG. 10 may be similar to system 9000C shown in FIG. 9C and discussed previously herein. Acoustic resonator sensor array system 1010 shown in FIG. 10 may be coupled with a cartridge, e.g., replaceable cartridge 1012A. Replaceable cartridge 1012A may be detachably coupled with cartridge receiver 1012B.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Computing system 1000 may include, or more broadly, may be associated with Any of the components included in computing system 1000 may include one or more integrated circuit structures or devices formed using the disclosed techniques in accordance with an example embodiment. In some embodiments, multiple functions may be integrated into one or more chips (e.g., for instance, note that the communication chips 1006A, 1006B may be part of or otherwise integrated into the processor 1004).

The communication chips 1006A, 1006B enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chips 1006A, 1006B may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006A, 1006B. For instance, a first communication chip 1006A may be dedicated to shorter range wireless communications such as Wi-Fi and Bluetooth and a second communication chip 1006B may be dedicated to longer range wireless communications such as GPS, EDGE, GPRS, CDMA, WiMAX, LTE, Ev-DO, 5G and others. In some embodiments, communication chips 1006A, 1006B may include one or more acoustic wave devices 1008A, 1008B (e.g., resonators, filters and/or oscillators 1008A, 1008B) as variously described herein (e.g., acoustic wave devices including one or more respective stacks of alternating axis piezoelectric material). Acoustic wave devices 1008A, 1008B may be included in various ways, e.g., one or more resonators, e.g., one or more filters, e.g., one or more oscillators. Further, such acoustic wave devices 1008A, 1008B, e.g., resonators, e.g., filters, e.g., oscillators may be configured to be Super High Frequency (SHF) acoustic wave devices 1008A, 1008B or Extremely High Frequency (EHF) acoustic wave devices 1008A, 1008B, e.g., resonators, filters, and/or oscillators (e.g., operating at greater than 3, 4, 5, 6, 7, or 8 GHz, e.g., operating at greater than 23, 24, 25, 26, 27, 28, 29, or 30 GHz, e.g., operating at greater than 36, 37, 38, 39, or 40 GHz). Further still, such Super High Frequency (SHF) acoustic wave devices or Extremely High Frequency (EHF) resonators, filters, and/or oscillators may be included in the RF front end of computing system 1000 and they may be used for 5G wireless standards or protocols, for example. One or more of communication chips 1006A, 1006B may be in wireless communication with acoustic resonator sensor array 1010.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory. Processor 1004 may perform some functions of control circuitry of acoustic resonator sensor array system 1010.

The communication chips 1006A, 1006B also may include an integrated circuit die packaged within the communication chips 1006A, 1006B. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any communication chips 1006A, 1006B is integrated into processor 1004, rather than having separate communication chips). Further note that processor 1004 may be a chip set having such wireless capability. In short, any number of processor 1004 and/or communication chips 1006A, 1006B may be used. Likewise, any one chip or chip set may have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent. The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A sensor system comprising:
    a substrate;
    a Bulk Acoustic Wave (BAW) resonator arranged over the substrate, the BAW resonator including: a first piezoelectric layer, a second piezoelectric layer and a top electrode; and
    a sensing region comprising a functionalized layer, the sensing region comprising the functionalized layer being acoustically coupled with the second piezoelectric layer via the top electrode of the BAW resonator, in which the top electrode is electrically and acoustically coupled with the second piezoelectric layer to excite a main resonant frequency of the BAW resonator coupled with the sensing region, and in which acoustic coupling of the second piezoelectric layer with the sensing region for the main resonant frequency of the BAW resonator coupled with the sensing region is approximately four gigahertz or higher in a super high frequency band or an extremely high frequency band to facilitate an enhanced sensitivity of the sensing region comprising the functionalized layer.

2. The sensor system as in claim 1 in which the main resonant frequency of the BAW resonator coupled with the sensing region is approximately four thirty nine gigahertz or higher.

3. The sensor system as in claim 1 in which the main resonant frequency of the BAW resonator coupled with the sensing region is approximately eight gigahertz or higher.

4. The sensor system as in claim 1 in which the main resonant frequency of the BAW resonator coupled with the sensing region is approximately twenty four gigahertz or higher.

5. The sensor system as in claim 1 in which the main resonant frequency of the BAW resonator coupled with the sensing region is in an Institute of Electrical and Electronic Engineers (IEEE) K band.

6. The sensor system as in claim 1 in which the main resonant frequency of the BAW resonator coupled with the sensing region is in an Institute of Electrical and Electronic Engineers (IEEE) Ka band.

7. The sensor system as in claim 1 in which:
the first piezoelectric layer has a first piezoelectric axis;
the second piezoelectric layer of has a second piezoelectric axis; and
the BAW resonator comprises:
a third piezoelectric layer interposed between the first piezoelectric layer and the second piezoelectric layer, the third piezoelectric layer having a third piezoelectric axis substantially opposing the first piezoelectric axis and the second piezoelectric axis;
a fourth piezoelectric layer; and
a fifth piezoelectric layer.

8. The sensor system as in claim 1 in which a total quality factor of the BAW resonator including sheet resistance of the top electrode is within a range from approximately three hundred to approximately fifteen hundred.

9. The sensor system as in claim 1 in which the BAW resonator comprises a bottom electrode, a second pair of piezoelectric layers, and a third pair of piezoelectric layers, and in which the first piezoelectric layer, the second piezoelectric layer, the second pair of piezoelectric layers, and the third pair of piezoelectric layers, are interposed between the top electrode and the bottom electrode to facilitate an enhancement in a quality factor associated with the sensor system.

10. The sensor system as in claim 1 in which the sensing region is configured to sense an analyte present in a liquid.

11. The sensor system as in claim 1 in which the sensing region is configured to sense an analyte present in an air sample.

12. A Micro Electro Mechanical System (MEMS) comprising:
a substrate;
a sensing region comprising a functionalized layer;
a Bulk Acoustic Wave (BAW) resonator arranged over the substrate, the BAW resonator including: a first layer of piezoelectric material having a first piezoelectric axis orientation; and a second layer of piezoelectric material having a second piezoelectric axis orientation that is antiparallel the first piezoelectric axis orientation of the first layer of piezoelectric material; and
a harmonic electrode acoustically coupled with the second layer of piezoelectric material and the sensing region to facilitate coupling acoustic energy from the second piezoelectric layer into the sensing region, and to facilitate suppressing parasitic lateral resonances.

13. The MEMS as in claim 12 in which the harmonic electrode has a thickness to facilitate an enhanced quality factor of the BAW resonator.

14. The MEMS as in claim 12 in which in which the first and second layers of piezoelectric material have respective thicknesses so that a main resonant frequency of the BAW resonator is in a super high frequency band or an extremely high frequency band.

15. The MEMS as in claim 12 in which the BAW resonator comprises a third layer of piezoelectric material to facilitate spurious mode suppression, in which the first, second and third layers of piezoelectric material have respective first, second and third piezoelectric axis orientations that substantially oppose one another in an alternating arrangement.

16. An apparatus comprising:
a sensing region comprising a functionalized layer;
a substrate;
a Bulk Acoustic Wave (BAW) resonator arranged over the substrate, the BAW resonator including a first layer of piezoelectric material; and
a harmonically tuned electrode having a thickness that is approximately an integral multiple of a half of an acoustic wavelength of a main resonant frequency of the BAW resonator coupled with the sensing region to facilitate acoustic coupling from the first layer of piezoelectric material into the sensing region.

17. An apparatus as in claim 16 in which the thickness of the harmonically tuned electrode is approximately one half of the acoustic wavelength of the main resonant frequency of the BAW resonator coupled with the sensing region.

18. The apparatus as in claim 16 in which in which the harmonically tuned electrode is to facilitate suppressing parasitic lateral resonances.

19. The apparatus as in claim 16 comprising a second layer of piezoelectric material having a second piezoelectric axis orientation, in which the first layer of piezoelectric material has a first piezoelectric axis orientation that substantially opposes the second piezoelectric axis orientation, and in which the thickness of the harmonically tuned electrode being approximately the integral multiple of the half of the acoustic wavelength is to facilitate acoustic coupling from the second layer of piezoelectric material into the sensing region.

20. The apparatus as in claim 16 in which
the main resonant frequency of the BAW resonator coupled with the sensing region is in an Institute of Electrical and Electronic Engineers (IEEE) L band.

21. The apparatus as in claim 16 in which
the main resonant frequency of the BAW resonator coupled with the sensing region is in an Institute of Electrical and Electronic Engineers (IEEE) S band.

22. A fluidic system comprising:
a substrate;
a Bulk Acoustic Wave (BAW) resonator arranged over the substrate, the BAW resonator including: first and second layers of piezoelectric material; and a top electrode; and
a sensing region acoustically coupled with the top electrode and the second layer of piezoelectric material, in which the sensing region comprises a functionalized layer to facilitate binding to an analyte, in which the fluidic system has sufficient sensitivity to detect down to approximately one hundred attograms of the analyte in a fluid for the sensing region acoustically coupled with the second layer of piezoelectric material, and in which:
the first layer of piezoelectric material has a first piezoelectric axis orientation; and the second layer of piezoelectric material has a second piezoelectric axis orientation substantially opposing the first piezoelectric axis orientation of the first layer of piezoelectric material.

23. The fluidic system as in claim 22 in which the functionalized layer has a virus affinity.

24. The fluidic system as in claim 22 in which the fluidic system has sufficient sensitivity to detect down to a single virus particle in the fluid, for the fluid comprising water.

25. The fluidic system as in claim 22 in which the functionalized layer has a SARS-CoV-2 virus affinity.

26. The fluidic system as in claim 22 in which the sensing region acoustically coupled with the second layer of piezoelectric material and the top electrode of the BAW resonator has a sensing area within a range from approximately sixteen hundred square microns to approximately twenty five thousand six hundred square microns.

27. The fluidic system as in claim 22 comprising a plurality of Bulk Acoustic Wave (BAW) resonators having respective sensing regions in which the plurality of BAW resonators have respective differing piezoelectric layer thicknesses, to have respective main resonant frequencies that are different from one another, so as to facilitate identification of respective members of the plurality of Bulk Acoustic Wave resonators.

28. The fluidic system as in claim 22 comprising a plurality of Bulk Acoustic Wave (BAW) resonators having respective sensing regions in which the respective sensing regions comprise respective functionalized layers that are different from one another to facilitate binding to respective analytes that are different from one another.

29. The fluidic system as in claim 22 in which the BAW resonator comprises a third layer of piezoelectric material acoustically coupled with the sensing region via the top electrode, in which the first, second and third layers of piezoelectric material have respective first, second and third piezoelectric axis orientations that substantially oppose one another in an alternating arrangement.

30. The fluidic system as in claim 22 in which the top electrode approximates a harmonic electrode.

* * * * *